(12) United States Patent
Kita et al.

(10) Patent No.: US 11,431,911 B2
(45) Date of Patent: Aug. 30, 2022

(54) IMAGING DEVICE AND SIGNAL PROCESSING DEVICE

(71) Applicant: SONY CORPORATION, Tokyo (JP)

(72) Inventors: Mitsuaki Kita, Kanagawa (JP); Yoshitaka Miyatani, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/754,586

(22) PCT Filed: Oct. 19, 2018

(86) PCT No.: PCT/JP2018/038943
§ 371 (c)(1),
(2) Date: Apr. 8, 2020

(87) PCT Pub. No.: WO2019/078336
PCT Pub. Date: Apr. 25, 2019

(65) Prior Publication Data
US 2020/0358959 A1 Nov. 12, 2020

(30) Foreign Application Priority Data

Oct. 19, 2017 (JP) .............................. JP2017-202861

(51) Int. Cl.
*H04N 5/232* (2006.01)
*H04N 1/00* (2006.01)
(Continued)

(52) U.S. Cl.
CPC ..... *H04N 5/23299* (2018.08); *H04N 1/00103* (2013.01); *H04N 5/23203* (2013.01);
(Continued)

(58) Field of Classification Search
CPC ........... H04N 5/23299; H04N 1/00103; H04N 5/23203; H04N 2201/0084; H04N 9/8205;
(Continued)

(56) References Cited

U.S. PATENT DOCUMENTS 6,731,305 B1 * 5/2004 Park .................... H04N 5/23238
345/581
2004/0141082 A1 * 7/2004 Nakahira ............. H04N 5/3456
348/333.01
(Continued)

FOREIGN PATENT DOCUMENTS

CN 101854560 A 10/2010
CN 104854496 A 8/2015
(Continued)

OTHER PUBLICATIONS

Asif, et al. "FlatCam: Replacing Lenses with Masks and Computation", IEEE International Conference on Computer Vision Workshop (ICCVW), Dec. 7-13, 2015, pp. 663-666.
(Continued)

*Primary Examiner* — Jason A Flohre
(74) *Attorney, Agent, or Firm* — Chip Law Group

(57) ABSTRACT

The present disclosure relates to an imaging device and a signal processing device capable of expanding an application range of the imaging device. An imaging device includes an imaging element that includes one or more pixel output units that receive incident light from a subject incident without an intervention of an imaging lens or a pinhole and output one detection signal indicating an output pixel value modulated by an incident angle of the incident light, and outputs a detection signal set including one or more detection signals, and a communication unit that transmits imaging data including the detection signal set and position attitude data indicating at least one of a position or an
(Continued)

attitude to a communication device by wireless communication. The present disclosure is applicable to, for example, a monitoring system and the like.

11 Claims, 59 Drawing Sheets

(51) Int. Cl.
    *H04N 5/369*     (2011.01)
    *H04N 5/341*     (2011.01)
    *H04N 5/335*     (2011.01)
    *H04N 101/00*     (2006.01)

(52) U.S. Cl.
    CPC ....... *H04N 5/232411* (2018.08); *H04N 5/335* (2013.01); *H04N 5/3415* (2013.01); *H04N 5/3696* (2013.01); *H04N 2101/00* (2013.01); *H04N 2201/0084* (2013.01); *H04N 2201/3205* (2013.01); *H04N 2201/3252* (2013.01); *H04N 2201/3253* (2013.01)

(58) Field of Classification Search
    CPC .... H04N 5/22541; H04N 7/025; H04N 5/772; H04N 5/30; H04N 5/369; G03B 35/08; H01L 27/14645; H01L 27/14605; H01L 27/14641; H01L 27/1464; H01L 27/1463; H01L 27/14627; H01L 27/14623
    See application file for complete search history.

(56) References Cited

U.S. PATENT DOCUMENTS

| | | | | |
|---|---|---|---|---|
| 2006/0184705 | A1* | 8/2006 | Nakajima | H02J 7/00047 710/303 |
| 2009/0022410 | A1 | 1/2009 | Haskell | |
| 2010/0251101 | A1 | 9/2010 | Haussecker et al. | |
| 2011/0122260 | A1* | 5/2011 | Nakamura | G03B 17/02 348/207.1 |
| 2012/0033126 | A1* | 2/2012 | Ishii | G02B 3/06 348/340 |
| 2013/0105666 | A1* | 5/2013 | Saitou | H01L 27/14627 250/208.1 |
| 2013/0250047 | A1* | 9/2013 | Hollinger | H04N 5/2252 348/36 |
| 2014/0307130 | A1* | 10/2014 | Furuta | H04N 5/367 348/246 |
| 2015/0381951 | A1 | 12/2015 | Mlinar et al. | |
| 2016/0126275 | A1 | 5/2016 | Kurokawa | |
| 2017/0026087 | A1* | 1/2017 | Tanabe | H02J 7/045 |
| 2017/0131718 | A1 | 5/2017 | Matsumura et al. | |
| 2018/0035036 | A1* | 2/2018 | Ahn | H04N 5/3696 |
| 2018/0035046 | A1* | 2/2018 | Yuan | H04N 5/335 |
| 2018/0098014 | A1* | 4/2018 | Zuleta | H04N 5/37206 |
| 2019/0313000 | A1* | 10/2019 | Blanton | H04N 5/2258 |
| 2019/0313018 | A1* | 10/2019 | Ono | G02B 3/08 |
| 2019/0347520 | A1* | 11/2019 | Sato | G06K 9/00791 |
| 2020/0321378 | A1* | 10/2020 | Paiella | H01L 27/1462 |

FOREIGN PATENT DOCUMENTS

| | | |
|---|---|---|
| CN | 106687877 A | 5/2017 |
| EP | 3171241 A1 | 5/2017 |
| GB | 2434934 A | 8/2007 |
| JP | 2012-186674 A | 9/2012 |
| JP | 5053404 B2 | 10/2012 |
| JP | 2013-005394 A | 1/2013 |
| JP | 2013-132139 A | 7/2013 |
| JP | 2016-510910 A | 4/2016 |
| JP | 2016-092413 A | 5/2016 |
| TW | 201118792 A | 6/2011 |
| WO | 2007/091038 A1 | 8/2007 |
| WO | 2016/009688 A1 | 1/2016 |
| WO | 2016/123529 A1 | 8/2016 |

OTHER PUBLICATIONS

International Search Report and Written Opinion of PCT Application No. PCT/JP2018/038943, dated Jan. 8, 2019, 11 pages of ISRWO.
Partial supplementary European Search Report of EP Application No. 18868008.6, dated Jul. 17, 2020, 13 pages.
Office Action for CN Patent Application No. 201880066133.5, dated Mar. 23, 2022, 09 pages of English Translation and 08 pages of Office Action.

\* cited by examiner

IMAGING DEVICE AND SIGNAL PROCESSING DEVICE

CROSS REFERENCE TO RELATED APPLICATIONS

This application is a U.S. National Phase of International Patent Application No. PCT/JP2018/038943 filed on Oct. 19, 2018, which claims priority benefit of Japanese Patent Application No. JP 2017-202861 filed in the Japan Patent Office on Oct. 19, 2017. Each of the above-referenced applications is hereby incorporated herein by reference in its entirety.

TECHNICAL FIELD

The present disclosure relates to an imaging device and a signal processing device, and especially relates to an imaging device and a signal processing device capable of expanding an application range of the imaging device.

BACKGROUND ART

Conventionally, suggested is an imaging device that images while modulating light from a subject by a lattice-shaped optical filter that covers a light-receiving surface of an imaging element or an optical filter including a diffraction grating without using an imaging lens, and restores an image formed as an image of the subject by predetermined arithmetic processing (refer to, for example, Non-Patent Document 1 and Patent Documents 1 and 2).

CITATION LIST

Non-Patent Document

Non-Patent Document 1: M. Salman Asif and four others, "Flatcam: Replacing lenses with masks and computation", "2015 IEEE International Conference on Computer Vision Workshop (ICCVW)", 2015, pages 663-666

Patent Document

Patent Document 1: Japanese Unexamined Patent Publication No. 2016-510910
Patent Document 2: International Publication No. 2016/123529

SUMMARY OF THE INVENTION

Problems to be Solved by the Invention

By the way, the imaging device that does not use the imaging lens as disclosed in Non-Patent Document 1 and Patent Documents 1 and 2 may be made compact due to absence of the imaging lens, and application range of which is expected to be expanded.

The present disclosure is achieved in view of such a situation, and an object thereof is to enlarge the application range of the imaging device.

Solution to Problems

An imaging device according to a first aspect of the present disclosure includes an imaging element that includes one or more pixel output units that receive incident light from a subject incident without an intervention of an imaging lens or a pinhole and output one detection signal indicating an output pixel value modulated by an incident angle of the incident light, and outputs a detection signal set including one or more detection signals, and a communication unit that transmits imaging data including the detection signal set and position attitude data indicating at least one of a position or an attitude to a communication device by wireless communication.

A signal processing device according to a second aspect of the present disclosure includes a restoration unit that restores a restored image by using a plurality of detection signal sets included in a plurality of imaging data from a plurality of imaging devices each including an imaging element that includes one or more pixel output units that receive incident light from a subject incident without an intervention of an imaging lens or a pinhole and output one detection signal indicating an output pixel value modulated by an incident angle of the incident light, and outputs a detection signal set including one or more of the detection signals.

In the first aspect of the present disclosure, incident light from a subject incident without an intervention of an imaging lens or a pinhole is received, a detection signal set including one or more detection signals indicating an output pixel value modulated by an incident angle of the incident light is output, and imaging data including the detection signal set and position attitude data indicating at least one of a position or an attitude is transmitted to a communication device by wireless communication.

In the second aspect of the present disclosure, a restored image is restored by using a plurality of detection signal sets included in a plurality of imaging data from a plurality of imaging devices each including an imaging element that includes one or more pixel output units that receive incident light from a subject incident without an intervention of an imaging lens or a pinhole and output one detection signal indicating an output pixel value modulated by an incident angle of the incident light, and outputs a detection signal set including one or more of the detection signals.

Effects of the Invention

According to the first aspect or the second aspect of the present disclosure, the application range of the imaging device may be expanded.

Note that, the effects are not necessarily limited to the effects herein described and may include any of the effects described in the present disclosure.

BRIEF DESCRIPTION OF DRAWINGS

FIG. 20 is a flowchart illustrating imaging processing by the imaging device in

FIG. 2.

MODE FOR CARRYING OUT THE INVENTION

A preferred embodiment of the present disclosure is hereinafter described in detail with reference to the accompanying drawings. Note that, in this specification and the drawings, the components having substantially the same functional configuration are assigned with the same reference sign and the description thereof is not repeated appropriately.

Furthermore, the description is given in the following order.

1. Overview of Imaging Device of Present Disclosure
2. Basic Configuration Example of Imaging Device of Present Disclosure
3. First Embodiment
4. Second Embodiment: Example of Providing Power Supply Unit
5. Third Embodiment: Example of Providing Power Supply Unit for Solar Power Generation
6. Fourth Embodiment: Example of Detecting Position and Inclination of Imaging Device
7. Fifth Embodiment: Example of Detecting Orientation of Imaging Device
8. Sixth Embodiment: Example in Which Position and Attitude of Imaging Device May Be Changed
9. Seventh Embodiment: Example of Providing Light-receiving Surfaces on Both Surfaces of Imaging Device
10. Variation
11. Others

1. Overview of Imaging Device of Present Disclosure

First, an overview of an imaging device of the present disclosure is described.

Figure 1:
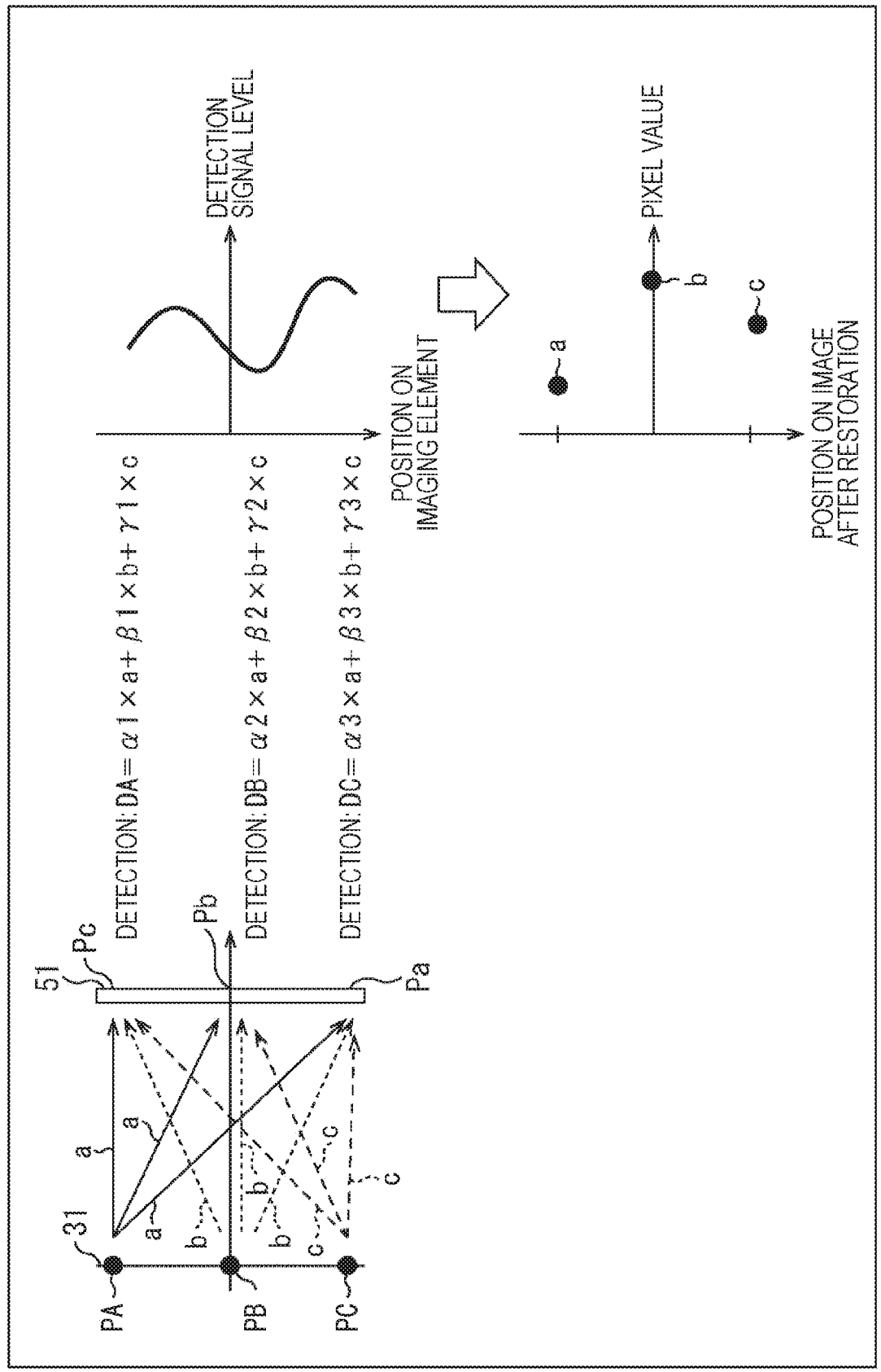
FIG. 1 is a view for illustrating a principle of imaging in an imaging device to which a technology of the present disclosure is applied.

In the imaging device of the present disclosure, as illustrated in an upper left part of FIG. 1, an imaging element 51 in which each pixel has detection sensitivity with incident angle directivity is used. Here, each pixel having the detection sensitivity with the incident angle directivity has a light-receiving sensitivity characteristic according to an incident angle of incident light on each pixel different for each pixel. However, the light-receiving sensitivity characteristics of all the pixels need not be fully different, and the light-receiving sensitivity characteristics of some pixels may be the same.

Here, for example, each of all subjects is a set of point light sources and light is emitted from each point light source in all directions. For example, a subject surface 31 of a subject in the upper left part of FIG. 1 includes point light sources PA to PC, and the point light sources PA to PC emit a plurality of light beams of light intensities a to c, respectively, around. Furthermore, the imaging element 51 hereinafter includes pixels having different incident angle directivities in positions Pa to Pc (hereinafter referred to as pixels Pa to Pc).

In this case, as illustrated in the upper left part of FIG. 1, the light beams of the same light intensity emitted from the same point light source are incident on respective pixels of the imaging element 51. For example, the light beam of the light intensity a emitted from the point light source PA is incident on each of the pixels Pa to Pc of the imaging element 51. In contrast, the light beams emitted from the same point light source are incident on the respective pixels at different incident angles. For example, the light beams from the point light source PA are incident on the pixels Pa to Pc at the different incident angles.

Here, since the incident angle directivities of the pixels Pa to Pc are different from one another, the light beams of the same light intensity emitted from the same point light source are detected with different sensitivities by the respective pixels. As a result, the light beams of the same light intensity are detected at different detection signal levels by the respective pixels. For example, the detection signal levels for the light beams of the light intensity a from the point light source PA have different values among the pixels Pa to Pc.

Then, the light-receiving sensitivity level of each pixel for the light beam from each point light source is obtained by multiplying the light intensity of the light beam by a coefficient indicating the light-receiving sensitivity to the incident angle of the light beam (that is, the incident angle directivity). For example, the detection signal level of the pixel Pa for the light beam from the point light source PA is obtained by multiplying the light intensity a of the light beam of the point light source PA by the coefficient indicating the incident angle directivity of the pixel Pa to the incident angle of the light beam on the pixel Pa.

Accordingly, detection signal levels DA, DB, and DC of the pixels Pc, Pb, and Pa are expressed by following equations (1) to (3), respectively.

$$DA = \alpha 1 \times a + \beta 1 \times b + \gamma 1 \times c \quad (1)$$

$$DB = \alpha 2 \times a + \beta 2 \times b + \gamma 2 \times c \quad (2)$$

$$DC = \alpha 3 \times a + \beta 3 \times b + \gamma 3 \times c \quad (3)$$

Here, a coefficient $\alpha 1$ is the coefficient indicating the incident angle directivity of the pixel Pc to the incident angle of the light beam from the point light source PA on the pixel Pc, and is set according to the incident angle. Furthermore, $\alpha 1 \times a$ represents the detection signal level of the pixel Pc to the light beam from the point light source PA.

A coefficient $\beta 1$ is the coefficient indicating the incident angle directivity of the pixel Pc to the incident angle of the light beam from the point light source PB on the pixel Pc, and is set according to the incident angle. Furthermore, $\beta 1 \times b$ represents the detection signal level of the pixel Pc for the light beam from the point light source PB.

A coefficient $\gamma 1$ is the coefficient indicating the incident angle directivity of the pixel Pc to the incident angle of the light beam from the point light source PC to the pixel Pc, and is set according to the incident angle. Furthermore, $\gamma 1 \times c$ represents the detection signal level of the pixel Pc to the light beam from the point light source PC.

In this manner, the detection signal level DA of the pixel Pa is obtained by the sum of products of the light intensities a, b, and c of the light beams from the point light sources PA, PB, and PC, respectively, in the pixel Pc, and the coefficients $\alpha 1$, $\beta 1$, and $\gamma 1$ indicating the incident angle directivities according to the incident angles.

Similarly, the detection signal level DB of the pixel Pb is obtained by the sum of products of the light intensities a, b, and c of the light beams from the point light sources PA, PB, and PC, respectively, in the pixel Pb, and the coefficients $\alpha 2$, $\beta 2$, and $\gamma 2$ indicating the incident angle directivities according to the incident angles as expressed by equation (2). Furthermore, the detection signal level DC of the pixel Pc is obtained by the sum of products of the light intensities a, b, and c of the light beams from the point light sources PA, PB, and PC, respectively, in the pixel Pa, and the coefficients $\alpha 2$, $\beta 2$, and $\gamma 2$ indicating the incident angle directivities according to the incident angles as expressed by equation (3).

However, in the detection signal levels DA, DB, and DC of the pixels Pa, Pb, and Pc, the light intensities a, b, and c of the light beams emitted from the point light sources PA, PB, and PC are mixed as expressed by equations (1) to (3). Therefore, as illustrated in an upper right part of FIG. 1, the detection signal level in the imaging element 51 is different from the light intensity of each point light source on the subject surface 31. Therefore, an image obtained by the imaging element 51 is different from that formed as the image of the subject surface 31.

In contrast, the light intensities a to c of the light beams of the respective point light sources PA to PC are obtained by creating simultaneous equations including equations (1) to (3) and solving the created simultaneous equations. Then, by arranging pixels having pixel values according to the obtained light intensities a to c in accordance with arrangement (relative positions) of the point light sources PA to PC, a restored image formed as the image of the subject surface 31 is restored as illustrated in the lower right part of FIG. 1.

Note that, hereinafter, a set of coefficients (for example, coefficients $\alpha 1$, $\beta 1$, and $\gamma 1$) for each of the equations forming the simultaneous equations is referred to as a coefficient set. Furthermore, hereinafter, a group of a plurality of coefficient sets (for example, coefficient set $\alpha 1$, $\beta 1$, and $\gamma 1$, coefficient set $\alpha 2$, $\beta 2$, and $\gamma 2$, and coefficient set $\alpha 3$, $\beta 3$, and $\gamma 3$) corresponding to a plurality of equations included in the simultaneous equations is referred to as a coefficient set group.

In this manner, the imaging device including the imaging element 51 in which each pixel has the incident angle directivity as an indispensable configuration may be realized without need of an imaging lens, a pinhole, and an optical filter disclosed in Patent Document 1 and Non-Patent Document 1 (hereinafter, referred to as Patent Document and the like). As a result, the imaging lens, the pinhole, and the optical filter disclosed in Patent Document and the like are not the indispensable configurations, so that it is possible to make the imaging device short in height, that is, make a thickness thin in the light incident direction in the configuration to realize an imaging function.

Furthermore, since the indispensable configuration is only the imaging element 51, a degree of freedom in design may be improved. For example, in a conventional imaging device using the imaging lens, it is necessary to arrange the pixels of the imaging element into a two-dimensional array in accordance with a position in which the image of the subject is formed by the imaging lens; however, this is not necessary in the imaging device using the imaging element 51. Therefore, a degree of freedom in arrangement of each pixel is improved, and for example, each pixel may be freely arranged within a range in which light from the subject is incident. For example, it becomes possible to arrange the respective pixels in a circular region, in a hollow square (square-shaped) region, or distribute in a plurality of regions.

Then, regardless of the arrangement of the respective pixels, it is possible to obtain the light intensity of the light beam from each point light source by creating the simultaneous equations expressed by equations (1) to (3) described above by using the coefficients according to the incident angles of the light beams from the respective point light sources on the subject surface 31 on the respective pixels and solving the same. Then, by arranging the pixels having the pixel values according to the obtained light intensities of the respective point light sources in accordance with the arrangement of the respective point light sources on the subject surface 31, it is possible to restore the restored image formed as the image of the subject surface 31.

2. Basic Configuration Example of Imaging Device of Present Disclosure

Next, a basic configuration example of the imaging device of the present disclosure is described with reference to FIGS. 2 to 25.

<Configuration Example of Imaging Device 101>

Figure 2:
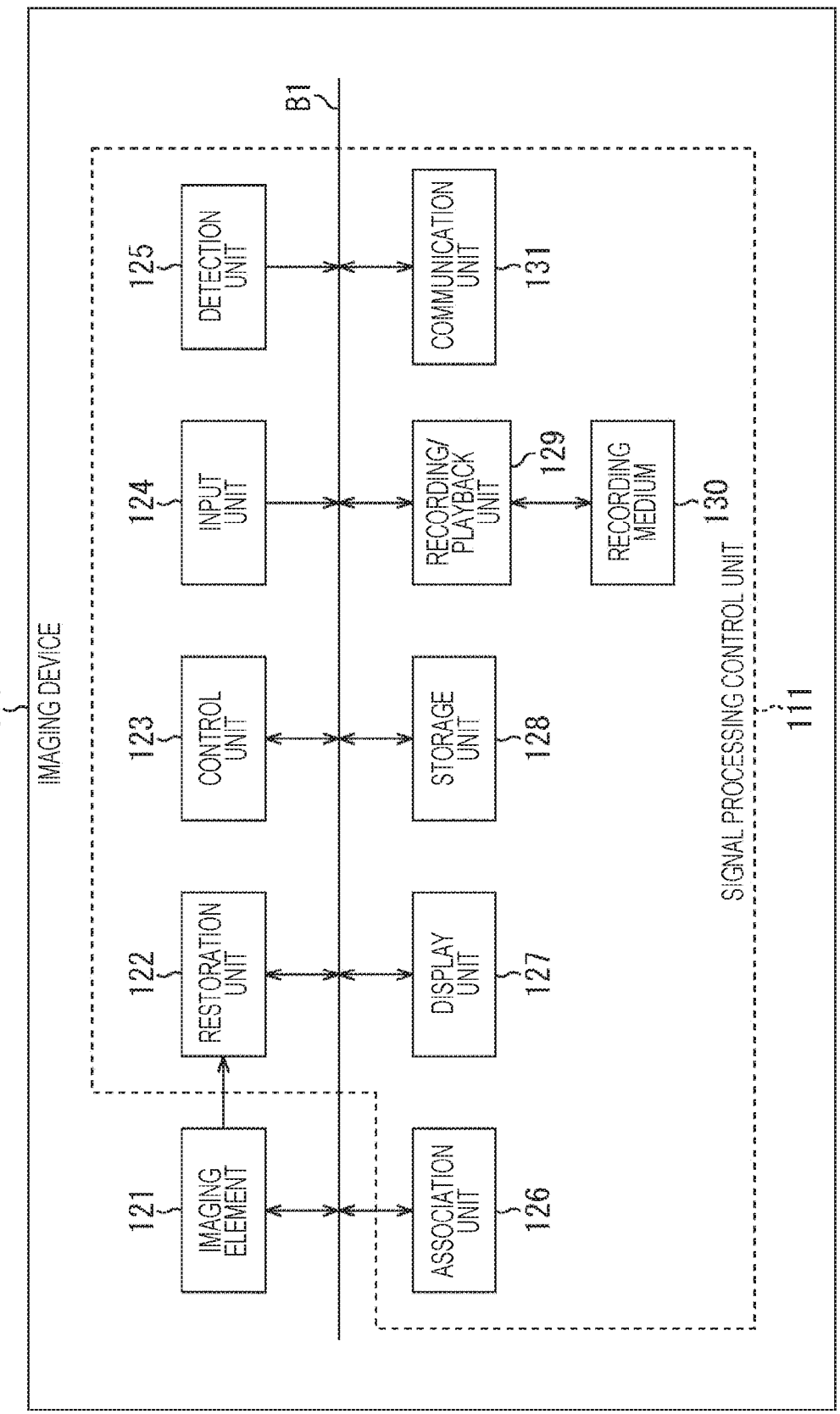
FIG. 2 is a block diagram illustrating a basic configuration example of the imaging device to which the technology of the present disclosure is applied.

FIG. 2 is a block diagram illustrating a configuration example of an imaging device 101 that is a basic imaging device to which the technology of the present disclosure is applied.

The imaging device 101 includes an imaging element 121, a restoration unit 122, a control unit 123, an input unit 124, a detection unit 125, an association unit 126, a display unit 127, a storage unit 128, a recording/playback unit 129, a recording medium 130, and a communication unit 131. Furthermore, the restoration unit 122, the control unit 123, the input unit 124, the detection unit 125, the association unit 126, the display unit 127, the storage unit 128, the recording/playback unit 129, the recording medium 130, and the communication unit 131 form a signal processing control unit 111 that performs signal processing and control and the like of the imaging device 101. Note that, the imaging device 101 does not include an imaging lens (free from imaging lens).

Furthermore, the imaging element 121, the restoration unit 122, the control unit 123, the input unit 124, the detection unit 125, the association unit 126, the display unit 127, the storage unit 128, the recording/playback unit 129, and the communication unit 131 are connected to one another via a bus B1, and perform transmission and reception of data and the like via the bus B1. Note that, hereinafter, in order to simplify the description, description of the bus B1 in a case where each unit of the imaging device 101 performs transmission and reception of the data and the like via the bus B1 is omitted. For example, it is described that the input unit 124 supplies data to the control unit 123 in a case where the input unit 124 supplies the data to the control unit 123 via the bus B1.

The imaging element 121 corresponds to the imaging element 51 described with reference to FIG. 1, the imaging element that includes pixels having incident angle directivities and outputs an image including detection signals indicating the detection signal levels according to an amount of incident light to the restoration unit 122 or the bus B1.

More specifically, the imaging element 121 may have a basic structure similar to that of a general imaging element such as, for example, a complementary metal oxide semiconductor (CMOS) image sensor. However, in the imaging element 121, a configuration of each pixel forming a pixel array is different from that of the general one, and the configuration is with the incident angle directivity as described later with reference to FIGS. 3 to 5, for example. Then, the imaging element 121 has the light-receiving sensitivity different (changing) depending on the incident angle of the incident light for each pixel and has the incident angle directivity to the incident angle of the incident light in a pixel unit.

Note that, the image output from the imaging element 121 is an image including the detection signals in which the image of the subject is not formed as illustrated in the upper right part of FIG. 1 described above, so that the subject cannot be visually recognized. That is, a detection image including the detection signals output by the imaging element 121 is an image that is a set of pixel signals but with which a user cannot recognize the subject through visual contact (the subject cannot be visually recognized).

Therefore, hereinafter, the image including the detection signals in which the image of the subject is not formed as illustrated in the upper right part of FIG. 1, that is, the image captured by the imaging element 121 is referred to as the detection image.

Note that, the imaging element 121 is not necessarily configured as the pixel array, and may also be configured as a line sensor, for example. Furthermore, the incident angle directivities need not necessarily be different in a pixel unit, and the pixels having the same incident angle directivity may be included.

The restoration unit 122 obtains, for example, a coefficient set group corresponding to a subject distance corresponding to a distance from the imaging element 51 to the subject surface 31 (subject surface corresponding to the restored image) in FIG. 1 and corresponding to the above-described coefficients $\alpha 1$ to $\alpha 3$, $\beta 1$ to $\beta 3$, and $\gamma 1$ to $\gamma 3$ from the storage unit 128. Furthermore, the restoration unit 122 creates the simultaneous equations as expressed by equations (1) to (3) described above by using the detection signal level of each pixel of the detection image output from the imaging element 121 and the obtained coefficient set group. Then, the restoration unit 122 obtains the pixel value of each pixel forming the image formed as the image of the subject illustrated in the lower right part of FIG. 1 by solving the created simultaneous equations. Therefore, an image in which the user may recognize the subject through the visual contact (in which the subject may be visually recognized) is restored from the detection image. Hereinafter, the image restored from the detection image is referred to as the restored image. However, in a case where the imaging element 121 is sensitive only to light outside a visible wavelength band such as ultraviolet rays, the restored image is not the image in which the subject may be identified as a normal image, but this is also referred to as the restored image.

Furthermore, in the following, the restored image that is an image in a state in which the image of the subject is formed, the image before color separation such as demosaic processing or synchronization processing is referred to as a RAW image, and the detection image captured by the imaging element 121 is distinguished therefrom as not being the RAW image although this is the image according to a color filter array.

Note that, the number of pixels of the imaging element 121 and the number of pixels forming the restored image are not necessarily the same.

Furthermore, the restoration unit 122 performs demosaic processing, $\gamma$ correction, white balance adjustment, conversion processing to a predetermined compression format and the like on the restored image as necessary. Then, the restoration unit 122 outputs the restored image to the bus B1.

The control unit 123 includes, for example, various processors and controls each unit of the imaging device 101.

The input unit 124 includes an input device (for example, a key, a switch, a button, a dial, a touch panel, a remote controller and the like) for operating the imaging device 101, inputting data used for processing and the like. The input unit 124 outputs an operation signal, the input data and the like to the bus B1.

The detection unit 125 includes various sensors and the like used for detecting states of the imaging device 101, the subject and the like. For example, the detection unit 125 includes an acceleration sensor and a gyro sensor that detect an attitude and movement of the imaging device 101, a position detection sensor that detects a position of the imaging device 101 (for example, a global navigation satellite system (GNSS) receiver and the like), a ranging sensor that detects the subject distance and the like. The detection unit 125 outputs a signal indicating a detection result to the bus B1.

The association unit 126 associates the detection image obtained by the imaging element 121 with metadata corresponding to the detection image. The metadata includes, for example, the coefficient set group for restoring the restored image using a target detection image, the subject distance and the like.

Note that, a method of associating the detection image with the metadata is not especially limited as long as a correspondence relationship between the detection image and the metadata may be specified. For example, by assigning the metadata to image data including the detection image, assigning the same ID to the detection image and the metadata, or recording the detection image and the metadata on the same recording medium 130, the detection image and the metadata are associated with each other.

The display unit 127 includes a display, for example, and displays various types of information (for example, the restored image and the like). Note that, the display unit 127 may include an audio output unit such as a speaker to output audio.

The storage unit 128 includes one or more storage devices such as a read only memory (ROM), a random access memory (RAM), and a flash memory, and stores, for example, programs, data and the like used for processing of the imaging device 101. For example, the storage unit 128 stores the coefficient set group corresponding to the above-described coefficients $\alpha 1$ to $\alpha 3$, $\beta 1$ to $\beta 3$, and $\gamma 1$ to $\gamma 3$ in association with various subject distances. More specifically, for example, the storage unit 128 stores the coefficient set group including the coefficient for each pixel 121a of the imaging element 121 for each point light source set on the subject surface 31 for each subject surface 31 at each subject distance.

The recording/playback unit 129 records data on the recording medium 130 and plays back (reads out) the data recorded on the recording medium 130. For example, the recording/playback unit 129 records the restored image on the recording medium 130 or reads out the same from the recording medium 130. Furthermore, for example, the recording/playback unit 129 records the detection image and the corresponding metadata on the recording medium 130 or reads out the same from the recording medium 130.

The recording medium 130 includes, for example, any of a hard disk drive (HDD), a solid state drive (SSD), a magnetic disk, an optical disk, a magneto-optical disk, a semiconductor memory or the like, a combination thereof or the like.

The communication unit 131 communicates with other devices (for example, other imaging device, signal processing device and the like) by a predetermined communication method. Note that, the communication method of the communication unit 131 may be wired or wireless. Furthermore, the communication unit 131 may support a plurality of communication methods.

<First Configuration Example of Imaging Element 121>

Figure 3:
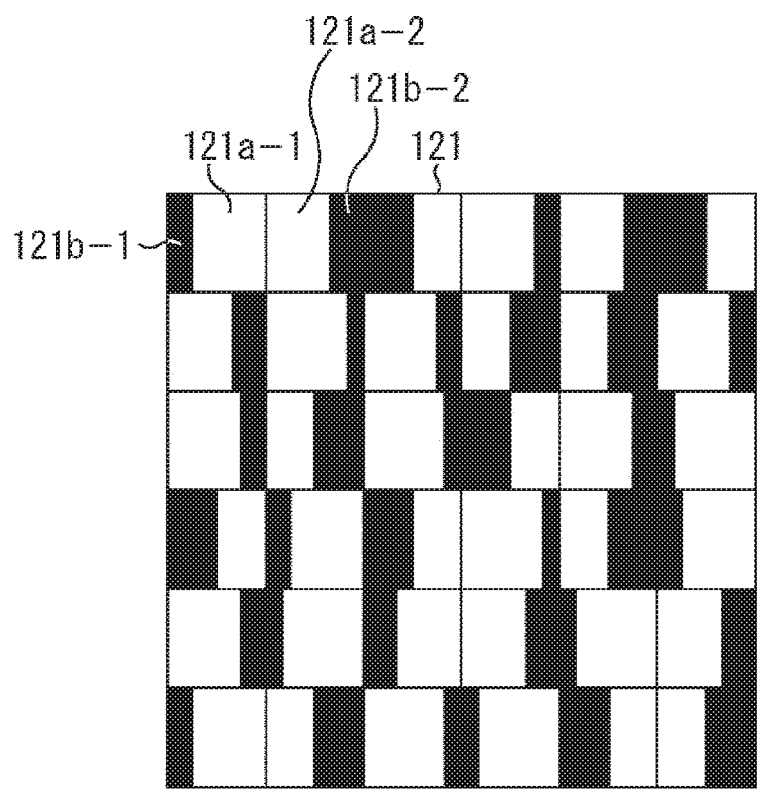
FIG. 3 is a view illustrating a configuration example of a pixel array unit of the imaging element in FIG. 2.
Figure 4:
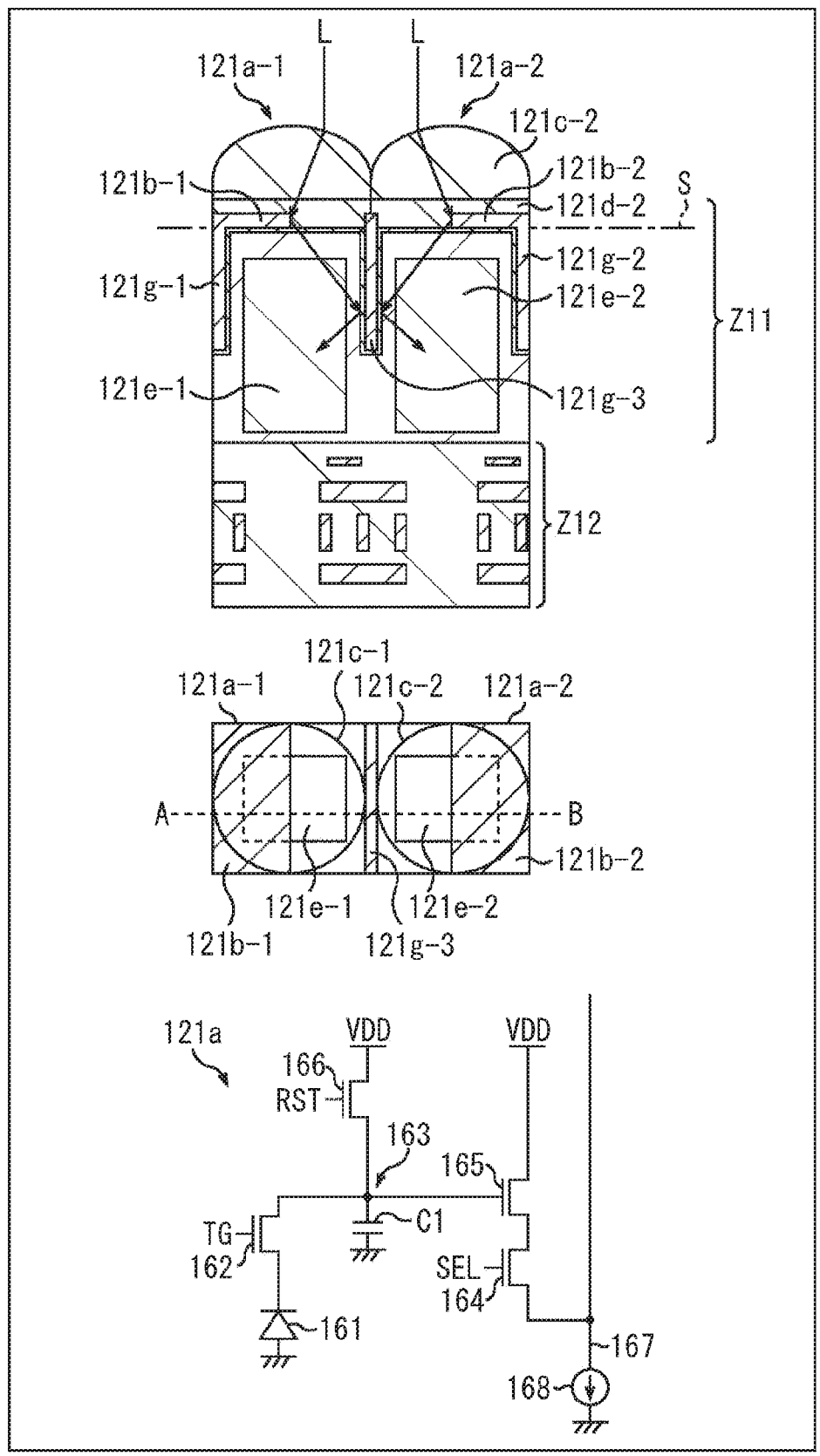
FIG. 4 is a view illustrating a first configuration example of the imaging element in FIG. 2.

Next, with reference to FIGS. 3 and 4, a first configuration example of the imaging element 121 of the imaging device 101 in FIG. 2 is described.

FIG. 3 illustrates a front view of a part of a pixel array unit of the imaging element 121. Note that, FIG. 3 illustrates an example of a case where the number of pixels in the pixel array unit is six pixels vertically×six pixels horizontally, but the number of pixels in the pixel array unit is not limited to this.

In the imaging element 121 in FIG. 3, each pixel 121a includes a light-shielding film 121b that is one of modulation elements so as to cover a part of a light-receiving region (light-receiving surface) of a photodiode thereof, and the incident light incident on each pixel 121a is optically modulated according to the incident angle. Then, for example, by providing the light-shielding film 121b in a different range for each pixel 121a, the light-receiving sensitivity to the incident angle of the incident light differs for each pixel 121a, and the respective pixels 121a have different incident angle directivities.

For example, a light-shielding range of the light-receiving region of the photodiode is different between pixels 121a-1 and 121a-2 due to provided light-shielding films 121b-1 and 121b-2 (at least any one of the light-shielding region (position) or a light-shielding area is different). That is, in the pixel 121a-1, the light-shielding film 121b-1 is provided so as to shield a part of a left side of the light-receiving region of the photodiode by a predetermined width. In contrast, in the pixel 121a-2, the light-shielding film 121b-2 is provided so as to shield a part of a right side of the light-receiving region by a predetermined width. Note that, the width by which the light-shielding film 121b-1 shields the light-receiving region of the photodiode may be different from/the same as the width by which the light-shielding film 121b-2 shields the light-receiving region of the photodiode. In the other pixels 121a as well, similarly, the light-shielding film 121b is randomly arranged in the pixel array so as to shield a different range of the light-receiving region for each pixel.

Note that, as a ratio of the light-shielding film 121b covering the light-receiving region of each pixel increases, the amount of light that the photodiode may receive decreases. Therefore, an area of the light-shielding film 121b is desirably the area that may secure a desired light amount, and may be limited to a maximum of about ¾ of the light-receiving region, for example. With this arrangement, it becomes possible to secure the light amount not smaller than the desired amount. However, if each pixel includes an unshielded range by a width corresponding to a wavelength of the light to be received, it is possible to receive a minimum amount of light. That is, for example, in a case of a blue pixel (B pixel), the wavelength is about 500 nm, and it is possible to receive the minimum amount of light if the light is not shielded beyond a width corresponding to this wavelength.

An upper stage of FIG. 4 is a side cross-sectional view of the first configuration example of the imaging element 121, and a middle stage of FIG. 4 is a top view of the first configuration example of the imaging element 121. Furthermore, the side-cross sectional view in the upper stage of FIG. 4 is an AB cross-section in the middle stage of FIG. 4. Moreover, a lower stage of FIG. 4 is a circuit configuration example of the imaging element 121.

In the imaging element 121 in the upper stage of FIG. 4, the incident light is incident from an upper side downward in the drawing. The adjacent pixels 121a-1 and 121a-2 are so-called backside irradiation-type with a wiring layer Z12 provided in a lowermost layer in the drawing and a photoelectric conversion layer Z11 provided thereon.

Note that, in a case where there is no need to distinguish between the pixels 121a-1 and 121a-2, description of a number at the end of the reference sign is omitted, and they are simply referred to as the pixels 121a. Hereinafter, in the specification, a number at the end of the reference sign is sometimes omitted similarly for other configurations.

Furthermore, FIG. 4 illustrates only the side view and the top view of two pixels forming the pixel array of the imaging element 121; it goes without saying that more pixels 121a are arranged but not illustrated.

Moreover, the pixels 121a-1 and 121a-2 include photodiodes 121e-1 and 121e-2 in the photoelectric conversion layer Z11, respectively. Furthermore, on the photodiodes 121e-1 and 121e-2, on-chip lenses 121c-1 and 121c-2 and color filters 121d-1 and 121d-2 are stacked from above, respectively.

The on-chip lenses 121c-1 and 121c-2 condense the incident light on the photodiodes 121e-1 and 121e-2, respectively.

The color filters 121d-1 and 121d-2 are optical filters that transmit light of specific wavelengths such as red, green, blue, infrared, and white, for example. Note that, in a case of white, the color filters 121d-1 and 121d-2 may be transparent filters or they are not required.

In the photoelectric conversion layer Z11 of the pixels 121a-1 and 121a-2, light-shielding films 121g-1 to 121g-3 are formed at boundaries between the pixels, and incident light L is inhibited from being incident on the adjacent pixel to generate crosstalk as illustrated in FIG. 4, for example.

Furthermore, as illustrated in the upper and middle stages of FIG. 4, the light-shielding films 121b-1 and 121b-2 shield a part of a light-receiving surface S as seen from above. In the light-receiving surface S of the photodiodes 121e-1 and 121e-2 in the pixels 121a-1 and 121a-2, different ranges are shielded by the light-shielding films 121b-1 and 121b-2, so that the different incident angle directivity is set independently for each pixel. However, the light-shielding range does not have to be different in all the pixels 121a of the imaging element 121, and there may also be the pixels 121a in which the same range is shielded.

Note that, as illustrated in the upper stage of FIG. 4, the light-shielding film 121b-1 and the light-shielding film 121g-1 are connected to each other and formed into an L shape as seen from the side. Similarly, the light-shielding film 121b-2 and the light-shielding film 121g-2 are connected to each other and formed into an L shape as seen from the side. Furthermore, the light-shielding films 121b-1, 121b-2, and 121g-1 to 121g-3 are formed using metal, for example, tungsten (W), aluminum (Al), or an alloy of Al and copper (Cu). Furthermore, the light-shielding films 121b-1, 121b-2, and 121g-1 to 121g-3 may be simultaneously formed using the same metal as that of wiring by the same process as the process by which the wiring is formed in a semiconductor process. Note that, the light-shielding films 121b-1, 121b-2, and 121g-1 to 121g-3 do not necessarily have the same thickness depending on the position.

Furthermore, as illustrated in the lower stage of FIG. 4, the pixel 121a includes a photodiode 161 (corresponding to the photodiode 121e), a transfer transistor 162, a floating diffusion (FD) unit 163, a selection transistor 164, an amplification transistor 165, and a reset transistor 166, and is connected to a current source 168 via a vertical signal line 167.

The photodiode 161 is such that an anode electrode is grounded and a cathode electrode is connected to a gate electrode of the amplification transistor 165 via the transfer transistor 162.

The transfer transistor 162 is driven according to a transfer signal TG. For example, when the transfer signal TG supplied to a gate electrode of the transfer transistor 162 reaches a high level, the transfer transistor 162 is turned on. Therefore, charges accumulated in the photodiode 161 are transferred to the FD unit 163 via the transfer transistor 162.

The amplification transistor 165 serves as an input unit of a source follower that is a readout circuit that reads out a signal obtained by photoelectric conversion in the photodiode 161, and outputs a pixel signal at a level corresponding to the charges accumulated in the FD unit 163 to the vertical signal line 167. That is, the amplification transistor 165 forms the source follower with the current source 168 connected to one end of the vertical signal line 167 with a drain terminal connected to a power supply VDD and a source terminal connected to the vertical signal line 167 via the selection transistor 164.

The FD unit 163 is a floating diffusion region having a charge capacitance C1 provided between the transfer transistor 162 and the amplification transistor 165, and temporarily accumulates the charges transferred from the photodiode 161 via the transfer transistor 162. The FD unit 163 serves as a charge detection unit that converts the charges into a voltage, and the charges accumulated in the FD unit 163 are converted into the voltage in the amplification transistor 165.

The selection transistor 164 is driven according to a selection signal SEL, turned on when the selection signal SEL supplied to a gate electrode reaches a high level, and connects the amplification transistor 165 and the vertical signal line 167.

The reset transistor 166 is driven according to a reset signal RST. For example, the reset transistor 166 is turned on when a reset signal RST supplied to a gate electrode reaches a high level, discharges the charges accumulated in the FD unit 163 to the power supply VDD, and resets the FD unit 163.

For example, the pixel circuit illustrated in the lower stage of FIG. 4 operates as follows.

That is, as a first operation, the reset transistor 166 and the transfer transistor 162 are turned on, the charges accumulated in the FD unit 163 are discharged to the power supply VDD, and the FD unit 163 is reset.

As a second operation, the reset transistor 166 and the transfer transistor 162 are turned off, an exposure period is started, and the charges according to the amount of incident light are accumulated by the photodiode 161.

As a third operation, after the reset transistor 166 is turned on and the FD unit 163 is reset, the reset transistor 166 is turned off. By this operation, the FD unit 163 is set to reference potential.

As a fourth operation, the potential of the FD unit 163 in the reset state is output from the amplification transistor 165 as the reference potential.

As a fifth operation, the transfer transistor 162 is turned on, and the charges accumulated in the photodiode 161 are transferred to the FD unit 163.

As a sixth operation, the potential of the FD unit 163 to which the charges of the photodiode are transferred is output from the amplification transistor 165 as signal potential.

Then, a signal obtained by subtracting the reference potential from the signal potential by correlated double sampling (CDS) is output as a detection signal (pixel signal) of the pixel 121a. A value of this detection signal (output pixel value) is modulated according to the incident angle of the incident light from the subject, and has the different characteristic (directivity) depending on the incident angle (has the incident angle directivity).

<Second Configuration Example of Imaging Element 121>

Figure 5:
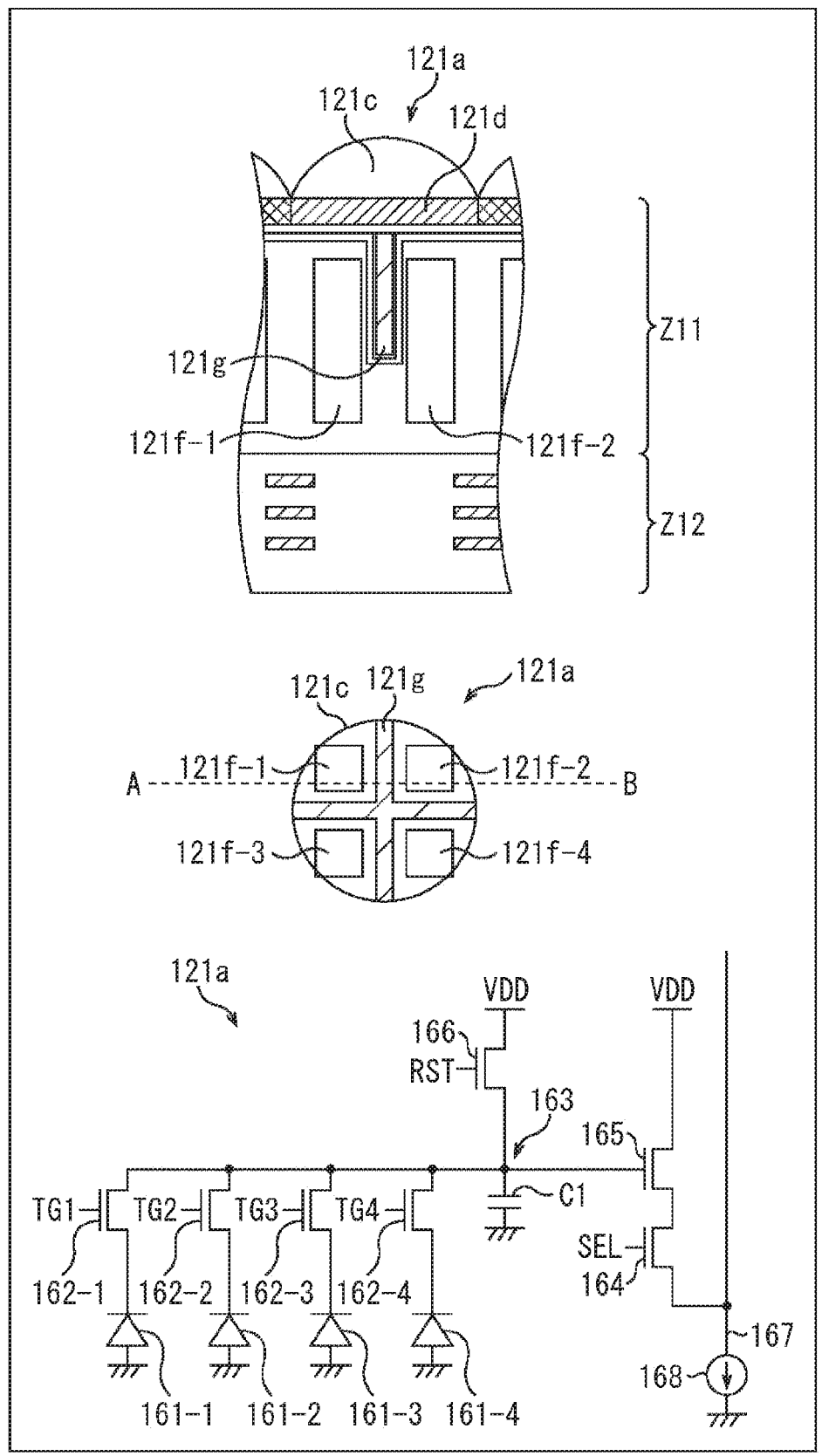
FIG. 5 is a view illustrating a second configuration example of the imaging element in FIG. 2.

FIG. 5 is a view illustrating a second configuration example of the imaging element 121. An upper stage of FIG. 5 is a side cross-sectional view of the pixel 121a of the imaging element 121 being the second configuration example, and a middle stage of FIG. 5 is a top view of the imaging element 121. Furthermore, the side cross-sectional view in the upper stage of FIG. 5 is an AB cross-section in the middle stage of FIG. 5. Moreover, a lower stage of FIG. 5 is a circuit configuration example of the imaging element 121.

The imaging element 121 in FIG. 5 has a configuration different from that of the imaging element 121 in FIG. 4 in that four photodiodes 121f-1 to 121f-4 are formed in one pixel 121a, and the light-shielding film 121g is formed in a region that separates the photodiodes 121f-1 to 121f-4. That is, in the imaging element 121 in FIG. 5, the light-shielding film 121g is formed into a "+" shape as seen from above. Note that, the common configuration is assigned with the same reference sign as that in FIG. 4 and the detailed description thereof is omitted.

In the imaging element 121 in FIG. 5, occurrence of electrical and optical crosstalk among the photodiodes 121f-1 to 121f-4 is prevented because the photodiodes 121f-1 to 121f-4 are separated by the light-shielding film 121g. That is, the light-shielding film 121g in FIG. 5 is for preventing the crosstalk as is the case with the light-shielding film 121g of the imaging element 121 in FIG. 4 and is not for providing the incident angle directivity.

Furthermore, in the imaging element 121 in FIG. 5, one FD unit 163 is shared by the four photodiodes 121f-1 to 121f-4. The lower stage of FIG. 5 illustrates the circuit configuration example in which one FD unit 163 is shared by the four photodiodes 121f-1 to 121f-4. Note that, in the lower stage of FIG. 5, the description of the configuration the same as that in the lower stage of FIG. 4 is not repeated.

The lower stage of FIG. 5 differs from the circuit configuration in the lower stage of FIG. 4 in that photodiodes 161-1 to 161-4 (corresponding to the photodiodes 121f-1 to 121f-4 in the upper stage of FIG. 5) and transfer transistors 162-1 to 162-4 are provided in place of the photodiode 161 (corresponding to the photodiode 121e in the upper stage of FIG. 4) and the transfer transistor 162, respectively, to share the FD unit 163.

With such a configuration, the charges accumulated in the photodiodes 121f-1 to 121f-4 are transferred to the common FD unit 163 having a predetermined capacitance provided at a connection between the photodiodes 121f-1 to 121f-4 and the gate electrode of the amplification transistor 165. Then, a signal corresponding to a level of the charges held in the FD unit 163 is read out as a detection signal (pixel signal) (however, the CDS processing is performed as described above).

Therefore, the charges accumulated by the photodiodes 121f-1 to 121f-4 are allowed to selectively contribute to an output of the pixel 121a, that is, the detection signal in various combinations. That is, it is configured such that the charges may be read out independently for each of the photodiodes 121f-1 to 121f-4, and it is possible to obtain the different incident angle directivities by making the photodiodes 121f-1 to 121f-4 that contribute to the output (degree of contribution to the output of the photodiodes 121f-1 to 121f-4) different from each other.

For example, by transferring the charges of the photodiodes 121f-1 and 121f-3 to the FD unit 163 and adding the signals obtained by reading out them, the incident angle directivity in a lateral direction may be obtained. Similarly, by transferring the charges of the photodiodes 121f-1 and 121f-2 to the FD unit 163 and adding the signals obtained by reading out them, the incident angle directivity in a vertical direction may be obtained.

Furthermore, a signal obtained on the basis of the charges selectively read out independently from the four photodiodes 121f-1 to 121f-4 is the detection signal corresponding to one pixel forming the detection image.

Note that, contribution of (the charges of) each photodiode 121*f* to the detection signal may be realized, for example, not only by whether or not to transfer the charges (detection value) of each photodiode 121*f* to the FD unit 163, but also by using an electronic shutter function to reset the charges accumulated in the photodiode 121*f* before the transfer to the FD unit 163 and the like. For example, if the charges of the photodiode 121*f* are reset immediately before the transfer to the FD unit 163, the photodiode 121*f* does not contribute to the detection signal at all. On the other hand, when there is a time between the reset of the charges of the photodiode 121*f* and the transfer of the charges to the FD unit 163, the photodiode 121*f* partially contributes to the detection signal.

As described above, in a case of the imaging element 121 in FIG. 5, by changing the combination of the photodiodes used for the detection signal out of the four photodiodes 121*f*-1 to 121*f*-4, it is possible to allow each pixel to have the different incident angle directivity. Furthermore, the detection signal output from each pixel 121*a* of the imaging element 121 in FIG. 5 has a value (output pixel value) modulated according to the incident angle of the incident light from the subject, and has the characteristic (directivity) different depending on the incident angle (has the incident angle directivity).

Note that, hereinafter, a unit of outputting the detection signal corresponding to one pixel of the detection image is referred to as a pixel output unit. The pixel output unit includes at least one or more photodiodes, and each pixel 121*a* of the imaging element 121 generally corresponds to one pixel output unit.

For example, in the imaging element 121 in FIG. 4, since one pixel 121*a* includes one photodiode 121*e*, one pixel output unit includes one photodiode 121*e*. In other words, one photodiode 121*e* forms one pixel output unit.

Then, by making a light-shielding state by the light-shielding film 121*b* of each pixel 121*a* different, the incident angle directivity of each pixel output unit may be made different. Then, in the imaging element 121 in FIG. 4, the incident light on each pixel 121*a* is optically modulated using the light-shielding film 121*b*, and as a result, the detection signal of one pixel of the detection image reflecting the incident angle directivity is obtained by the signal output from the photodiode 121*e* of each pixel 121*a*. That is, the imaging element 121 in FIG. 4 includes a plurality of pixel output units that receives the incident light from the subject incident without an intervention of an imaging lens or a pinhole, each pixel output unit includes one photodiode 121*e*, and the characteristic (incident angle directivity) to the incident angle of the incident light from the subject is set for each pixel output unit.

On the other hand, in the imaging element 121 in FIG. 5, one pixel 121*a* includes four photodiodes 121*f*-1 to 121*f*-4, so that one pixel output unit includes four photodiodes 121*e*. In other words, the four photodiodes 121*f* forms one pixel output unit. On the other hand, each photodiode 121*e* alone does not form an individual pixel output unit.

Then, as described above, the incident angle directivity for each pixel output unit is different by making the photodiode 121*f* that contributes to the detection signal among the four photodiodes 121*f*-1 to 121*f*-4 different for each pixel 121*a*. That is, in the imaging element 121 in FIG. 5, a range that does not contribute to the output (detection signal) out of the four photodiodes 121*f*-1 to 121*f*-4 serves as the light-shielding region. Then, the detection signal of one pixel of the detection image reflecting the incident angle directivity is obtained by a combination of signals output from the photodiodes 121*f*-1 to 121*f*-4. That is, the imaging element 121 in FIG. 5 includes a plurality of pixel output units that receives the incident light from the subject incident without an intervention of the imaging lens or the pinhole, each pixel output unit includes a plurality of photodiodes (for example, photodiodes 121*f*-1 to 121*f*-4), and (a degree of) the photodiode contributing to the output is made different, so that a characteristic in each pixel output unit (incident angle directivity) to the incident angle of the incident light from the subject is different from each other.

Note that, in the imaging element 121 in FIG. 5, the incident light is incident on all the photodiodes 121*f*-1 to 121*f*-4 without being optically modulated, so that the detection signal is not the signal obtained by optical modulation. Furthermore, hereinafter, the photodiode 121*f* that does not contribute to the detection signal is also referred to as the photodiode 121*f* that does not contribute to the pixel output unit or output.

Note that, FIG. 5 illustrates an example in which the light-receiving surface of the pixel output unit (pixel 121*a*) is divided into four equal parts, and the photodiode 121*f* having the light-receiving surface of the same size is arranged in each region, that is, the example in which the photodiode is equally divided into four; however, the dividing number and dividing position of the photodiode may be arbitrarily set.

For example, the photodiode is not necessarily equally divided, and the dividing position of the photodiode may be different for each pixel output unit. Therefore, for example, even if the photodiode 121*f* in the same position is allowed to contribute to the output among a plurality of pixel output units, the incident angle directivity differs between the pixel output units. Furthermore, for example, by making the dividing number different between pixel output units, it becomes possible to set the incident angle directivity more freely. Moreover, for example, both the dividing number and the dividing position may be made different between the pixel output units.

Furthermore, both the imaging element 121 in FIG. 4 and the imaging element 121 in FIG. 5 have a configuration in which each pixel output unit may independently set the incident angle directivity. In contrast, in the imaging device disclosed in Non-Patent Document 1 and Patent Documents 1 and 2 described above, each pixel output unit of the imaging element does not have a configuration in which the incident angle directivity may be set independently. Note that, in the imaging element 121 in FIG. 4, the incident angle directivity of each pixel output unit is set by the light-shielding film 121*b* at the time of manufacture. On the other hand, in the imaging element 121 in FIG. 5, the dividing number and dividing position of the photodiode of each pixel output unit are set at the time of manufacture, but the incident angle directivity of each pixel output unit (combination of photodiodes allowed to contribute to output) may be set at the time of use (for example, at the time of imaging). Note that, in both the imaging element 121 in FIG. 4 and the imaging element 121 in FIG. 5, it is not always necessary for all the pixel output units to have a configuration with the incident angle directivity.

Note that, as described above, each pixel of the imaging element normally corresponds to one pixel output unit; however, as described later, there is a case where a plurality of pixels forms one pixel output unit. In the following, it is described assuming that each pixel of the imaging element corresponds to one pixel output unit unless otherwise specified.

<Principle of Causing Incident Angle Directivity>

Figure 6:
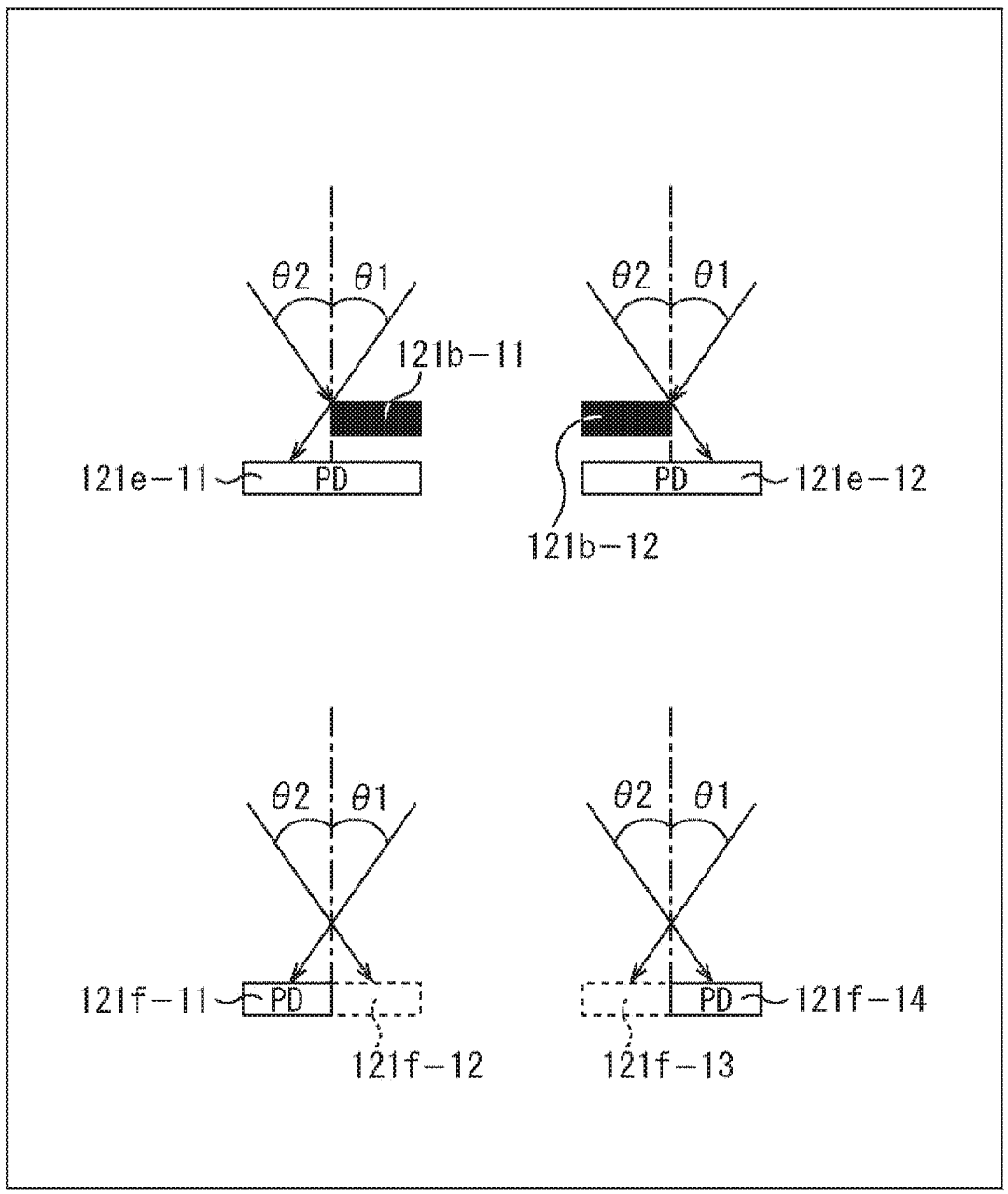
FIG. 6 is a view for illustrating a principle of incident angle directivity generation.

The incident angle directivity of each pixel of the imaging element 121 occurs, for example, by a principle illustrated in FIG. 6. Note that, a left upper part and a right upper part of FIG. 6 are views for illustrating the principle of occurrence of the incident angle directivity in the imaging element 121 in FIG. 4, and a lower left part and a lower right part of FIG. 6 are views for illustrating the principle of occurrence of the incident angle directivity in the imaging element 121 in FIG. 5.

Each of the pixels in the upper left part and upper right part of FIG. 6 includes one photodiode 121e. In contrast, each of the pixels in the lower left part and the lower right part of FIG. 6 includes two photodiodes 121f. Note that, herein, an example in which one pixel includes two photodiodes 121f is illustrated, but this is for convenience in explanation, and the number of photodiodes 121f included in one pixel may be other than this.

In the pixel in the upper left part of FIG. 6, a light-shielding film 121b-11 is formed so as to shield a right half of a light-receiving surface of a photodiode 121e-11. Furthermore, in the pixel in the upper right part of FIG. 6, a light-shielding film 121b-12 is formed so as to shield a left half of a light-receiving surface of a photodiode 121e-12. Note that, a dashed-dotted line in the drawing is an auxiliary line that passes through the center in a horizontal direction of the light-receiving surface of the photodiode 121e and is perpendicular to the light-receiving surface.

For example, in the pixel in the upper left part of FIG. 6, the incident light from the upper right that forms an incident angle 61 with respect to the dashed-dotted line in the drawing is easily received by a range on a left half not shielded by the light-shielding film 121b-11 of the photodiode 121e-11. In contrast, the incident light from the upper left that forms an incident angle 62 with respect to the dashed-dotted line in the drawing is less easily received by the range on the left half not shielded by the light-shielding film 121b-11 of the photodiode 121e-11. Accordingly, the pixel in the upper left part of FIG. 6 has the incident angle directivity with high light-receiving sensitivity for the incident light from the upper right in the drawing and low light-receiving sensitivity for the incident light from the upper left.

On the other hand, for example, in the pixel in the upper right part of FIG. 6, the incident light from the upper right forming the incident angle 61 is less easily received by a range in a left half shielded by the light-shielding film 121b-12 of the photodiode 121e-12. In contrast, the incident light from the upper left that forms the incident angle 62 is easily received by a range in a right half not shielded by the light-shielding film 121b-12 of the photodiode 121e-12. Accordingly, the pixel in the upper right part of FIG. 6 has the incident angle directivity with low light-receiving sensitivity for the incident light from the upper right in the drawing and high light-receiving sensitivity for the incident light from the upper left.

Furthermore, the pixel in the lower left part of FIG. 6 includes photodiodes 121f-11 and 121f-12 on left and right sides in the drawing, and has a configuration with the incident angle directivity without the light-shielding film 121b provided by reading out the detection signal of one of them.

That is, in the pixel in the lower left part of FIG. 6, by reading out only the signal of the photodiode 121f-11 provided on the left side in the drawing, the incident angle directivity similar to that of the pixel in the upper left part of FIG. 6 may be obtained. That is, the incident light from the upper right that forms the incident angle 61 with respect to the dashed-dotted line in the drawing is incident on the photodiode 121f-11, and a signal corresponding to the amount of received light is read out from the photodiode 121f-11, so that this contributes to the detection signal output from the pixel. In contrast, the incident light from the upper left that forms the incident angle 62 with respect to the dashed-dotted line in the drawing is incident on the photodiode 121f-12, but this is not read out from the photodiode 121f-12, so that this does not contribute to the detection signal output from the pixel.

Similarly, in a case where two photodiodes 121f-13 and 121f-14 are provided as in the pixel in the lower right part in FIG. 6, by reading out only the signal of the photodiode 121f-14 provided on the right side in the drawing, the incident angle directivity similar to that of the pixel in the upper right part of FIG. 6 may be obtained. That is, the incident light from the upper right that forms the incident angle 61 is incident on the photodiode 121f-13, but the signal is not read out from the photodiode 121f-13, so that this does not contribute to the detection signal output from the pixel. In contrast, the incident light from the upper left forming the incident angle 62 is incident on the photodiode 121f-14, and a signal corresponding to the amount of received light is read out from the photodiode 121f-14, so that this contributes to the detection signal output from the pixel.

Note that, in the pixel in the upper part of FIG. 6, the example in which the light-shielding range and the range not shielded are separated in the central position in the horizontal direction of the pixel (the light-receiving surface of the photodiode 121e) is illustrated, but the ranges may be separated in a position other than this. Furthermore, in the pixel in the lower part of FIG. 6, the example in which the two photodiodes 121f are separated in the central position in the horizontal direction of the pixel is illustrated, but they may be separated in a position other than this. In this manner, by changing the light-shielding range or the position in which the photodiode 121f is separated, the different incident angle directivities may be generated.

<Regarding Incident Angle Directivity in Configuration Including On-chip Lens>

Next, the incident angle directivity in a configuration including the on-chip lens 121c is described with reference to FIG. 7.

Figure 7:
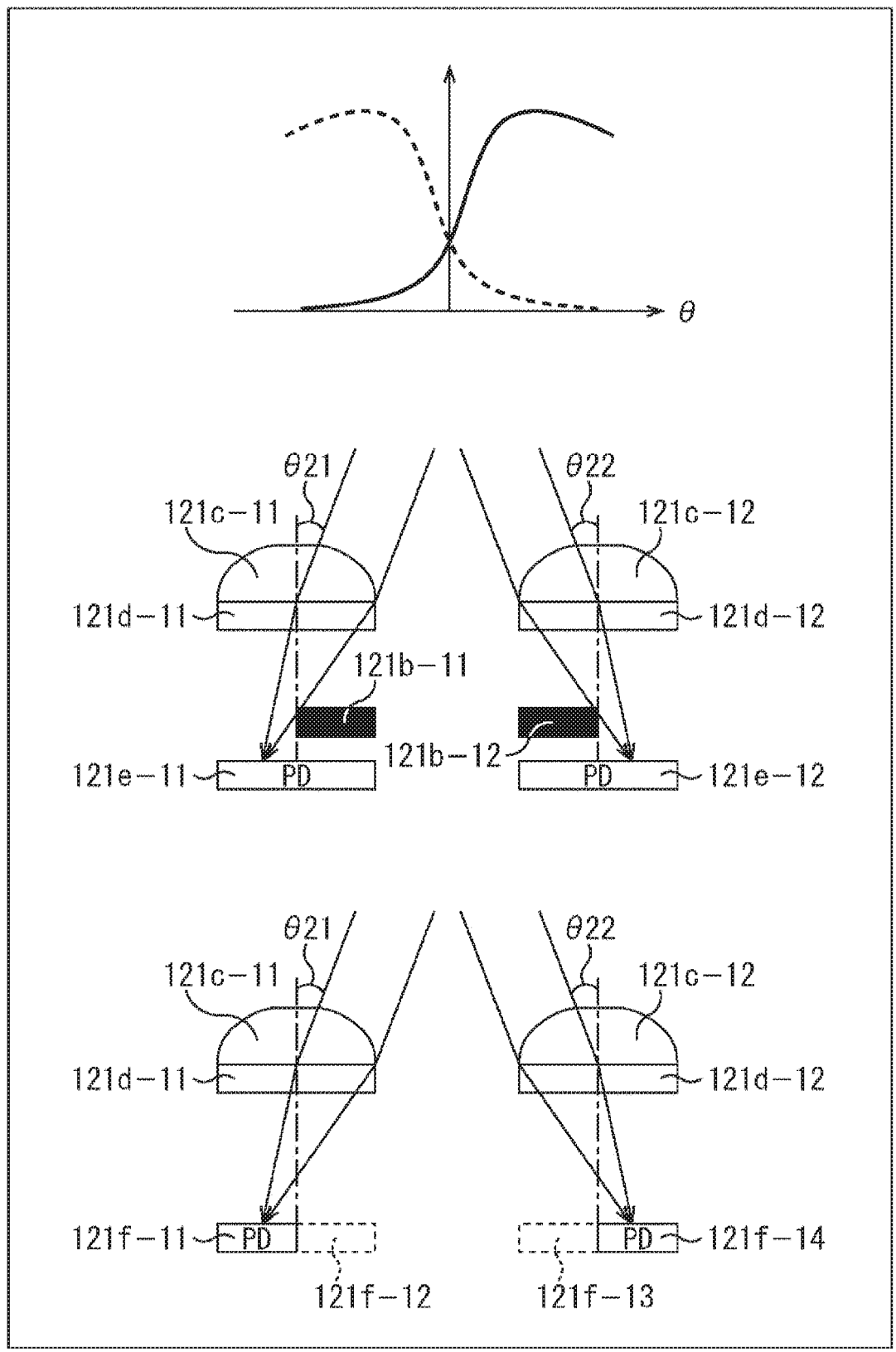
FIG. 7 is a view for illustrating a change in incident angle directivity using an on-chip lens.

A graph in an upper stage of FIG. 7 illustrates the incident angle directivity of the pixels in middle and lower stages of FIG. 7. Note that, the incident angle θ is plotted along the abscissa, and the detection signal level is plotted along the ordinate. Note that, the incident angle θ is 0 degree in a case where the direction of the incident light coincides with a dashed-dotted line on a left side in the middle stage of FIG. 7, an incident angle θ21 side on the left side in the middle stage of FIG. 7 is a positive direction, and an incident angle θ22 side on a right side in the middle stage of FIG. 7 is a negative direction. Therefore, the incident angle of the incident light incident on the on-chip lens 121c from the upper right is larger than that of the incident light incident from the upper left. That is, the incident angle θ increases as a travel direction of the incident light inclines to the left (increases in the positive direction) and decreases as this inclines to the right (increases in the negative direction).

Furthermore, the pixel in the left part in the middle stage of FIG. 7 is obtained by adding an on-chip lens 121c-11 that condenses the incident light and a color filter 121d-11 that transmits light of a predetermined wavelength to the pixel in the left part in the upper stage of FIG. 6. That is, in this pixel, the on-chip lens 121c-11, the color filter 121d-11, the light-shielding film 121b-11, and the photodiode 121e-11 are stacked in this order in the light incident direction from the upper part of the drawing.

Similarly, the pixel in the right part in the middle stage of FIG. 7, the pixel in a left part in the lower stage of FIG. 7, and the pixel in a right part in the lower stage of FIG. 7 are obtained by adding the on-chip lens 121c-11 and the color filter 121d-11, or an on-chip lens 121c-12 and a color filter 121d-12 to the pixel in the right part in the upper stage of FIG. 6, the pixel in the left part in the lower stage of FIG. 6, and the pixel in the right part in the lower stage of FIG. 6, respectively.

In the pixel in the left part in the middle stage of FIG. 7, the detection signal level (light-receiving sensitivity) of the photodiode 121e-11 changes according to the incident angle θ of the incident light as indicated by a solid waveform in the upper stage of FIG. 7. That is, the larger the incident angle θ being the angle formed by the incident light with respect to the dashed-dotted line in the drawing (the larger the incident angle θ in the positive direction (the more this inclines rightward in the drawing)), the light is condensed in a range in which the light-shielding film 121b-11 is not provided, so that the detection signal level of the photodiode 121e-11 increases. In contrast, the smaller the incident angle θ of the incident light (the larger the incident angle θ in the negative direction (the more this inclines leftward in the drawing)), the light is condensed in a range in which the light-shielding film 121b-11 is provided, so that the detection signal level of the photodiode 121e-11 decreases.

Furthermore, in the pixel in the right part in the middle stage of FIG. 7, the detection signal level (light-receiving sensitivity) of the photodiode 121e-12 changes according to the incident angle θ of the incident light as indicated by a dotted waveform in the upper stage of FIG. 7. That is, the larger the incident angle θ of the incident light (the larger the incident angle θ in the positive direction), the light is condensed in the range in which the light-shielding film 121b-12 is provided, so that the detection signal level of the photodiode 121e-12 decreases. In contrast, the smaller the incident angle θ of the incident light (the larger the incident angle θ in the negative direction), the light is incident on the range in which the light-shielding film 121b-12 is not provided, so that the detection signal level of the photodiode 121e-12 increases.

The solid and dotted waveforms indicated in the upper stage of FIG. 7 may be changed according to the range of the light-shielding film 121b. Therefore, it becomes possible to allow the respective pixels to have the different incident angle directivities depending on the range of the light-shielding film 121b.

As described above, the incident angle directivity is the characteristic of the light-receiving sensitivity of each pixel according to the incident angle θ, and this may also be said to be a characteristic of a light-shielding value according to the incident angle θ in the pixel in the middle stage of FIG. 7. That is, the light-shielding film 121b shields the incident light in a specific direction at a high level, but cannot sufficiently shield the incident light in other directions. This change in shielding level generates the detection signal level different according to the incident angle θ as illustrated in the upper stage of FIG. 7. Therefore, when the direction in which the light-shielding at the highest level may be performed in each pixel is defined as the light-shielding direction of each pixel, having the different incident angle directivities in the respective pixels means having the different light-shielding directions in the respective pixels.

Furthermore, in the pixel in the left part in the lower stage of FIG. 7, as is the case with the pixel in the left part in the lower stage of FIG. 6, by using the signal of only the photodiode 121f-11 in the left part of the drawing, the incident angle directivity similar to that of the pixel in the left part in the middle stage of FIG. 7 may be obtained. That is, when the incident angle θ of the incident light increases (when the incident angle θ increases in the positive direction), the detection signal level increases because the light is condensed in the range of the photodiode 121f-11 from which the signal is read out. In contrast, the smaller the incident angle θ of the incident light (the larger the incident angle θ in the negative direction), the light is condensed in the range of the photodiode 121f-12 from which the signal is read out, so that the detection signal level decreases.

Furthermore, similarly, in the pixel in the right part in the lower stage of FIG. 7, as is the case with the pixel in the right part in the lower stage of FIG. 6, by using the signal of only a photodiode 121f-14 in the right part of the drawing, the incident angle directivity similar to that of the pixel in the right part in the middle stage of FIG. 7 may be obtained. That is, when the incident angle θ of the incident light increases (when the incident angle θ increases in the positive direction), the detection signal level per pixel decreases because the light is condensed in the range of a photodiode 121f-13 that does not contribute to the output (detection signal). In contrast, the smaller the incident angle θ of the incident light (the larger the incident angle θ in the negative direction), the light is condensed in the range of the photodiode 121f-14 that contributes to the output (detection signal), so that the detection signal level per pixel decreases.

Note that, as in the pixel in the lower stage of FIG. 7, in a pixel provided with the plurality of photodiodes in the pixel and capable of changing the photodiode that contributes to the output, in order to allow each photodiode to have directivity to the incident angle of the incident light and generate the incident angle directivity in a pixel unit, the on-chip lens 121c is the indispensable configuration for each pixel.

Note that, as for the incident angle directivity, it is desirable that randomness is higher in a pixel unit. For example, if adjacent pixels have the same incident angle directivity, equations (1) to (3) described above or equations (4) to (6) to be described later might be the same equations, and as a result, the number of equations might be insufficient for an unknown number that is a solution of the simultaneous equations, and the pixel values forming the restored image might not be obtained.

Note that, in the following description, an example of a case of using the pixel 121a that realizes the incident angle directivity using the light-shielding film 121b as the pixel 121a in FIG. 4 is mainly described. However, except for a case where the light-shielding film 121b is indispensable, it is also possible to use the pixel 121a that basically divides the photodiode to realize the incident angle directivity.

<Configuration of Light-shielding Film>

In the description above, as illustrated in FIG. 3, the example in which the entire light-receiving surface is shielded in the vertical direction and the light-shielding width and position in the horizontal direction are changed is illustrated as the configuration of the light-shielding film 121b of each pixel 121a of the imaging element 121; however, as a matter of course, it is also possible to allow each pixel 121a to have the incident angle directivity by shielding the entire light-receiving surface in the horizontal direction and changing the width (height) and position in the vertical direction.

Note that, in the following, as illustrated in the example in FIG. 3, the light-shielding film 121b that shields the entire light-receiving surface of the pixel 121a in the vertical direction and shields the light-receiving surface by a predetermined width in the horizontal direction is referred to as a lateral band-type light-shielding film 121b. Furthermore, the light-shielding film 121b that shields the entire light-receiving surface of the pixel 121a in the horizontal direction and shields the light-receiving surface by a predetermined height in the vertical direction is referred to as a longitudinal band-type light-shielding film 121b.

Figure 8:
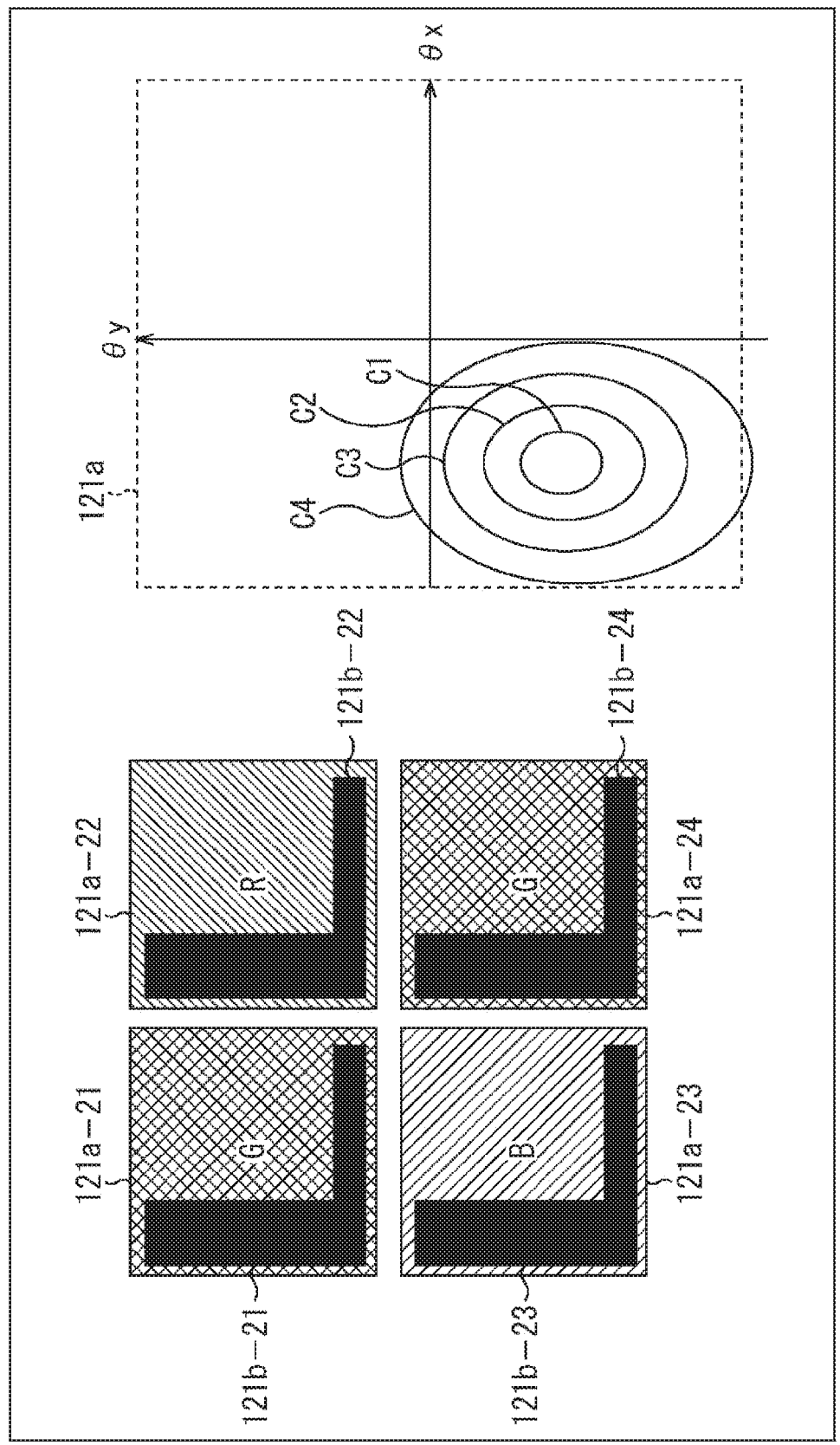
FIG. 8 is a view illustrating an example of a type of a light-shielding film.

Furthermore, as illustrated in a left part of FIG. 8, it is also possible to combine the longitudinal band-type and lateral band-type light-shielding films 121b, for example, to provide an L-shaped light-shielding film 121b for each pixel in the Bayer array.

Note that, in FIG. 8, a black range represents the light-shielding film 121b, and this is similarly displayed in the subsequent drawings unless otherwise specified. Furthermore, in the example in FIG. 8, for each of pixels 121a-21 and 121a-24 being green (G) pixels, a pixel 121a-22 being a red (R) pixel, and a pixel 121a-23 being a blue (B) pixel forming the Bayer array, L-shaped light-shielding films 121b-21 to 121b-24 are provided.

In this case, each pixel 121a has the incident angle directivity as illustrated in the right part of FIG. 8. That is, in the right part of FIG. 8, distribution of the light reception sensitivities of the respective pixels 121a is illustrated in which the incident angle θx in the horizontal direction (x direction) of the incident light is plotted along the abscissa, and the incident angle θy in the vertical direction (y direction) of the incident light is plotted along the ordinate. Then, the light-receiving sensitivity within a range C4 is higher than that outside the range C4, the light-receiving sensitivity within a range C3 is higher than that outside the range C3, the light-receiving sensitivity within a range C2 is higher than that outside the range C2, and the light-receiving sensitivity within a range C1 is higher than that outside the range C1.

Accordingly, in each pixel 121a, the detection signal level to the incident light in which the incident angle θx in the horizontal direction (x direction) and the incident angle θy in the vertical direction (y direction) are within the range C1 is the highest. Then, the detection signal level decreases in the order of the incident light in which the incident angle θx and the incident angle θy are within the range C2, the range C3, the range C4, and the range other than the range C4. Note that, intensity distribution of the light-receiving sensitivities illustrated in the right part of FIG. 8 is determined by the range shielded by the light-shielding film 121b in each pixel 121a regardless of the Bayer array.

Note that, in the following, as the L-shaped light-shielding films 121b-21 to 121b-24 in FIG. 8, the light-shielding film 121b having a shape obtained by connecting the longitudinal band-type light-shielding film and the lateral band-type light-shielding film at their ends is collectively referred to as the L-shaped light-shielding film 121b.

<Method of Setting Incident Angle Directivity>

Next, an example of a method of setting the incident angle directivity is described with reference to FIG. 9.

Figure 9:
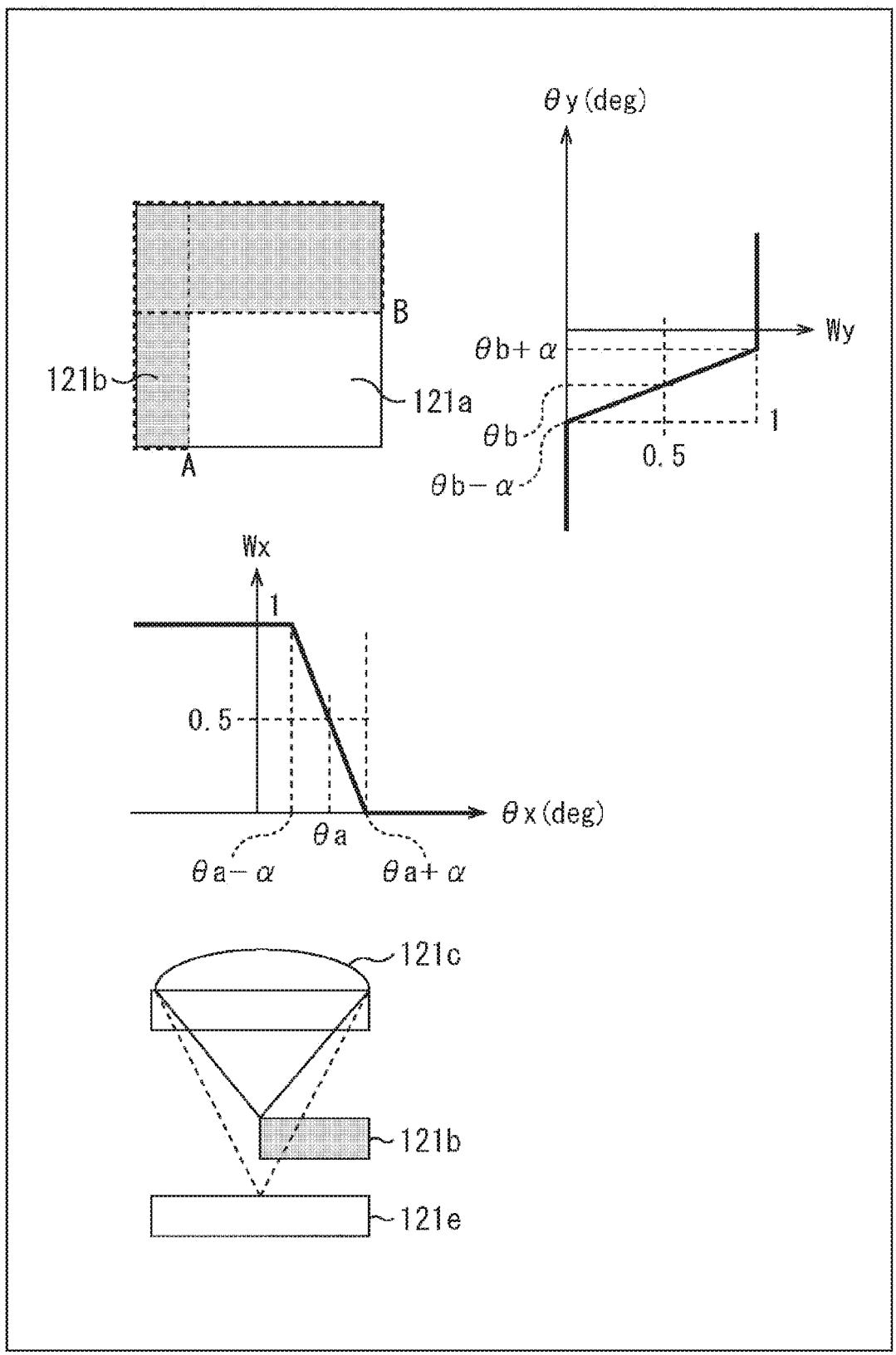
FIG. 9 is a view for illustrating a design of the incident angle directivity.

For example, a case where the light-shielding range in the horizontal direction of the light-shielding film 121b is a range from a left end of the pixel 121a to a position A, and the light-shielding range in the vertical direction is a range from an upper end of the pixel 121a to a position B as illustrated in an upper stage of FIG. 9 is considered.

In this case, a weight Wx of 0 to 1, the weight according to the incident angle θx (deg) from the central position in the horizontal direction of each pixel that serves as an index of the incident angle directivity in the horizontal direction is set. In further detail, in a case where it is assumed that the weight Wx is 0.5 at the incident angle θx=θa corresponding to the position A, the weight Wx is set such that the weight Wx is 1 at the incident angle θx<θa−α, (−(θx−θa)/2α+0.5) at θa−α≤incident angle θx≤θa+α, and 0 at the incident angle θx>θa+α.

Similarly, a weight Wy of 0 to 1, the weight according to the incident angle θy (deg) from the central position in the vertical direction of each pixel that serves as an index of the incident angle directivity in the vertical direction is set. In further detail, in a case where it is assumed that the weight Wy is 0.5 at the incident angle θy=θb corresponding to the position B, the weight Wy is set such that the weight Wy is 0 at the incident angle θy<θb−α, ((θy−θb)/2α+0.5) at θb−α≤incident angle θy≤θb+α, and 1 at the incident angle θy>θb+α.

Note that, the weight Wx and the weight Wy change as illustrated in the graph in FIG. 9 in a case where an ideal condition is satisfied.

Then, by using the weights Wx and Wy obtained in this manner, it is possible to obtain a coefficient corresponding to the incident angle directivity, that is, the light-receiving sensitivity characteristic of each pixel 121a. For example, a value obtained by multiplying the weight Wx corresponding to the incident angle θx of the incident light from a certain point light source of the subject surface 31 by the weight Wy corresponding to the incident angle θy is set as the coefficient for the point light source.

Furthermore, at that time, an inclination (½α) indicating the change in weight in the range in which the weight Wx in the horizontal direction and the weight Wy in the vertical direction are around 0.5 may be set by using the on-chip lens 121c having different focal distances.

For example, in a case where the focal distance of the on-chip lens 121c focuses on a surface of the light-shielding film 121b as indicated by a solid line in a lower stage of FIG. 9, the inclination (½α) of the weight Wx in the horizontal direction and the weight Wy in the vertical direction becomes steep. That is, the weight Wx and the weight Wy drastically change to 0 or 1 in the vicinity of a boundary of the incident angle in the horizontal direction θx=θa and the incident angle in the vertical direction θy=θb where the values are near 0.5.

Furthermore, for example, in a case where the focal distance of the on-chip lens 121c focuses on the surface of the photodiode 121e as indicated by a dotted line in the lower stage of FIG. 9, the inclination (½α) of the weight Wx in the horizontal direction and the weight Wy in the vertical direction becomes gradient. That is, the weight Wx and the weight Wy gradually change to 0 or 1 in the vicinity of the boundary of the incident angle in the horizontal direction θx=θα and the incident angle in the vertical direction θy=θb where the values are near 0.5.

For example, the focal distance of the on-chip lens 121c changes depending on a curvature of the on-chip lens 121c. Therefore, by using the on-chip lens 121c having different curvatures to change the focal distance of the on-chip lens 121c, it is possible to obtain different incident angle directivities, that is, different light-receiving sensitivity characteristics.

Therefore, the incident angle directivity of the pixel 121a may be adjusted by a combination of the range in which the photodiode 121e is shielded by the light-shielding film 121b and the curvature of the on-chip lens 121c. Note that, the curvature of the on-chip lens may be the same for all the pixels 121a of the imaging element 121 or may be different for some of the pixels 121a.

For example, as an index indicating the incident angle directivity of each pixel 121a of the imaging element 121, on the basis of the position of each pixel 121a, the shape, position, and range of the light-shielding film 121b of each pixel 121a, the curvature of the on-chip lens 121c and the like, the characteristics of the weight Wx and the weight Wy as illustrated in the graph of FIG. 9 are set for each pixel 121a. Furthermore, the incident angle of the light beam from the point light source to the pixel 121a is obtained on the basis of a positional relationship between a certain point light source on the subject surface 31 at a predetermined subject distance and a certain pixel 121a of the imaging element 121. Then, the coefficient of the pixel 121a for the point light source is obtained on the basis of the obtained incident angle and the characteristics of the weight Wx and the weight Wy of the pixel 121a.

Similarly, by obtaining the coefficient as described above for the combinations of the respective point light sources on the subject surface 31 and the respective pixels 121a of the imaging element 121, the coefficient set group of the imaging element 121 for the subject surface 31 such as the coefficient sets $\alpha 1$, $\beta 1$, and $\gamma 1$, coefficient set $\alpha 2$, $\beta 2$, and $\gamma 2$, and coefficient set $\alpha 3$, $\beta 3$, and $\gamma 3$ in equations (1) to (3) described above may be obtained.

Note that, as described later with reference to FIG. 13, when the subject distance from the subject surface 31 to the light-receiving surface of the imaging element 121 is different, the incident angle of the light beam on the imaging element 121 from each point light source of the subject surface 31 is different, so that a different coefficient set group is required for each subject distance.

Furthermore, even on the subject surface 31 at the same subject distance, if the number and arrangement of the point light sources to be set are different, the incident angles of the light beams on the imaging element 121 from the respective point light sources are different. Therefore, there is a case where a plurality of coefficient set groups is required for the subject surface 31 at the same subject distance. Furthermore, the incident angle directivity of each pixel 121a needs to be set such that independence of the simultaneous equations described above may be secured.

<Difference Between On-Chip Lens and Imaging Lens>

In the imaging device 101 of the present disclosure, the imaging element 121 has a configuration in which an optical block including the imaging lens or the pinhole is not required, but as described above, the on-chip lens 121c is provided. Here, the on-chip lens 121c and the imaging lens have different physical actions.

Figure 10:
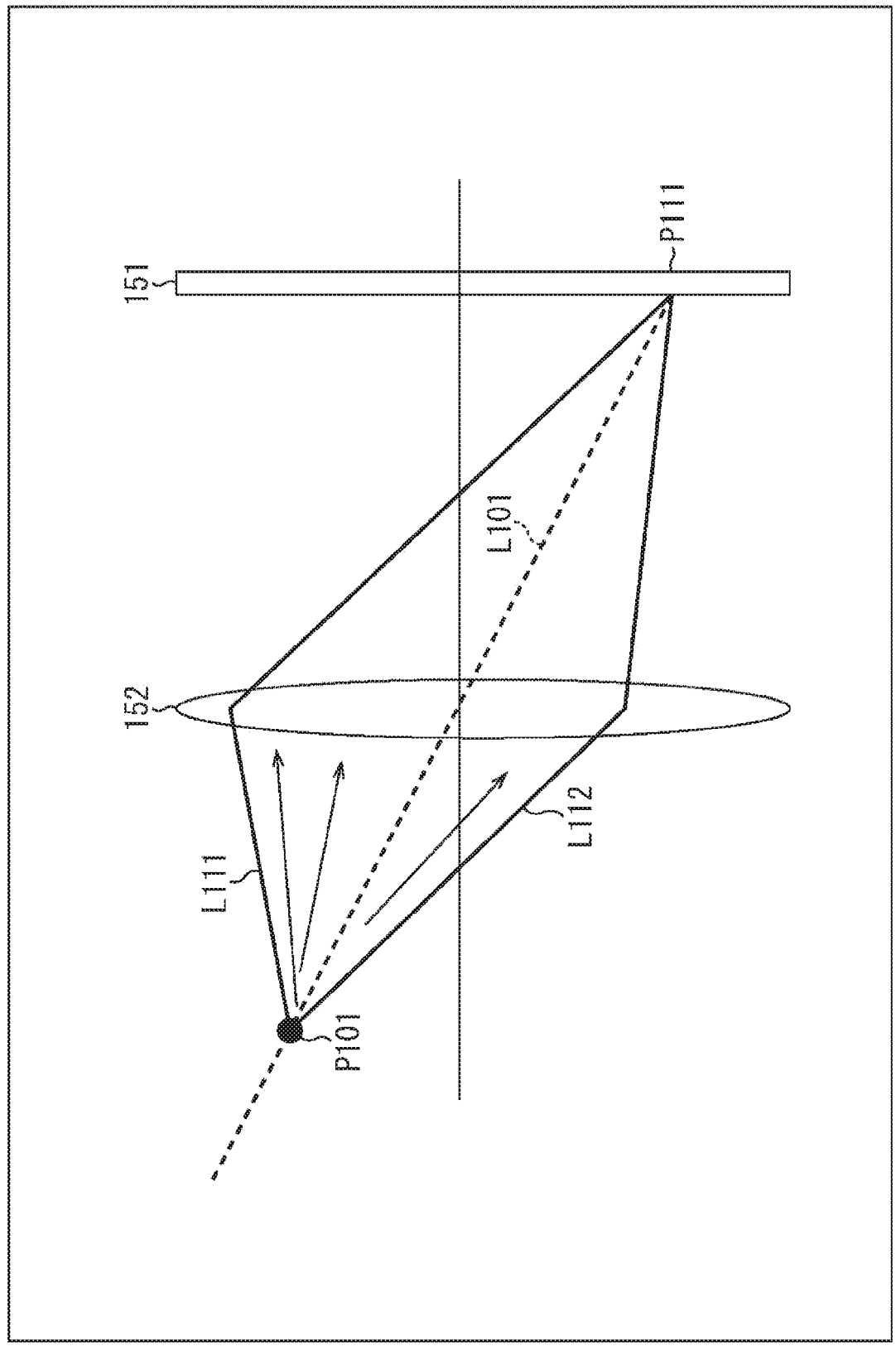
FIG. 10 is a view for illustrating a difference between the on-chip lens and an imaging lens.

For example, as illustrated in FIG. 10, light incident on an imaging lens 152 out of diffused light emitted from a point light source P101 is condensed at a pixel position P111 on the imaging element 151. That is, the imaging lens 152 is designed to condense the diffused light incident at different angles from the point light source P101 at the pixel position P111 to form an image of the point light source P101. The pixel position P111 is specified by a principal light beam L101 passing through the point light source P101 and the center of the imaging lens 152. [0155]

Figure 11:
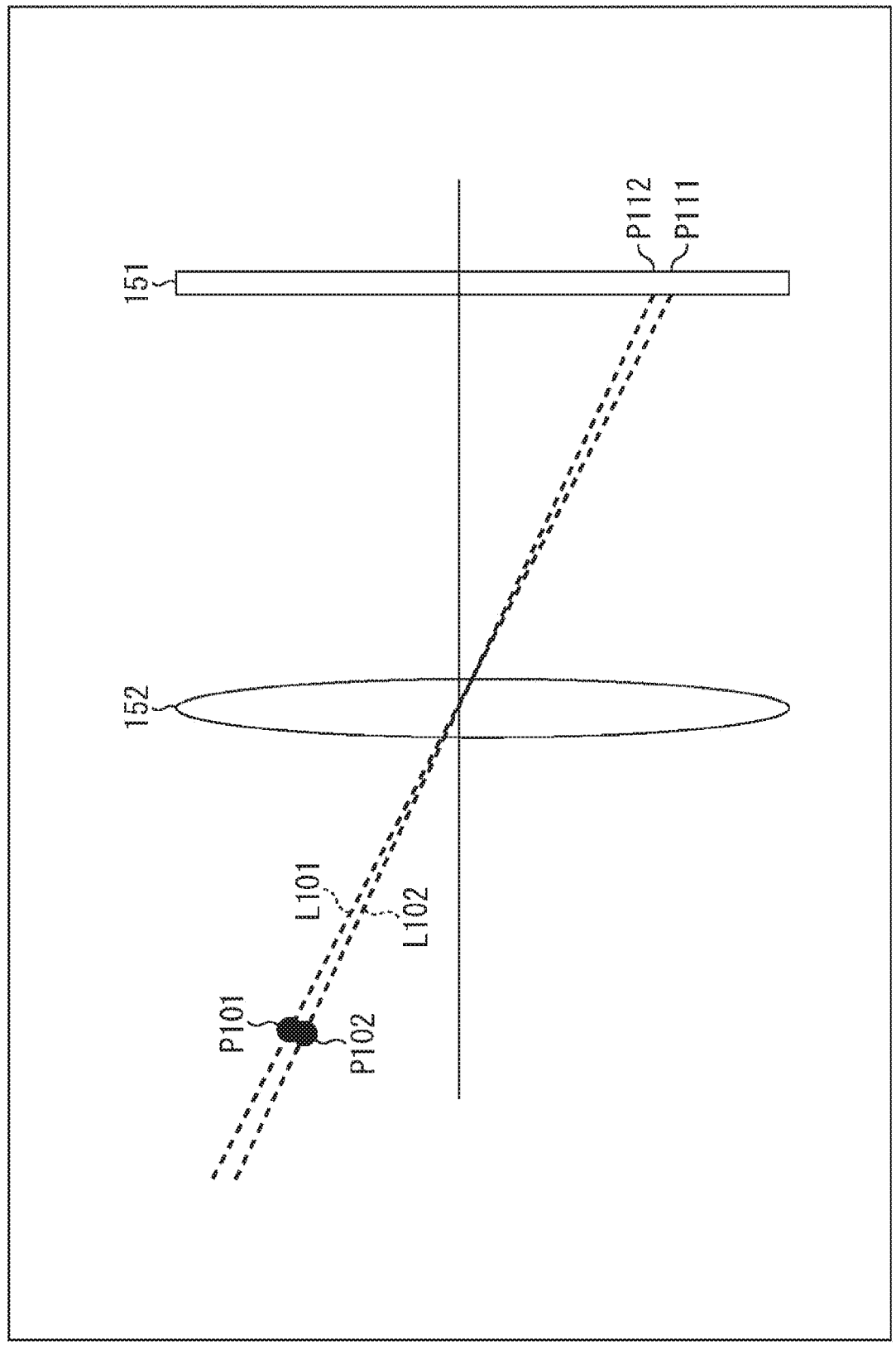
FIG. 11 is a view for illustrating a difference between the on-chip lens and the imaging lens.

Furthermore, for example, as illustrated in FIG. 11, the light incident on the imaging lens 152 out of the diffused light emitted from a point light source P102 different from the point light source P101 is condensed at a pixel position P112 different from the pixel position P111 on the imaging element 151. That is, the imaging lens 152 is designed to condense the diffused light incident at different angles from the point light source P102 at the pixel position P112 to form an image of the point light source P102. The pixel position P112 is specified by a principal light beam L102 passing through the point light source P102 and the center of the imaging lens 152.

In this manner, the imaging lens 152 forms the images of the point light sources P101 and P102 having the different principal light beams at the different pixel positions P111 and P112 on the imaging element 151, respectively.

Figure 12:
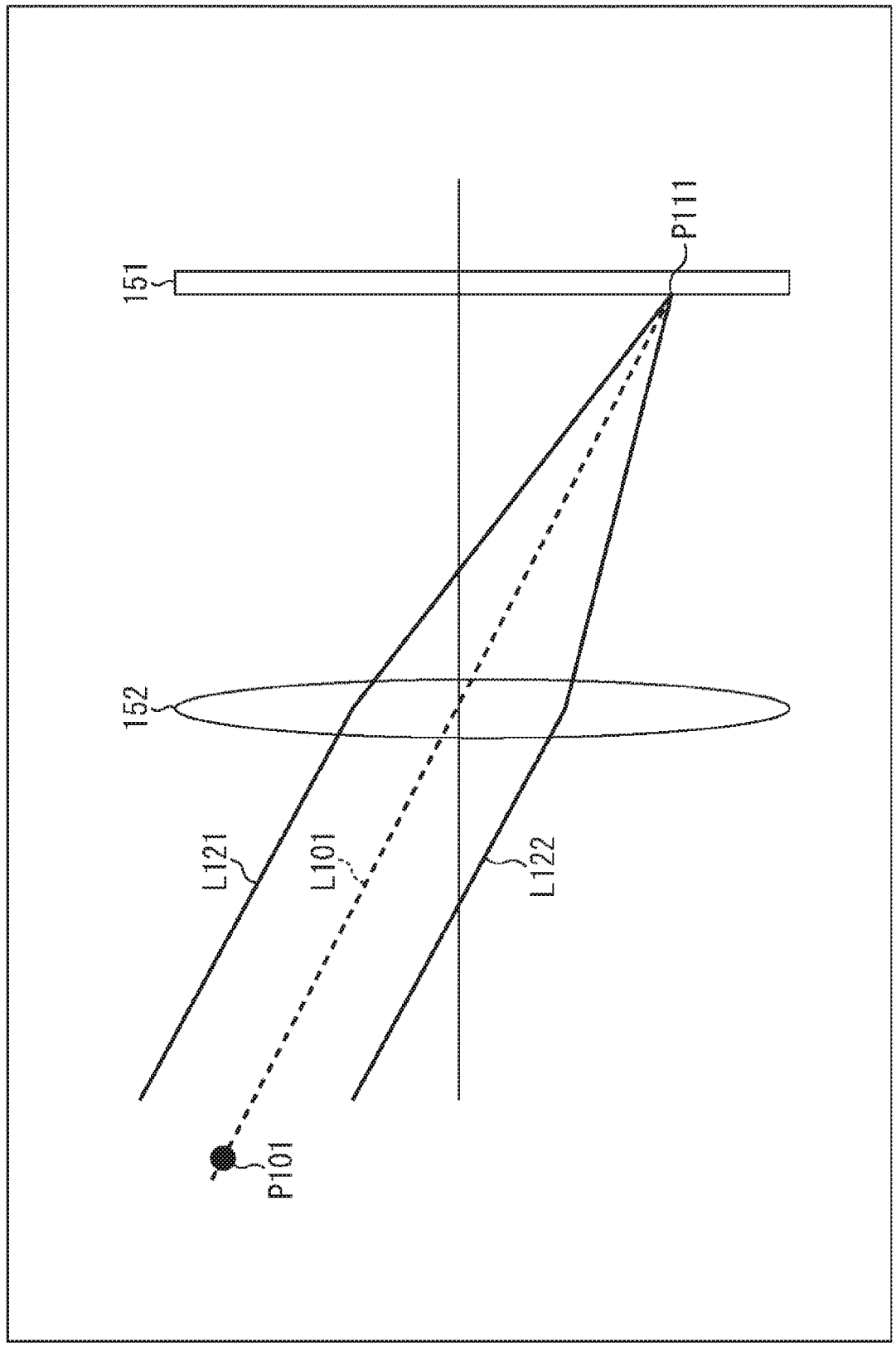
FIG. 12 is a view for illustrating a difference between the on-chip lens and the imaging lens.

Moreover, as illustrated in FIG. 12, in a case where the point light source P101 is present at infinity, a part of the diffused light emitted from the point light source P101 is incident on the imaging lens 152 as parallel light parallel to the principal light beam L101. For example, the parallel light including light beams between the light beams L121 and L122 parallel to the principal light beam L101 is incident on the imaging lens 152. Then, the parallel light incident on the imaging lens 152 is condensed at the pixel position P111 on the imaging element 151. That is, the imaging lens 152 is designed to condense the parallel light from the point light source P101 present at infinity at the pixel position P111 to form the image of the point light source P101.

Therefore, the imaging lens 152 has a condensing function to allow the diffused light from the point light source having a principal light beam incident angle 61 to be incident on a pixel (pixel output unit) P1 and allow the diffused light from the point light source having a principal light beam incident angle 62 different from the principal light beam incident angle 61 to be incident on a pixel (pixel output unit) P2 different from the pixel P1, for example. That is, the imaging lens 152 has the condensing function of allowing the diffused light from the light sources having the different principal light beam incident angles to be incident on a plurality of adjacent pixels (pixel output units). However, for example, the light beams from the point light sources close to each other or the point light sources that are present at infinity and are substantially close to each other might be incident on the same pixel (pixel output unit).

In contrast, for example, as described with reference to FIGS. 4 and 5, the light passing through the on-chip lens 121c is incident only on the light-receiving surface of the photodiode 121e or the photodiode 121f forming the corresponding pixel (pixel output unit). In other words, the on-chip lens 121c is provided for each pixel (pixel output unit), and condenses the incident light incident thereon on only the corresponding pixel (pixel output unit). That is, the on-chip lens 121c does not have the condensing function of allowing the light beams from the different point light sources to be incident on the different pixels (pixel output units).

Note that, in a case where the pinhole is used, a relationship between the position of each pixel (pixel output unit) and the incident angle of light is uniquely determined. Therefore, in a case of a configuration using the pinhole and the conventional imaging element, it is not possible to freely set the incident angle directivity independently for each pixel.

<Relationship Between Subject Surface and Imaging Element>

Next, a relationship of the distance between the subject surface and the imaging element 121 is described with reference to FIG. 13.

Figure 13:
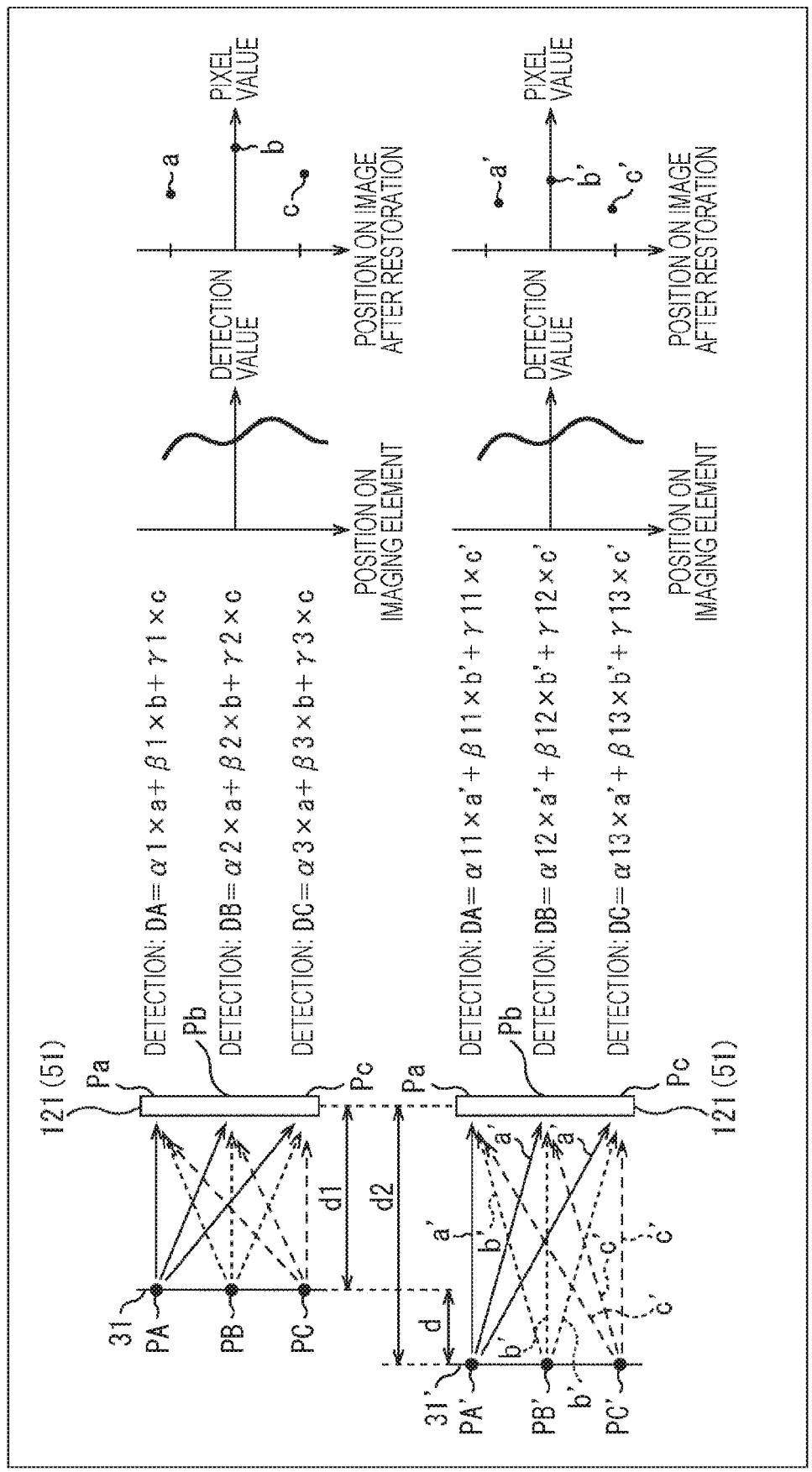
FIG. 13 is a view for illustrating a relationship between a subject distance and a coefficient indicating the incident angle directivity.

Note that, as illustrated in an upper left part of FIG. 13, in a case where a subject distance between the imaging element 121 (similar to the imaging element 51 in FIG. 1) and the subject surface 31 is a distance d1, the detection signal levels DA, DB, and DC in the pixels Pc, Pb, and Pa on the imaging element 121 are expressed by the same equations as equations (1) to (3) described above.

$$DA = \alpha1 \times a + \beta1 \times b + \gamma1 \times c \quad (1)$$

$$DB = \alpha2 \times a + \beta2 \times b + \gamma2 \times c \quad (2)$$

$$DC = \alpha3 \times a + \beta3 \times b + \gamma3 \times c \quad (3)$$

Furthermore, as illustrated in a lower left part of FIG. 13, also in a case where a subject surface 31' at a subject distance d2 from the imaging element 121 larger than the distance d1 by d, that is, the subject surface 31' on a back side of the subject surface 31 as seen from the imaging element 121 is considered, the detection signal levels in the pixels Pc, Pb, and Pa on the imaging element 121 are similar at the detection signal levels DA, DB, and DC as illustrated in a central portion in the lower stage of FIG. 13.

However, in this case, light beams of light intensities a', b', and c' from point light sources PA', PB', and PC' on the subject surface 31' are received by the respective pixels of the imaging element 121. Furthermore, since the incident angles of the light beams of the light intensities a', b', and c' on the imaging element 121 are different (change), different coefficient set groups are required. Accordingly, the detection signal levels DA, DB, and DC in the pixels Pa, Pb, and Pc, respectively, are expressed by, for example, following equations (4) to (6).

$$DA = \alpha11 \times a' + \beta11 \times b' + \gamma11 \times c' \quad (4)$$

$$DB = \alpha12 \times a' + \beta12 \times b' + \gamma12 \times c' \quad (5)$$

$$DC = \alpha13 \times a' + \beta13 \times b' + \gamma13 \times c' \quad (6)$$

Here, the coefficient set group including the coefficient sets $\alpha11$, $\beta11$, and $\gamma11$, coefficient sets $\alpha12$, $\beta12$, and $\gamma12$, and coefficient sets $\alpha13$, $\beta13$, and $\gamma13$ is the coefficient set group for the subject surface 31' corresponding to the coefficient sets $\alpha1$, $\beta1$, and $\gamma1$, coefficient sets $\alpha2$, $\beta2$, and $\gamma2$, and coefficient sets $\alpha3$, $\beta3$, and $\gamma3$ for the subject surface 31.

Accordingly, by solving the simultaneous equations including equations (4) to (6) using the coefficient set groups $\alpha11$, $\beta11$, $\gamma11$, $\alpha12$, $\beta12$, $\gamma12$, $\alpha13$, $\beta13$, and $\gamma13$ set in advance, it is possible to obtain the light intensities a', b', and c' of the light beams from the point light sources PA', PB', and PC' of the subject surface 31' as illustrated in a lower right part of FIG. 13 in a manner similar to that in a case of obtaining the light intensities a, b, and c of the light beams from the point light sources PA, PB, and PC of the subject surface 31. As a result, it becomes possible to restore a restored image of the subject surface 31'.

Therefore, in the imaging device 101 in FIG. 2, by preparing the coefficient set group for each distance (subject distance) from the imaging element 121 to the subject surface in advance, creating the simultaneous equations while switching the coefficient set group for each subject distance, and solving the created simultaneous equations, it is possible to obtain the restored images of the subject surfaces at various subject distances on the basis of one detection image. For example, by imaging and recording the detection image once, and thereafter switching the coefficient set group according to the distance to the subject surface by using the recorded detection image to restore the restored image, it is possible to generate the restored image of the subject surface at an arbitrary subject distance.

Furthermore, in a case where the subject distance and an angle of view may be specified, it is also possible to generate the restored image by using the detection signal of the pixel having the incident angle directivity suitable for the imaging of the subject surface corresponding to the specified subject distance and angle of view without using all the pixels. Therefore, the restored image may be generated by using the detection signal of the pixel suitable for the imaging of the subject surface corresponding to the specified subject distance and angle of view.

Figure 14:
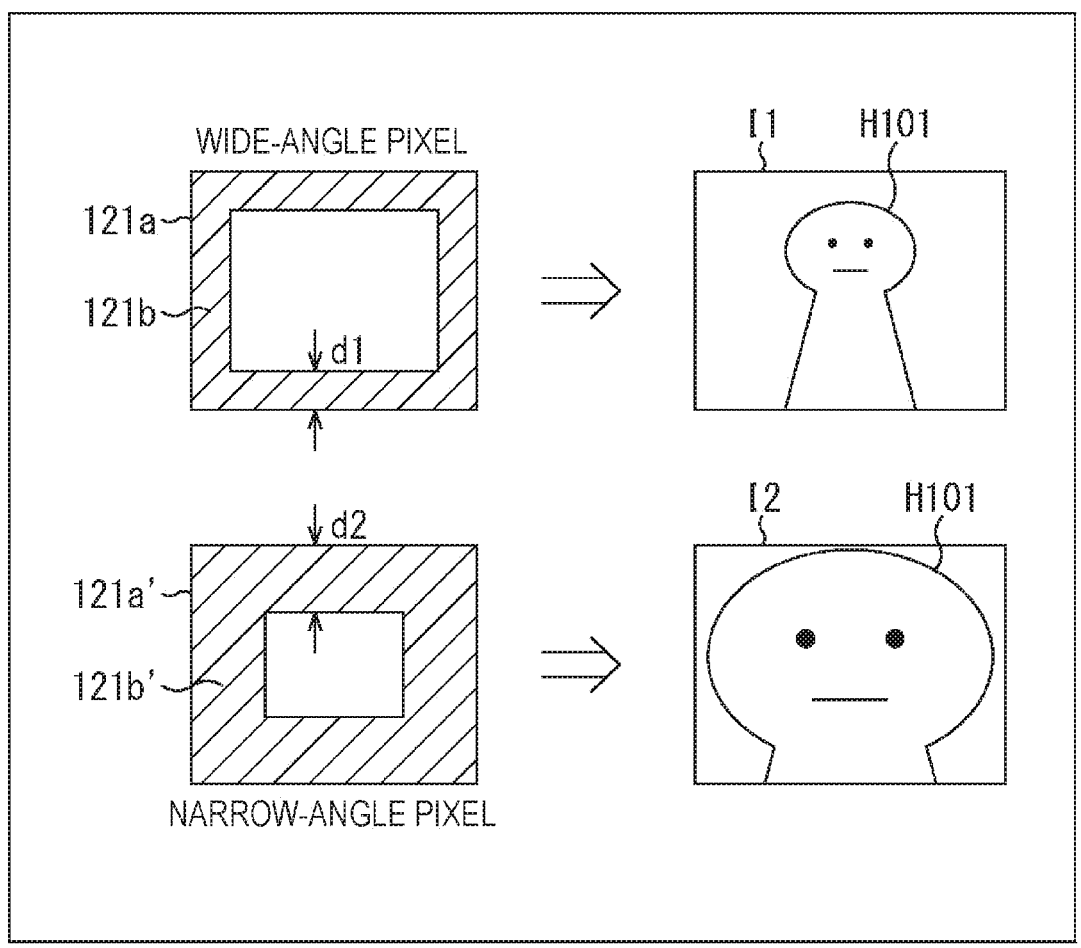
FIG. 14 is a view for illustrating a relationship between a narrow-angle pixel and a wide-angle pixel.

For example, the pixel 121a that is shielded by the light-shielding film 121b by a width d1 from each end of four sides as illustrated in an upper stage of FIG. 14 and a pixel 121a' that is shielded by the light-shielding film 121b by a width d2 (>d1) from each end of four sides as illustrated in a lower stage of FIG. 14 are considered.

Figure 15:
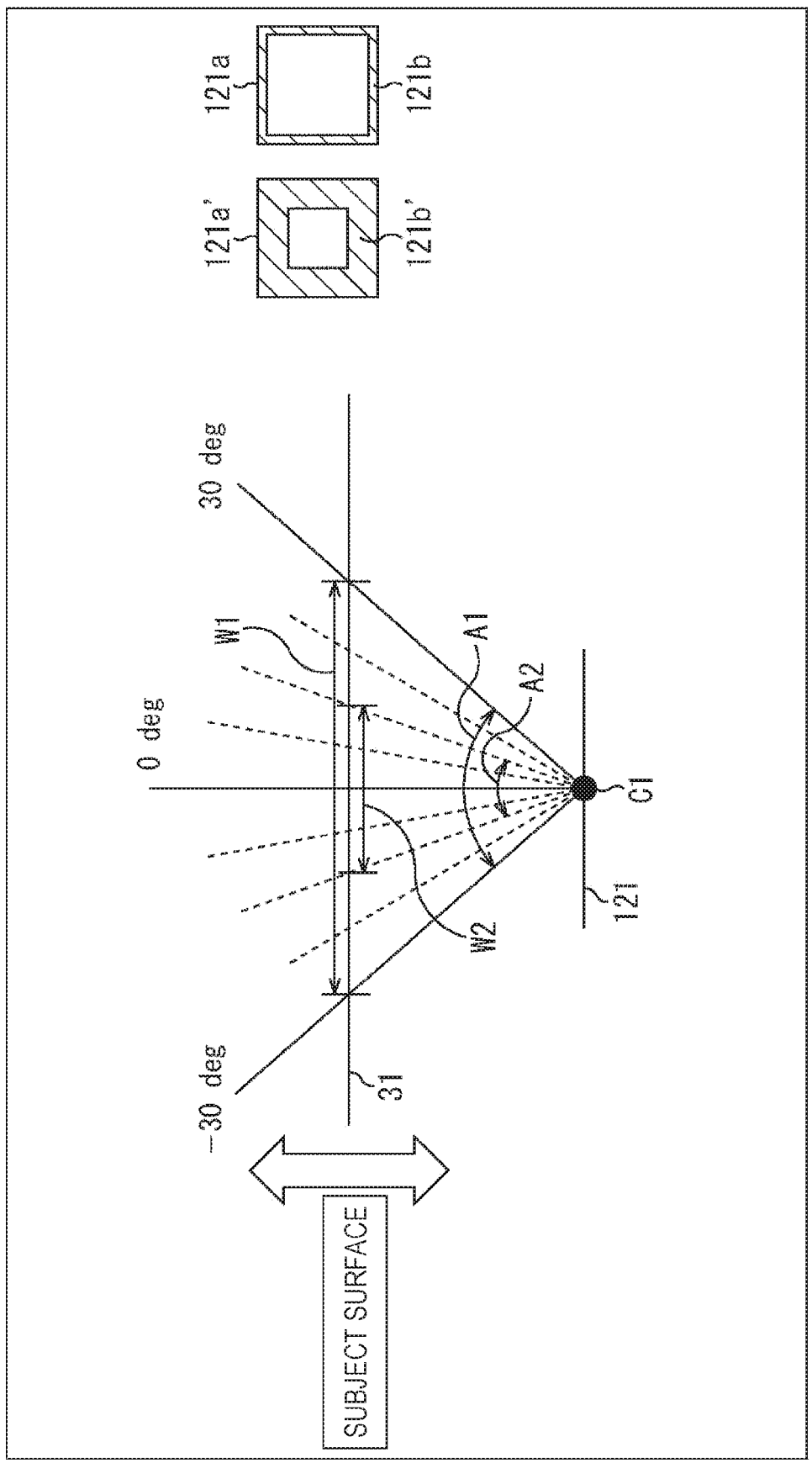
FIG. 15 is a view for illustrating a relationship between the narrow-angle pixel and the wide-angle pixel.

FIG. 15 illustrates an example of the incident angle of the incident light from the subject surface 31 to a central position C1 of the imaging element 121. Note that, FIG. 15 illustrates the example of the incident angle of the incident light in the horizontal direction, but this is substantially similar also in the vertical direction. Furthermore, in a right part of FIG. 15, the pixels 121a and 121a' in FIG. 14 are illustrated.

For example, in a case where the pixel 121a in FIG. 14 is arranged in the central position C1 of the imaging element 121, a range of the incident angle of the incident light on the pixel 121a from the subject surface 31 is an angle A1 as illustrated in a left part of FIG. 15. Accordingly, the pixel 121a may receive the incident light by a width W1 in the horizontal direction of the subject surface 31.

In contrast, in a case where the pixel 121a' in FIG. 14 is arranged in the central position C1 of the imaging element 121, the pixel 121a' has a wider light-shielding range than the pixel 121a, so that the range of the incident angle of the incident light on the pixel 121a' from the subject surface 31 is an angle A2 (<A1) as illustrated in the left part of FIG. 15. Accordingly, the pixel 121a' may receive the incident light by a width W2 (<W1) in the horizontal direction of the subject surface 31.

That is, the pixel 121a having a narrow light-shielding range is a wide-angle pixel suitable for imaging a wide range on the subject surface 31, whereas the pixel 121a' having a wide light-shielding range is a narrow-angle pixel suitable for imaging a narrow range on the subject surface 31. Note that, the wide-angle pixel and the narrow-angle pixel here are expressions that compare both the pixels 121a and 121a' in FIG. 14, and are not limited when comparing pixels of other angles of view.

Therefore, for example, the pixel 121a is used to restore an image I1 in FIG. 14. The image I1 is the image having an angle of view SQ1 corresponding to the subject width W1 including an entire person H101 as the subject in an upper stage of FIG. 16. In contrast, for example, the pixel 121a' is used to restore an image I2 in FIG. 14. The image I2 is the image having an angle of view SQ2 corresponding to the subject width W2 in which a periphery of a face of the person H101 in the upper stage of FIG. 16 is zoomed up.

Figure 16:
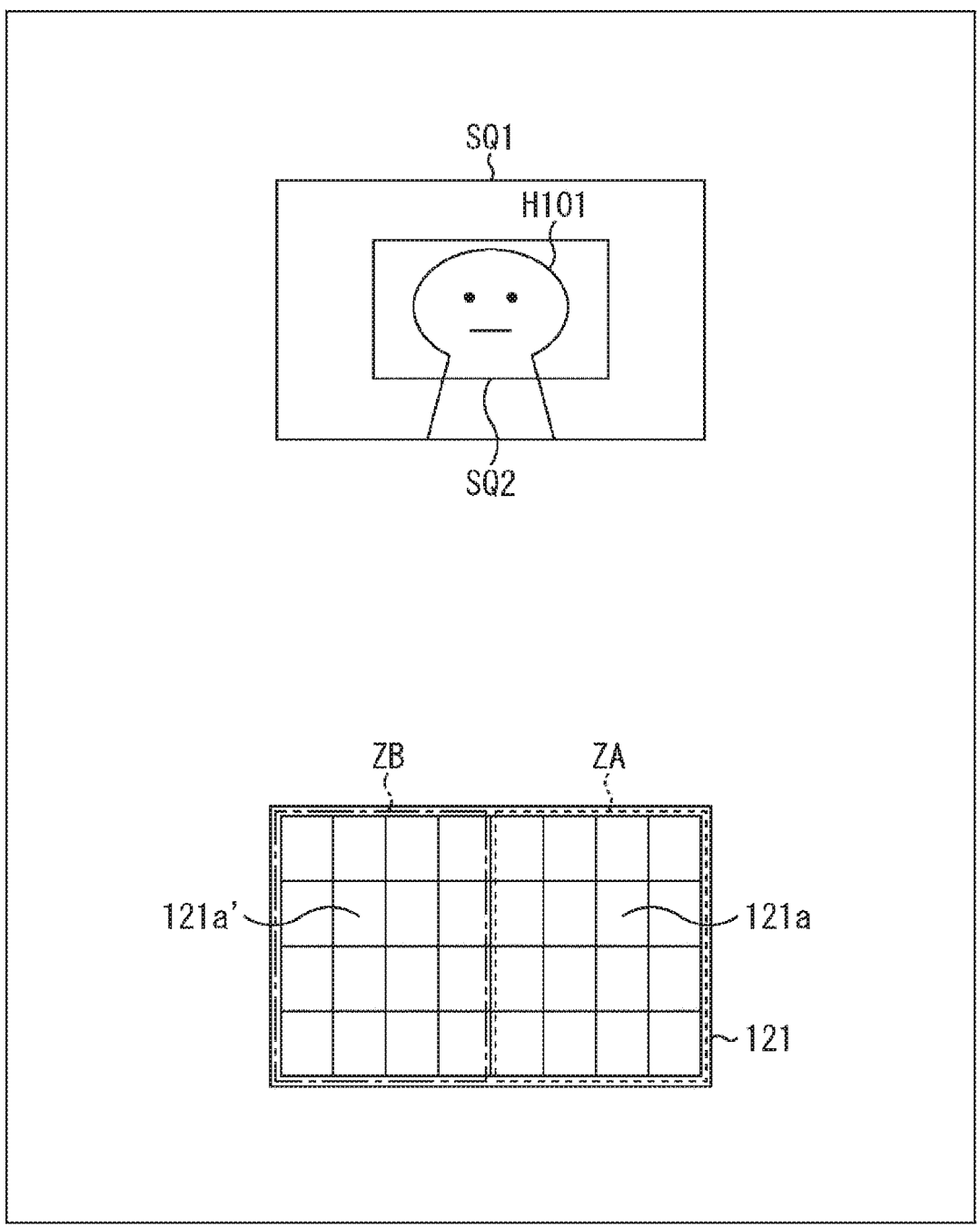
FIG. 16 is a view for illustrating a relationship between the narrow-angle pixel and the wide-angle pixel.

Furthermore, for example, as illustrated in a lower stage of FIG. 16, it is considered to arrange a predetermined number of pixels 121a in FIG. 14 in a range ZA enclosed by a dotted line of the imaging elements 121 and arrange a predetermined number of pixels 121a' in a range ZB enclosed by a dashed-dotted line. Then, for example, when restoring the image of the angle of view SQ1 corresponding to the subject width W1, the image of the angle of view SQ1 may be appropriately restored by using the detection signal of each pixel 121*a* in the range ZA. On the other hand, when restoring the image of the angle of view SQ2 corresponding to the subject width W2, the image of the angle of view SQ2 may be appropriately restored by using the detection signal of each pixel 121*a*' in the range ZB.

Note that, since the angle of view SQ2 is narrower than the angle of view SQ1, in a case of restoring the images of the angle of view SQ2 and the angle of view SQ1 with the same number of pixels, it is possible to obtain the restored image with a higher image quality when restoring the image of the angle of view SQ2 than when restoring the image of the angle of view SQ1.

That is, in a case where it is considered to obtain the restored image using the same number of pixels, it is possible to obtain the restored image with a higher image quality when restoring the image with the narrower angle of view.

Figure 17:
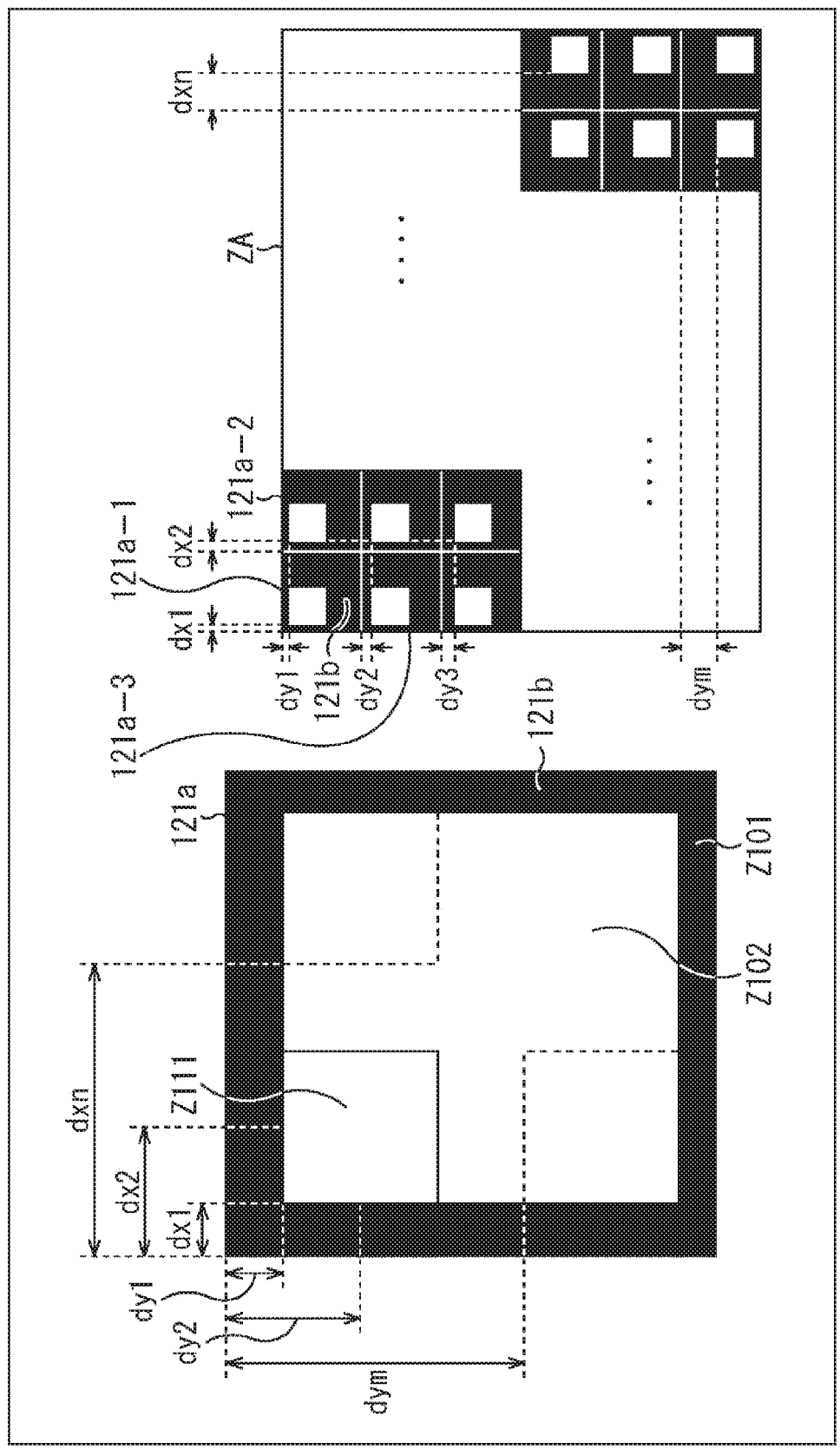
FIG. 17 is a view for illustrating a difference in image quality between the narrow-angle pixel and the wide-angle pixel.

For example, a right part of FIG. 17 illustrates a configuration example in the range ZA of the imaging element 121 in FIG. 16. A left part of FIG. 17 illustrates a configuration example of the pixel 121*a* in the range ZA.

In FIG. 17, a range in black represents the light-shielding film 121*b*, and the light-shielding range of each pixel 121*a* is determined, for example, according to rules illustrated in the left part of FIG. 17.

A main light-shielding portion 2101 in the left part of FIG. 17 (black part in the left part of FIG. 17) is a range that is shielded in common in each pixel 121*a*. Specifically, the main light-shielding portion 2101 has a range of a width dx1 from left and right sides of the pixel 121*a* into the pixel 121*a*, and a range of a height dy1 from upper and lower sides of the pixel 121*a* into the pixel 121*a*, respectively. Then, in each pixel 121*a*, a rectangular opening Z111 that is not shielded by the light-shielding film 121*b* is provided in a range Z102 inside the main light-shielding portion 2101. Accordingly, in each pixel 121*a*, a range other than the opening Z111 is shielded by the light-shielding film 121*b*.

Here, the openings Z111 of the respective pixels 121*a* are regularly arranged. Specifically, a position in the horizontal direction of the opening Z111 in each pixel 121*a* is the same in the pixels 121*a* in the same column in the vertical direction. Furthermore, a position in the vertical direction of the opening Z111 in each pixel 121*a* is the same in the pixels 121*a* in the same row in the horizontal direction.

On the other hand, the position in the horizontal direction of the opening Z111 in each pixel 121*a* is shifted at a predetermined interval according to the position in the horizontal direction of the pixel 121*a*. That is, as the position of the pixel 121*a* advances rightward, a left side of the opening 2111 moves to a position shifted rightward by widths dx1, dx2, . . . , and dxn from the left side of the pixel 121*a*. An interval between the widths dx1 and dx2, an interval between the widths dx2 and dx3, . . . , and an interval between the widths dxn−1 and dxn is a value obtained by dividing a length obtained by subtracting the width of the opening Z111 from the width in the horizontal direction of the range Z102 by the number of pixels n−1 in the horizontal direction.

Furthermore, the position in the vertical direction of the opening Z111 in each pixel 121*a* is shifted at a predetermined interval according to the position in the vertical direction of the pixel 121*a*. That is, as the position of the pixel 121*a* advances downward, an upper side of the opening Z111 moves to a position shifted downward by widths dy1, dy2, . . . , and dyn from the upper side of the pixel 121*a*. An interval between the heights dy1 and dy2, an interval between the heights dy2 and dy3, . . . , and an interval between the heights dyn−1 and dyn is a value obtained by dividing a length obtained by subtracting the height of the opening Z111 from the height in the vertical direction of the range Z102 by the number of pixels m−1 in the vertical direction.

Figure 18:
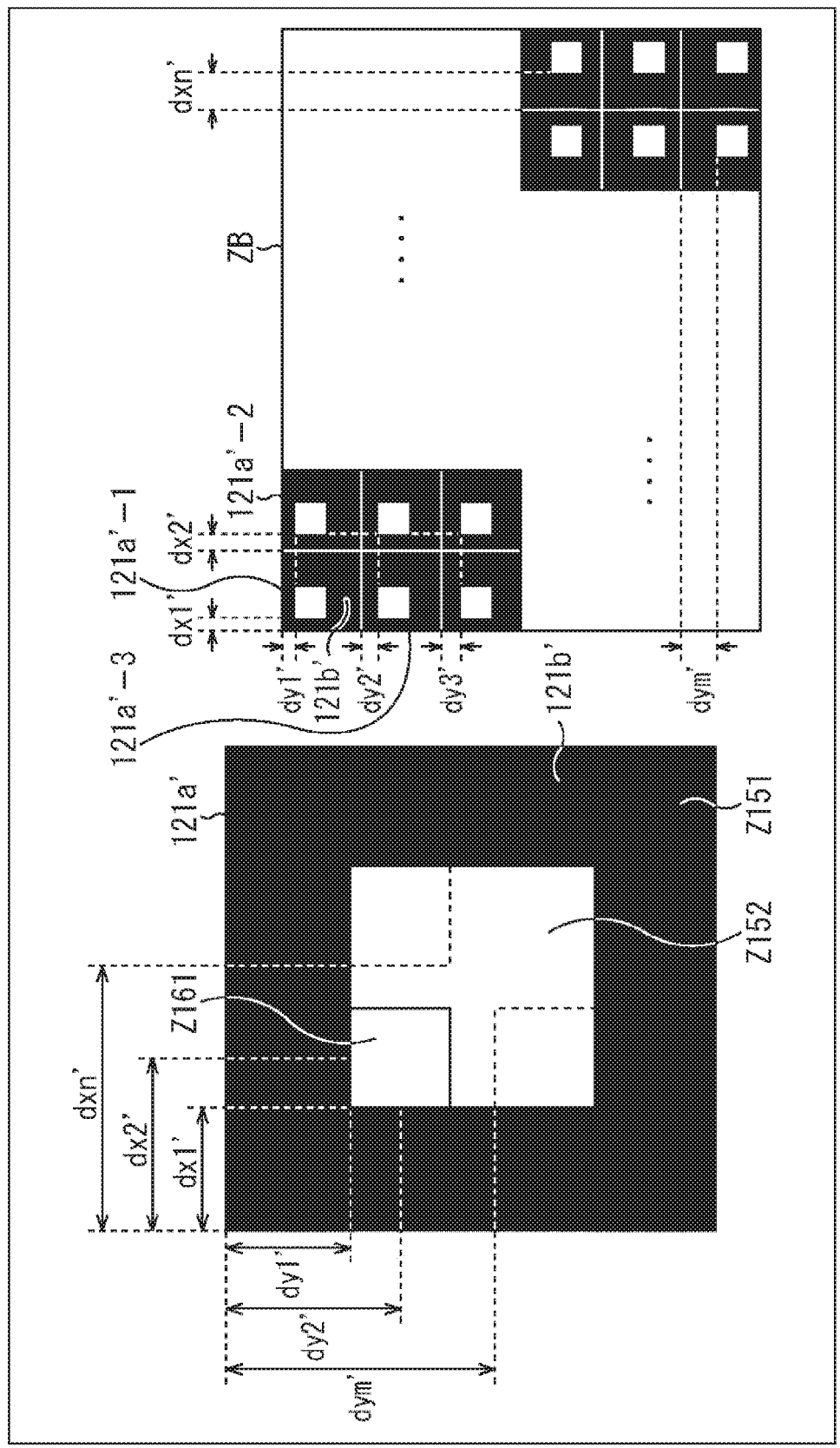
FIG. 18 is a view for illustrating a difference in image quality between the narrow-angle pixel and the wide-angle pixel.

A right part of FIG. 18 illustrates a configuration example within the range ZB of the imaging element 121 in FIG. 16. A left part of FIG. 18 illustrates a configuration example of the pixel 121*a*' in the range ZB.

In FIG. 18, a range in black represents the light-shielding film 121*b*', and the light-shielding range of each pixel 121*a*' is determined, for example, according to rules illustrated in the left part of FIG. 18.

A main light-shielding portion Z151 in the left part of FIG. 18 (black part in the left part of FIG. 18) is a range that is shielded in common in each pixel 121*a*'. Specifically, the main light-shielding portion 2151 has a range of a width dx1' from left and right sides of the pixel 121*a*' into the pixel 121*a*', and a range of a height dy1' from upper and lower sides of the pixel 121*a*' into the pixel 121*a*', respectively. Then, in each pixel 121*a*', a rectangular opening Z161 that is not shielded by the light-shielding film 121*b*' is provided in a range Z152 inside the main light-shielding portion Z151. Accordingly, in each pixel 121*a*', a range other than the opening Z161 is shielded by the light-shielding film 121*b*'.

Here, the openings Z161 of the respective pixels 121*a*' are regularly arranged in a manner similar to that of the openings Z111 of the respective pixels 121*a* in FIG. 17. Specifically, a position in the horizontal direction of the opening Z161 in each pixel 121*a*' is the same in the pixels 121*a*' in the same column in the vertical direction. Furthermore, a position in the vertical direction of the opening Z161 in each pixel 121*a*' is the same in the pixels 121*a*' in the same row in the horizontal direction.

On the other hand, the position in the horizontal direction of the opening Z161 in each pixel 121*a*' is shifted at a predetermined interval according to the position in the horizontal direction of the pixel 121*a*'. That is, as the position of the pixel 121*a*' advances rightward, a left side of the opening Z161 moves to a position shifted rightward by widths dx1', dx2', . . . , and dxn' from the left side of the pixel 121*a*'. An interval between the widths dx1' and dx2', an interval between the widths dx2' and dx3', . . . , and an interval between the widths dxn−1' and dxn' is a value obtained by dividing a length obtained by subtracting the width of the opening Z161 from the width in the horizontal direction of the range Z152 by the number of pixels n−1 in the horizontal direction.

Furthermore, the position in the vertical direction of the opening Z161 in each pixel 121*a*' is shifted at a predetermined interval according to the position in the vertical direction of the pixel 121*a*'. That is, as a position of the pixel 121*a*' advances downward, an upper side of the opening Z161 moves to a position shifted downward by widths dy1', dy2', . . . , and dyn' from the upper side of the pixel 121*a*'. An interval between the heights dy1' and dy2', an interval between the heights dy2' and dy3', . . . , and an interval between the heights dyn−1' and dyn' is a value obtained by dividing a length obtained by subtracting the height of the opening Z161 from the height in the vertical direction of the range Z152 by the number of pixels m−1 in the vertical direction.

Here, the length obtained by subtracting the width of the opening Z111 from the width in the horizontal direction of the range Z102 of the pixel 121*a* in FIG. 17 is larger than the width obtained by subtracting the width of the opening Z161 from the width in the horizontal direction of the range Z152 of the pixel 121a' in FIG. 18. Accordingly, a change interval between the widths dx1, dx2, . . . , and dxn in FIG. 17 is larger than the change interval between the widths dx1', dx2', . . . , and dxn' in FIG. 18.

Furthermore, the length obtained by subtracting the height of the opening Z111 from the height in the vertical direction of the range Z102 of the pixel 121a in FIG. 17 is larger than the length obtained by subtracting the height of the opening Z161 from the height in the vertical direction of the range Z152 of the pixel 121a' in FIG. 18. Accordingly, a change interval between the heights dy1, dy2, . . . , and dyn in FIG. 17 is larger than the change interval between the heights dy1', dy2', and dyn' in FIG. 18.

As described above, the change interval of the positions in the horizontal and vertical directions of the opening Z111 of the light-shielding film 121b of each pixel 121a in FIG. 17 is different from the change interval of the positions in the horizontal and vertical directions of the opening Z161 of the light-shielding film 121b' of each pixel 121a' in FIG. 18. Then, this difference in interval is the difference in subject resolution (angular resolution) in the restored image. That is, the change interval of the positions in the horizontal and vertical directions of the opening Z161 of the light-shielding film 121b' of each pixel 121a' in FIG. 18 is narrower than the change interval of the positions in the horizontal and vertical directions of the opening Z111 of the light-shielding film 121b of each pixel 121a in FIG. 17. Accordingly, the restored image restored by using the detection signal of each pixel 121a' in FIG. 18 has higher subject resolution and higher image quality than the restored image restored by using the detection signal of each pixel 121a in FIG. 17.

In this manner, by changing the combination of the light-shielding range of the main light-shielding portion and the opening range of the opening, the imaging element 121 including pixels having various angles of view (having various incident angle directivities) may be realized.

Note that, although the example in which the pixels 121a and the pixels 121a' are arranged separately in the range ZA and the range ZB, respectively, is described above, this is for the sake of simplicity, and the pixels 121a corresponding to different angles of view are desirably mixedly arranged in the same region.

Figure 19:
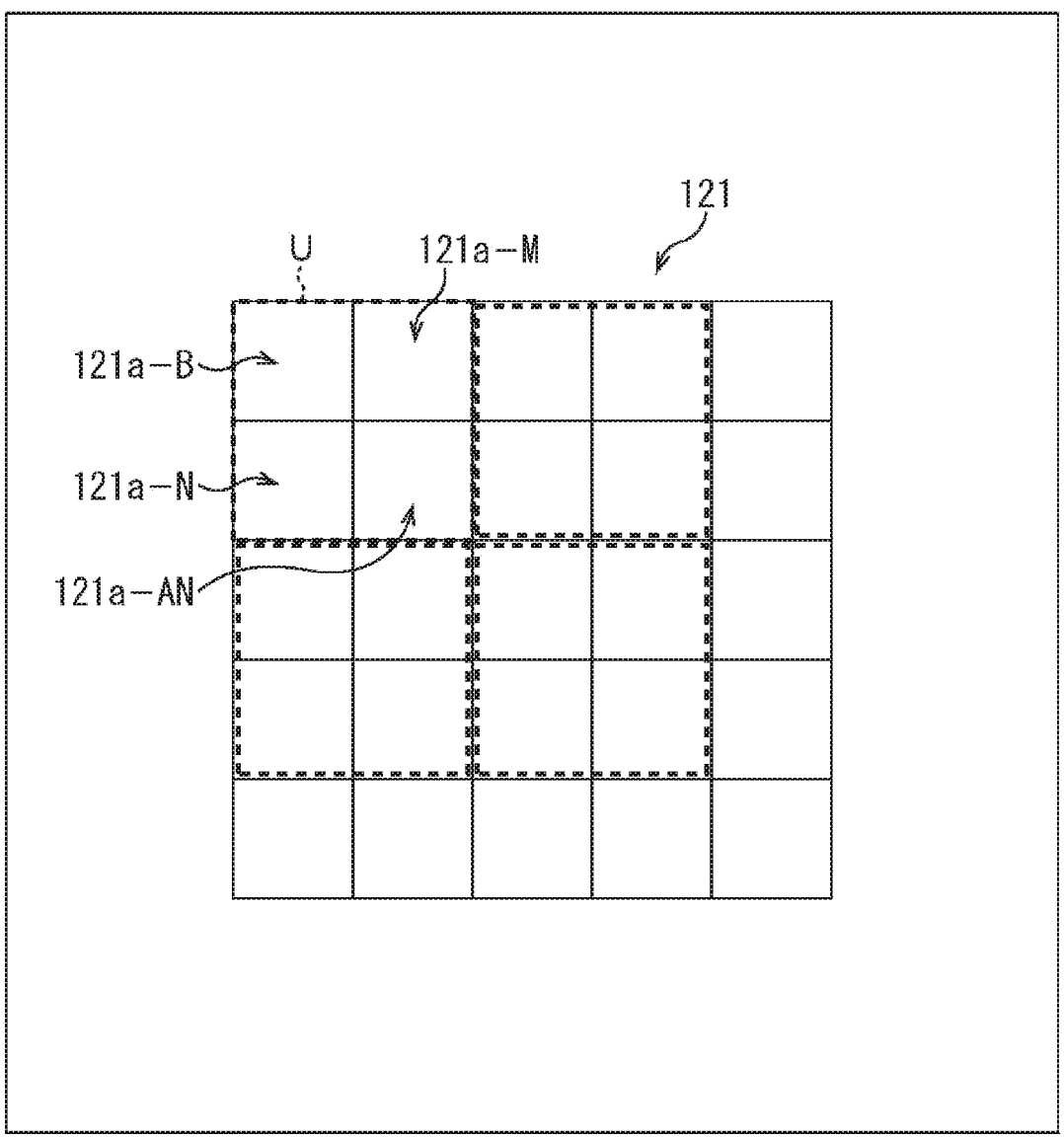
FIG. 19 is a view for illustrating an example of combining pixels of a plurality of angles of view.

For example, as illustrated in FIG. 19, four pixels each including two pixels×two pixels indicated by a dotted line are made one unit U, and each unit U includes a wide-angle pixel 121a-W, a medium-angle pixel 121a-M, a narrow-angle pixel 121a-N, and an extremely narrow-angle pixel 121a-AN.

In this case, for example, in a case where the number of all the pixels 121a is X, it becomes possible to restore the restored image using the detection images of X/4 pixels for each of the four types of view angles. At that time, four types of coefficient set groups different for each angle of view are used, and the restored images having different angles of view are restored by four different simultaneous equations.

Therefore, by restoring the restored image using the detection image obtained from the pixel suitable for imaging the angle of view of the restored image to be restored, it becomes possible to obtain an appropriate restored image corresponding to the four types of angles of view.

Furthermore, it is also possible to interpolate to generate images of the angle of view between the four types of angles of view and the angle of view around the same from the images of the four types of angles of view, and realize pseudo optical zooming by seamlessly generating the images of the various angles of view.

Note that, for example, in a case where the image having the wide angle of view is obtained as the restored image, all the wide-angle pixels may be used, or a part of the wide-angle pixels may be used. Furthermore, for example, in a case where the image having the narrow angle of view is obtained as the restored image, all the narrow-angle pixels may be used, or a part of the narrow-angle pixels may be used.

<Imaging Processing by Imaging Device 101>

Next, imaging processing by the imaging device 101 in FIG. 2 is described with reference to a flowchart in FIG. 20.

At step S1, the imaging element 121 images the subject. Therefore, the detection signal indicating the detection signal level corresponding to the amount of incident light from the subject is output from each pixel 121a of the imaging element 121 having different incident angle directivities, and the imaging element 121 supplies the detection image including the detection signal of each pixel 121a to the restoration unit 122.

At step S2, the restoration unit 122 obtains the coefficient used for the image restoration. Specifically, the restoration unit 122 sets the distance to the subject surface 31 to be restored, that is, the subject distance. Note that, an arbitrary method may be adopted as a method of setting the subject distance. For example, the restoration unit 122 sets the subject distance input by the user via the input unit 124 or the subject distance detected by the detection unit 125 as the distance to the subject surface 31 to be restored.

Next, the restoration unit 122 reads the coefficient set group associated with the set subject distance from the storage unit 128.

At step S3, the restoration unit 122 restores the image using the detection image and the coefficient. Specifically, the restoration unit 122 uses the detection signal level of each pixel of the detection image and the coefficient set group obtained in the processing at step S2 to create the simultaneous equations described with reference to equations (1) to (3) or equations (4) to (6) described above. Next, the restoration unit 122 calculates the light intensity of each point light source on the subject surface 31 corresponding to the set subject distance by solving the created simultaneous equations. Then, by arranging the pixels having the pixel values according to the calculated light intensities according to the arrangement of the respective point light sources on the subject surface 31, the restoration unit 122 generates the restored image formed as the image of the subject.

At step S4, the imaging device 101 performs various types of processing on the restored image. For example, the restoration unit 122 performs demosaic processing, γ correction, white balance adjustment, conversion processing to a predetermined compression format and the like on the restored image as necessary. Furthermore, the restoration unit 122 supplies the restored image to the display unit 127 and allows the same to display the image, supplies the restored image to the recording/playback unit 129 and allows the same to record the image on the recording medium 130, or outputs the restored image to another device via the communication unit 131 as necessary, for example.

Thereafter, the imaging processing ends.

Note that, in the description above, the example of restoring the restored image from the detection image using the imaging element 121 and the coefficient set group associated with the subject distance is described; however, for example, it is also possible to further prepare the coefficient set group corresponding to the angle of view of the restored image as described above in addition to the subject distance and restore the restored image by using the coefficient set group according to the subject distance and the angle of view. Note that, the resolution with respect to the subject distance and the angle of view depends on the number of prepared coefficient set groups.

Figure 20:
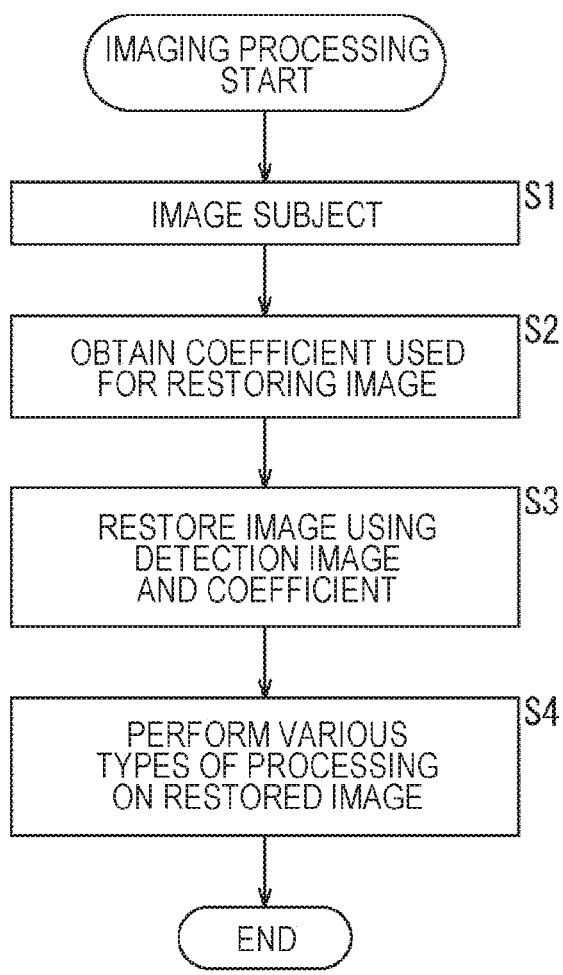

Furthermore, in the description of the processing using the flowchart in FIG. 20, the example of using the detection signals of all the pixels included in the detection image is described; however, it is also possible to generate the detection image including the detection signal of the pixel having the incident angle directivity corresponding to the specified subject distance and angle of view among the pixels forming the imaging element 121 and restore the restored image by using the same. By such processing, it becomes possible to restore the restored image by the detection image suitable for the subject distance and the angle of view of the restored image to be obtained, and restoration accuracy and image quality of the restored image are improved. That is, in a case where the image corresponding to the specified subject distance and angle of view is the image corresponding to the angle of view SQ1 in FIG. 16, for example, by selecting the pixels 121a having the incident angle directivity corresponding to the angle of view SQ1 and restoring the restored image with the detection image obtained from them, it becomes possible to restore the image of the angle of view SQ1 with high accuracy.

By the processing described above, it becomes possible to realize the imaging device 101 having the imaging element 121 in which each pixel has incident angle directivity as an indispensable component.

As a result, the imaging lens, the pinhole, and the optical filter disclosed in the above-described Patent Document and the like are not necessary, so that the degree of freedom in designing the device may be improved, and an optical element formed separately from the imaging element 121 and assumed to be mounted together with the imaging element 121 in a stage of forming the imaging device becomes not necessary, so that the device may be made compact in the incident angle of the incident light and a manufacturing cost may be decreased. Furthermore, a lens corresponding to an imaging lens for forming an optical image such as a focus lens becomes unnecessary. However, a zoom lens that changes magnification may be provided.

Note that, in the description above, the processing of restoring the restored image corresponding to the predetermined subject distance immediately after the detection image is captured is described; however, for example, it is also possible to restore the restored image by using the detection image at a desired timing after recording the detection image on the recording medium 130 or output the same to another device via the communication unit 131 without performing the restoring processing immediately. In this case, the restoration of the restored image may be performed by the imaging device 101 or another device. In this case, for example, it is possible to obtain the restored image for the subject surface of arbitrary subject distance and angle of view by obtaining the restored image by solving the simultaneous equations created by using the coefficient set group according to arbitrary subject distance and angle of view, thereby realizing refocusing and the like.

For example, in a case where the imaging device including the imaging lens and the conventional imaging element is used, in order to obtain the image with various focal distances and angles of view, it is necessary to image while variously changing the focal distance and angle of view. On the other hand, in the imaging device 101, it is possible to restore the restored image of arbitrary subject distance and angle of view by switching the coefficient set group in this manner, so that processing of repeatedly imaging while variously changing the focal distance (that is, the subject distance) and the angle of view is not necessary.

In this case, for example, the user may also obtain the restored image of the desired subject distance and angle of view while allowing the display unit 127 to display the restored images that are restored while changing the coefficient set groups corresponding to the different subject distances and angles of view.

Note that, in a case of recording the detection image, when the subject distance and angle of view at the time of restoration are determined, the metadata used for restoration may be associated with the detection image. For example, by assigning the metadata to image data including the detection image, assigning the same ID to the detection image and the metadata, or recording the detection image and the metadata on the same recording medium 130, the detection image and the metadata are associated with each other.

Note that, in a case where the same ID is assigned to the detection image and the metadata, it is possible to record the detection image and the metadata on different recording media or individually output them from the imaging device 101.

Furthermore, the metadata may include the coefficient set group used for restoration or not. In the latter case, for example, the subject distance and angle of view at the time of restoration are included in the metadata, and the coefficient set group corresponding to the subject distance and angle of view is obtained from the storage unit 128 and the like at the time of restoration.

Moreover, in a case where the restored image is restored immediately at the time of imaging, for example, an image to be recorded or externally output may be selected from the detection image and the restored image. For example, it is possible to record or externally output both the images or record or externally output only one of the images.

Furthermore, in a case of capturing a moving image also, it is possible to select whether or not to restore the restored image at the time of imaging, or to select the image to be recorded or externally output. For example, it is possible to immediately restore the restored image of each frame, and record or externally output both or one of the restored image and the detection image before restoration while capturing the moving image. In this case, it is also possible to display the restored image of each frame as a through image at the time of imaging. Alternatively, for example, it is possible to record or externally output the detection image of each frame without performing restoration processing at the time of imaging.

Moreover, when capturing the moving image, for example, it is possible to select whether or not to restore the restored image, and select the image to be recorded or externally output for each frame. For example, it is possible to switch whether or not to restore the restored image for each frame. Furthermore, for example, it is possible to individually switch whether or not to record the detection image and whether or not to record the restored image for each frame. Furthermore, for example, it is also possible to record the detection images of all the frames while assigning the metadata to the detection image of a useful frame that may be used later.

Furthermore, it is also possible to realize an autofocus function as is the case with the imaging device using the imaging lens. For example, the autofocus function may be realized by determining the optimum subject distance by a hill-climbing method similar to a contrast auto focus (AF) method on the basis of the restored image.

Moreover, it is possible to generate the restored image using the detection image captured by the imaging element 121 having incident angle directivities in a pixel unit as compared to the imaging device and the like including the optical filter disclosed in above-described Patent Document and the like and the conventional imaging element, so that it becomes possible to realize an increase in pixels or obtain the restored image with high resolution and high angular resolution. In contrast, in the imaging device including the optical filter and the conventional imaging element, it is difficult to realize the high resolution restored image and the like because it is difficult to miniaturize the optical filter even if the pixels are miniaturized.

Furthermore, in the imaging device 101 of the present disclosure, the imaging element 121 is the indispensable configuration, and does not require, for example, the optical filter and the like disclosed in Patent Document and the like described above, so that the optical filter is not bent by heat due to a high-temperature usage environment, and it is possible to realize the imaging device with high environmental resistance.

Moreover, the imaging device 101 of the present disclosure does not require the imaging lens, pinhole, and optical filter disclosed in Patent Document and the like described above, so that it becomes possible to improve the degree of freedom in designing a configuration having an imaging function.

<Method of Reducing Processing Load>

By the way, in a case where the light-shielding range (that is, the incident angle directivity) of the light-shielding film 121b of each pixel 121a of the imaging element 121 has randomness, as disorder of a difference in the light-shielding range is larger, a load of the processing by the restoration unit 122 is larger. Therefore, it is possible to reduce the disorder, thereby reducing the processing road by making a part of the change in the light-shielding range of the light-shielding film 121b of each pixel 121a regular.

For example, the L-shaped light-shielding film 121b obtained by combining the longitudinal band-type and the lateral band-type is formed, and the lateral band-type light-shielding films 121b having the same width are combined in a predetermined column direction and the longitudinal band-type light-shielding films 121b having the same height are combined in a predetermined row direction. Therefore, the light-shielding range of the light-shielding film 121b of each pixel 121a changes randomly in a pixel unit while having regularity in the column direction and the row direction. As a result, a difference in the light-shielding range of the light-shielding film 121b of each pixel 121a, that is, the disorder in the difference of the incident angle directivity may be reduced, and the processing load of the restoration unit 122 may be reduced.

Figure 21:
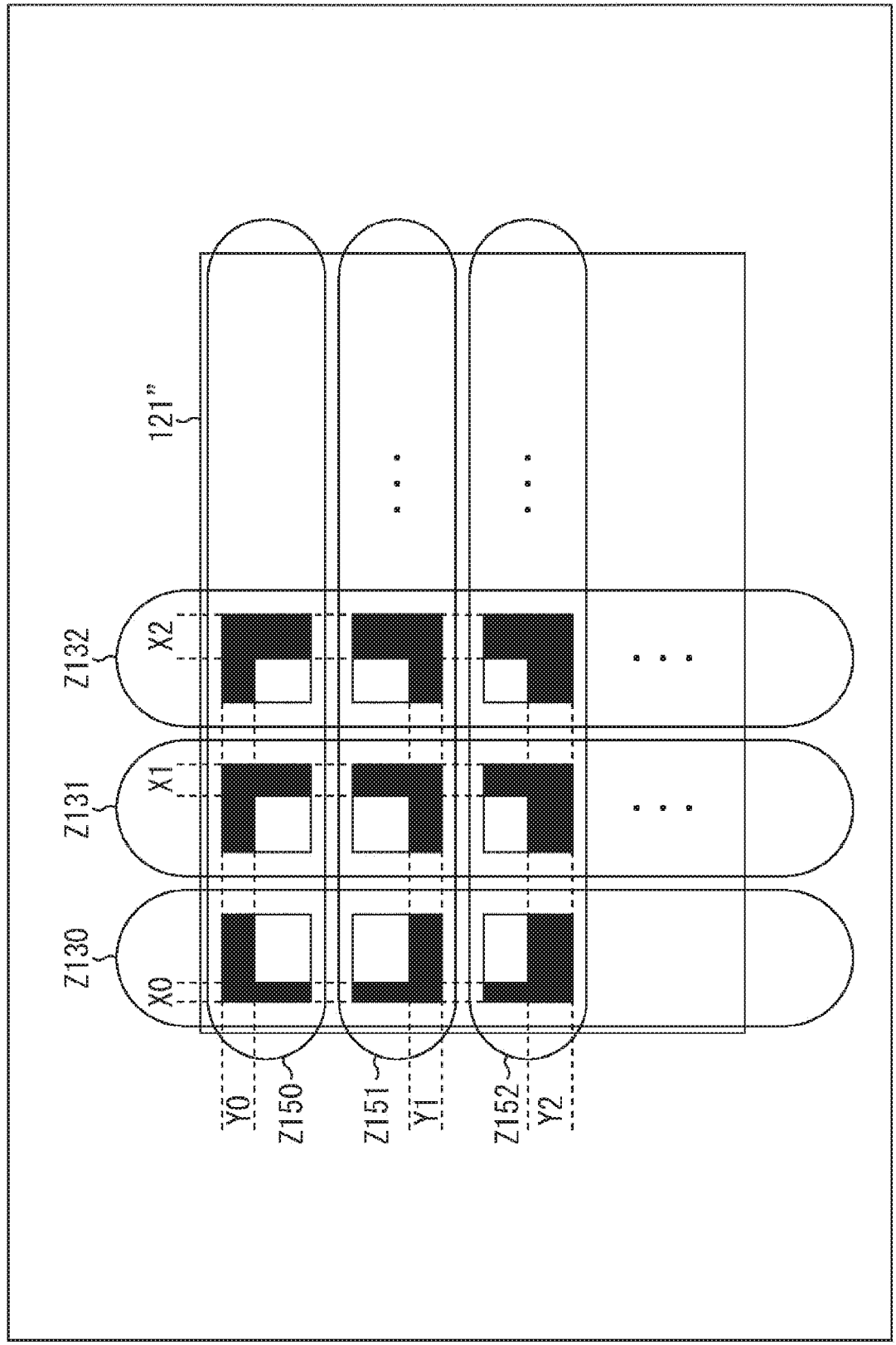
FIG. 21 is a view for illustrating a method of reducing a processing load.

Specifically, for example, as illustrated in an imaging element 121" in FIG. 21, lateral band-type light-shielding films 121b having the same width X0 are used for the pixels in the same column indicated by a range Z130, and the longitudinal band-type light-shielding film 121b having the same height Y0 are used for the pixels in the same row indicated by a range Z150. As a result, for the pixel 121a specified by each row and column, the L-shaped light-shielding film 121b obtained by combining them is used.

Similarly, the lateral band-type light-shielding film 121b having the same width X1 are used for the pixels in the same column indicated by a range Z131 adjacent to the range Z130, and the longitudinal band-type light-shielding film 121b having the same height Y1 are used for the pixels in the same row indicated by a range Z151 adjacent to the range Z150. As a result, for the pixel 121a specified by each row and column, the L-shaped light-shielding film 121b obtained by combining them is used.

Moreover, the lateral band-type light-shielding film 121b having the same width X2 are used for the pixels in the same column indicated by a range Z132 adjacent to the range Z131, and the longitudinal band-type light-shielding film 121b having the same height Y2 are used for the pixels in the same row indicated by a range Z152 adjacent to the range Z151. As a result, for the pixel 121a specified by each row and column, the L-shaped light-shielding film 121b obtained by combining them is used.

By doing so, it is possible to set the range of the light-shielding film to different values in a pixel unit while allowing the width and position in the horizontal direction and the height and the position in the vertical direction of the light-shielding film 121b to have regularity, so that it is possible to control the disorder in the change in the incident angle directivity. As a result, it becomes possible to reduce patterns of the coefficient sets and reduce the processing load of arithmetic processing in the restoration unit 122.

Figure 22:
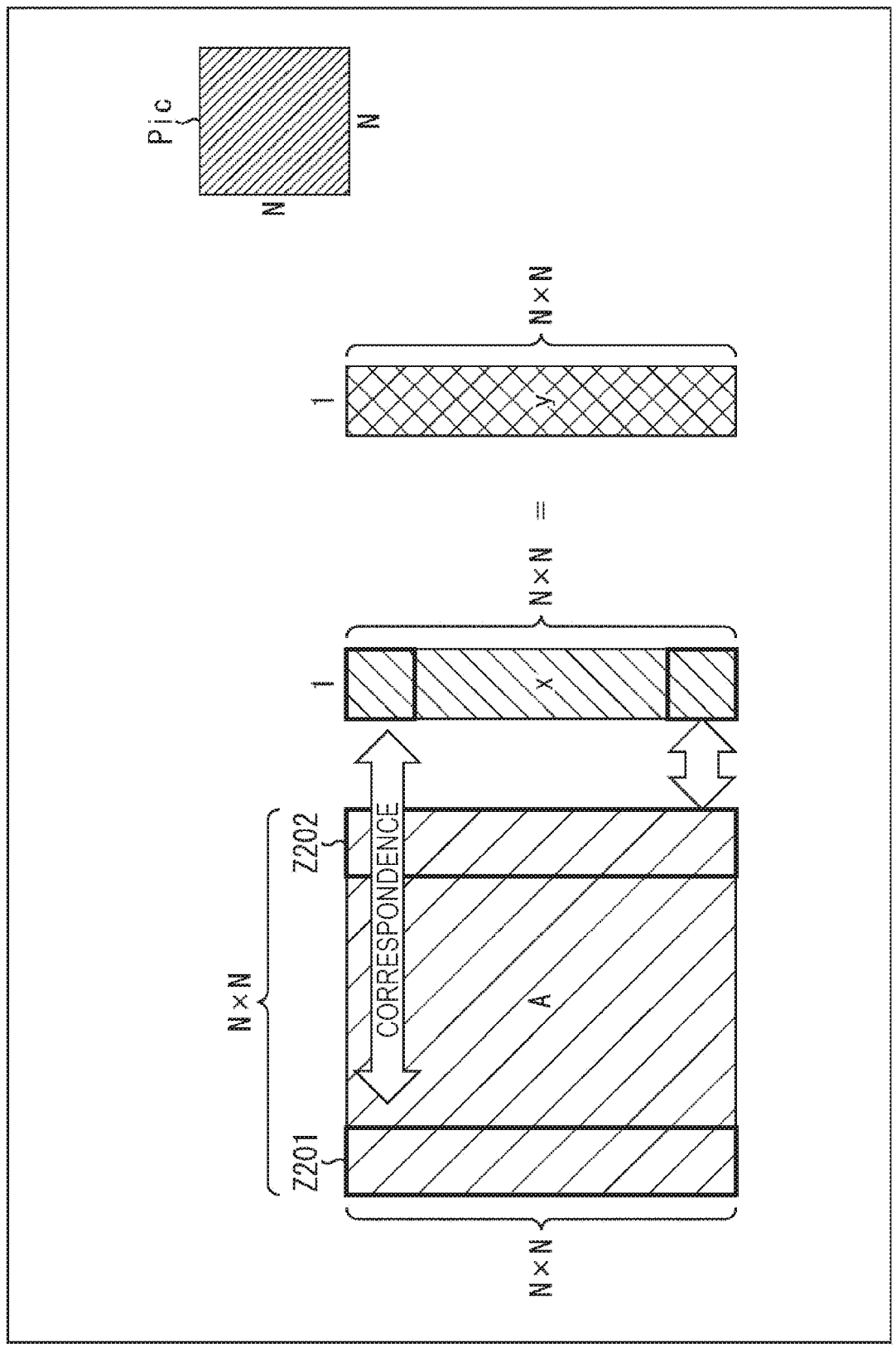
FIG. 22 is a view for illustrating the method of reducing the processing load.

In further detail, as illustrated in an upper right part of FIG. 22, in a case of obtaining a restored image of N×N pixels from a detection image Pic of N pixels×N pixels, a relationship illustrated in a left part of FIG. 22 is established by a vector X having pixel values of the respective pixels of the restored image of (N×N) rows×one column as elements, a vector Y having pixel values of the respective pixels of the detection image of (N×N) rows×one column as elements, and a matrix A of (N×N) rows×(N×N) columns including the coefficient set group.

That is, FIG. 22 illustrates that a result obtained by multiplying the respective elements of the matrix A of (N×N) rows×(N×N) columns including the coefficient set group by the vector X of (N×N) rows×one column representing the restored image is the vector Y of (N×N) rows× one column representing the detection image. Then, from this relationship, for example, the simultaneous equations corresponding to equations (1) to (3) or equations (4) to (6) described above are formed.

Note that, FIG. 22 illustrates that each element of the first column indicated by a range 2201 of the matrix A corresponds to the element of the first row of the vector X, and each element of the N×N-th column indicated by a range 2202 of the matrix A corresponds to the element of the N×N-th row of the vector X.

Note that, in a case of using the pinhole, and in a case of using a condensing function for allowing the incident light incident in the same direction such as the imaging lens to be incident on both adjacent pixel output units, a relationship between the position of each pixel and the incident angle of the light is uniquely determined, so that the matrix A is a diagonal matrix in which all rightward falling diagonal components are one. On the other hand, in a case where neither the pinhole nor the imaging lens is used as in the imaging device 101 in FIG. 2, the relationship between the position of each pixel and the incident angle of light is not uniquely determined, so that the matrix A is not the diagonal matrix.

In other words, the restored image may be obtained by solving the simultaneous equations based on a determinant illustrated in FIG. 22 and obtaining each element of the vector X.

Figure 23:
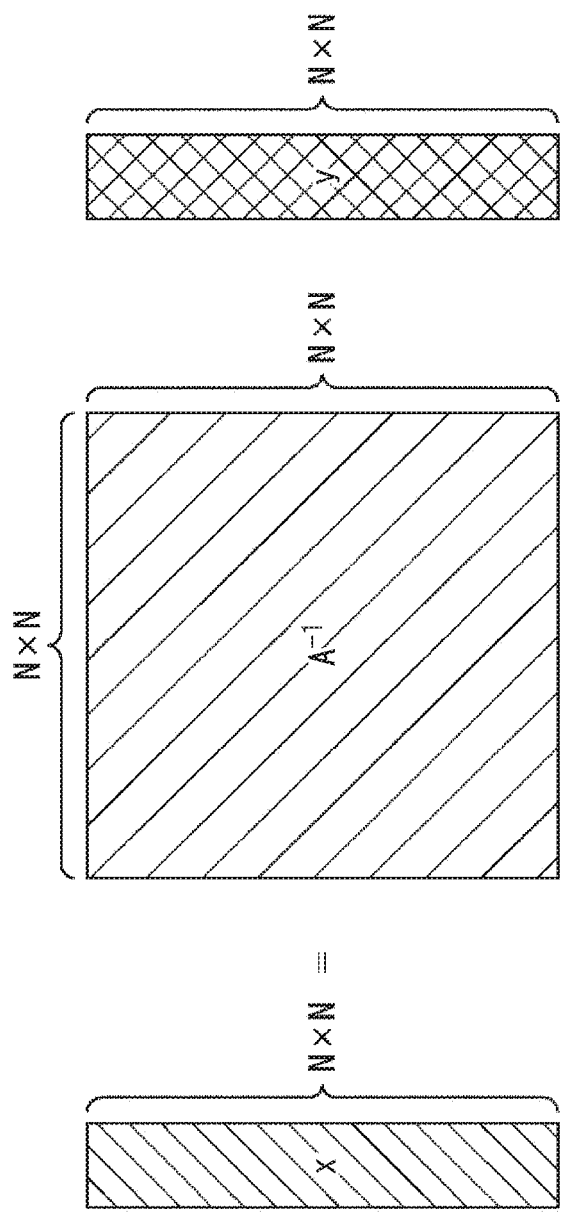
FIG. 23 is a view for illustrating the method of reducing the processing load.

By the way, in general, the determinant in FIG. 22 is transformed as illustrated in FIG. 23 by multiplying both sides by an inverse matrix $A^{-1}$ of the matrix A from the left, and each element of the vector X being the detection image is obtained by multiplying the vector Y of the detection image by an inverse matrix $A^{-1}$ from the left.

However, in reality, there is a case where the matrix A cannot be obtained correctly, the matrix A cannot be measured correctly, a basis vector of the matrix A nearly linearly dependent and it is not possible to solve, and each element of the detection image includes noise. Then, for any of these reasons or a combination thereof, the simultaneous equations might not be solved.

Therefore, for example, considering a robust configuration with respect to various errors, following equation (7) using the concept of the regularized least-square method is used.

[Mathematical Expression 1]

$$\hat{x}=\min\|A\hat{x}-y\|^2+\|\gamma\hat{x}\|^2 \quad (7)$$

Here, x with "^" at the top in equation (7) represents the vector X, A represents the matrix A, Y represents the vector Y, γ represents a parameter, ‖A‖ represents a L2 norm (square-root of sum root squares). Here, a first term on the right side is a norm when minimizing both sides in FIG. 22, and a second term on the right side is a regularization term.

When this equation (7) is solved for x, following equation (8) is obtained.

[Mathematical Expression 2]

$$\hat{x}=(A^tA+\gamma I)^{-1}A^ty \quad (8)$$

Here, $A^t$ represents a transposed matrix of the matrix A, and I represents a unit matrix.

However, since the matrix A has an enormous size, a calculation amount and a required memory amount are large.

Figure 24:
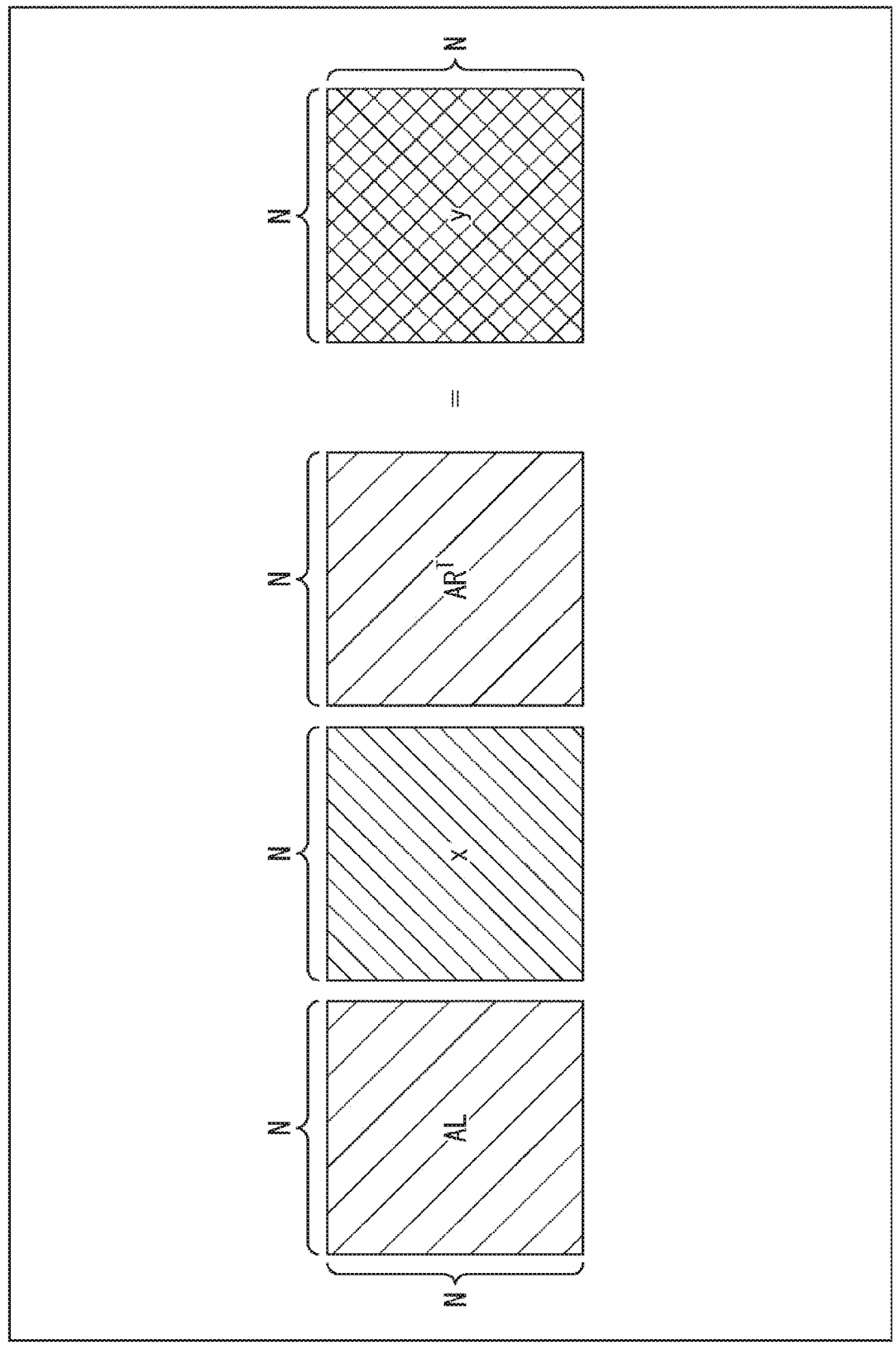
FIG. 24 is a view for illustrating the method of reducing the processing load.

Therefore, for example, as illustrated in FIG. 24, the matrix A is decomposed into a matrix AL of N rows×N columns and a matrix $AR^T$ of N rows×N columns, and they are multiplied from former and latter stages of the matrix X of N rows×N columns representing the restored image, and the matrix Y of N rows×N columns representing the detection image is obtained as a result. Therefore, for the matrix A of the number of elements (N×N)×(N×N), the matrices AL and $AR^T$ having the number of elements (N×N) are obtained, and the number of elements in each matrix becomes 1/(N×N). As a result, a calculation amount and the required memory amount may be reduced.

The determinant illustrated in FIG. 24 is realized, for example, by making the matrix in parentheses in equation (8) the matrix AL and making the inverse matrix of the transposed matrix of the matrix A the matrix $AR^T$.

Figure 25:
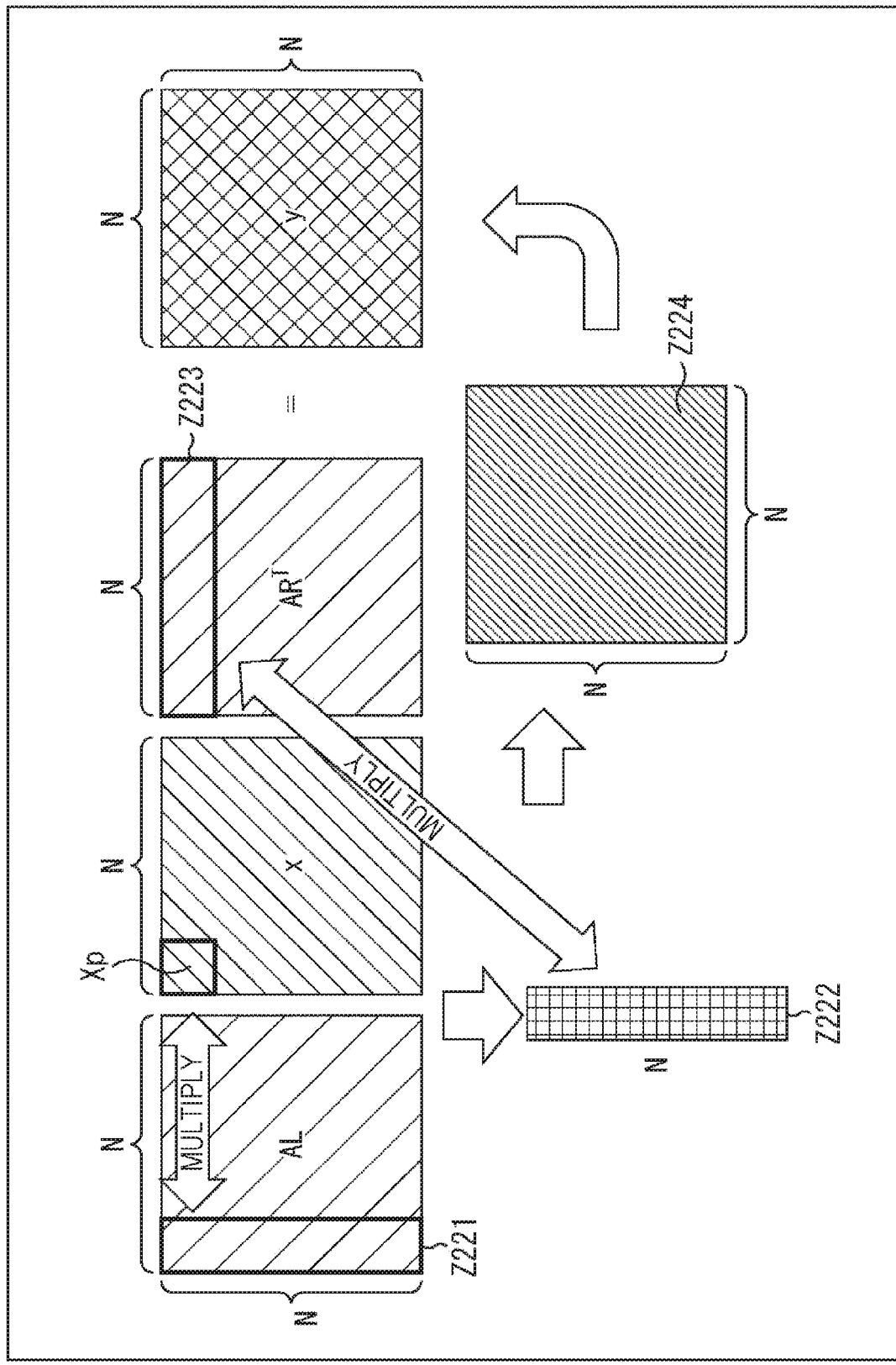
FIG. 25 is a view for illustrating the method of reducing the processing load.

In the calculation illustrated in FIG. 24, as illustrated in FIG. 25, an element group 2222 is obtained by multiplying an element of interest Xp in the matrix X by each element group Z221 of the corresponding column of the matrix AL. Moreover, a two-dimensional response Z224 corresponding to the element of interest Xp is obtained by multiplying the element group Z222 by the elements in the row corresponding to the element of interest Xp of the matrix $AR^T$. Then, the matrix Y is obtained by integrating the two-dimensional responses Z224 corresponding to all the elements of the matrix X.

Therefore, for example, in the element group Z221 of each column of the matrix AL, a coefficient corresponding to the incident angle directivity of the lateral-band type pixel 121a set to have the same width for each column of the imaging elements 121 illustrated in FIG. 21 is used.

Similarly, for example, in the element group Z223 of each row of the matrix $AR^T$, a coefficient corresponding to the incident angle directivity of the longitudinal-band type pixel 121a set to have the same height for each row of the imaging elements 121 illustrated in FIG. 21 is used.

As a result, since it becomes possible to reduce the matrix used when restoring the restored image on the basis of the detection image, the calculation amount may be reduced, a processing speed may be improved, and power consumption for the calculation may be reduced. Furthermore, since the matrix may be reduced, a capacity of the memory used for the calculation may be reduced, and a device cost may be reduced.

Note that, although FIG. 21 illustrates the example of changing the light-shielding range (light-receiving range) in a pixel unit while providing predetermined regularity in the horizontal direction and the vertical direction, in the present disclosure, the light-shielding range (light-receiving range) not completely randomly set in a pixel unit but randomly set to a certain degree in this manner is also considered to be randomly set. In other words, in the present disclosure, not only a case where the light-shielding range (light-receiving range) is set completely at random in a unit of pixel, but also a case at random to a certain degree (for example, a case where a part of all the pixels has a range with regularity but other range is at random), or a case apparently not regular to a certain degree (a case of arrangement in which it is not possible to confirm arrangement according to the regularity as described with reference to FIG. 21 among all the pixels) are also considered to be random.

3. First Embodiment

Next, a first embodiment of the present disclosure is described with reference to FIGS. 26 to 36.

As described above, an imaging element 121 using a pixel having incident angle directivity does not require an imaging lens, a pinhole, and an optical filter disclosed in Patent Document and the like described above, so that a degree of freedom in arrangement of respective pixels 121a is high.

Therefore, in the first embodiment, a subject is imaged by a plurality of imaging devices including the imaging element having the incident angle directivity, and a restored image is restored using a detection signal obtained by each imaging device.

<Configuration Example of Imaging System 301>

Figure 26:
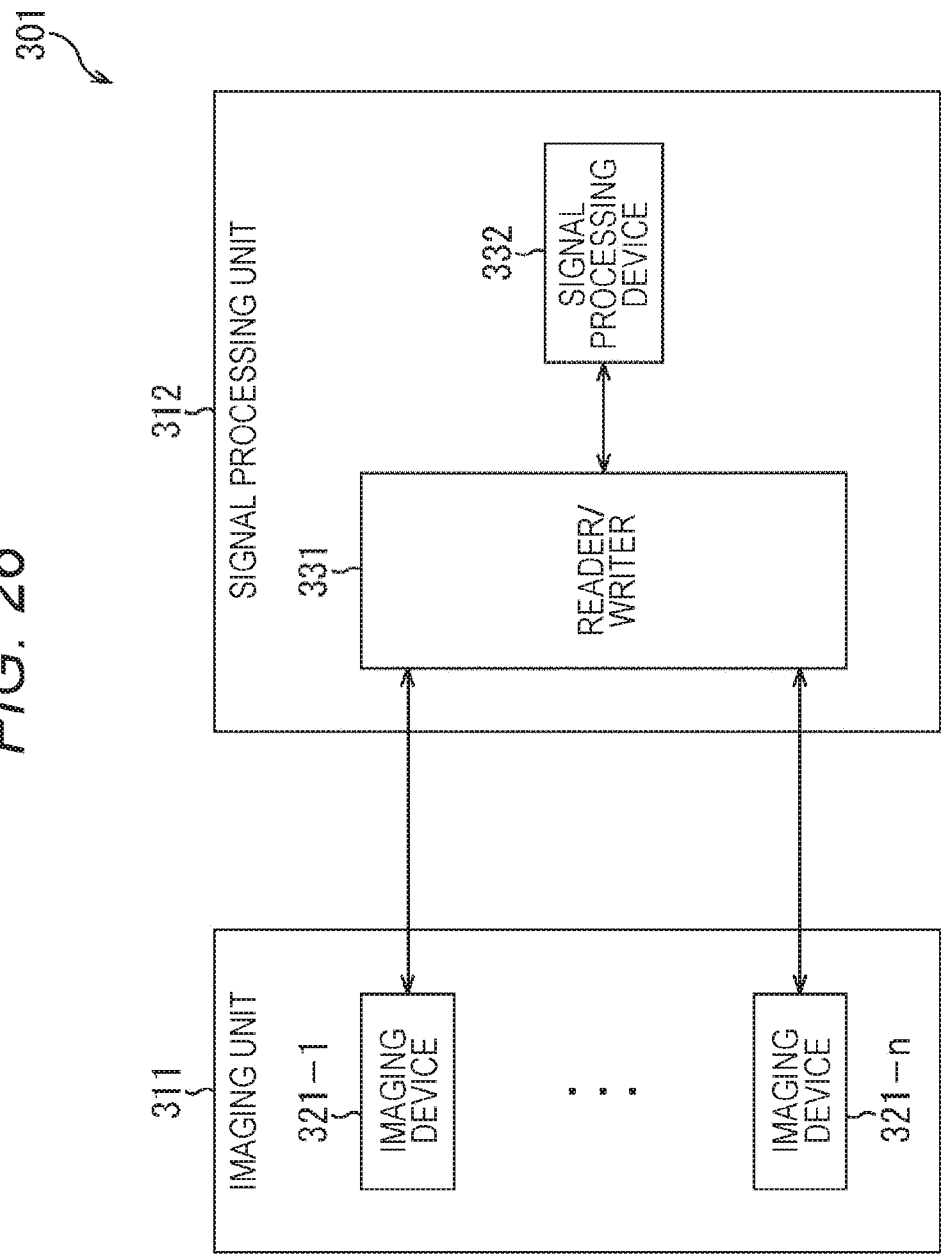
FIG. 26 is a block diagram illustrating a configuration example of an imaging system to which the technology of the present disclosure is applied.

FIG. 26 is a block diagram illustrating a configuration example of an imaging system 301 according to the first embodiment of the present disclosure.

The imaging system 301 includes an imaging unit 311 and a signal processing unit 312.

The imaging unit 311 includes one or more n imaging devices 321-1 to 321-n. Note that, hereinafter, in a case where it is not necessary to distinguish the imaging devices 321-1 to 321-n from one another, they are simply referred to as the imaging devices 321.

Figure 27:
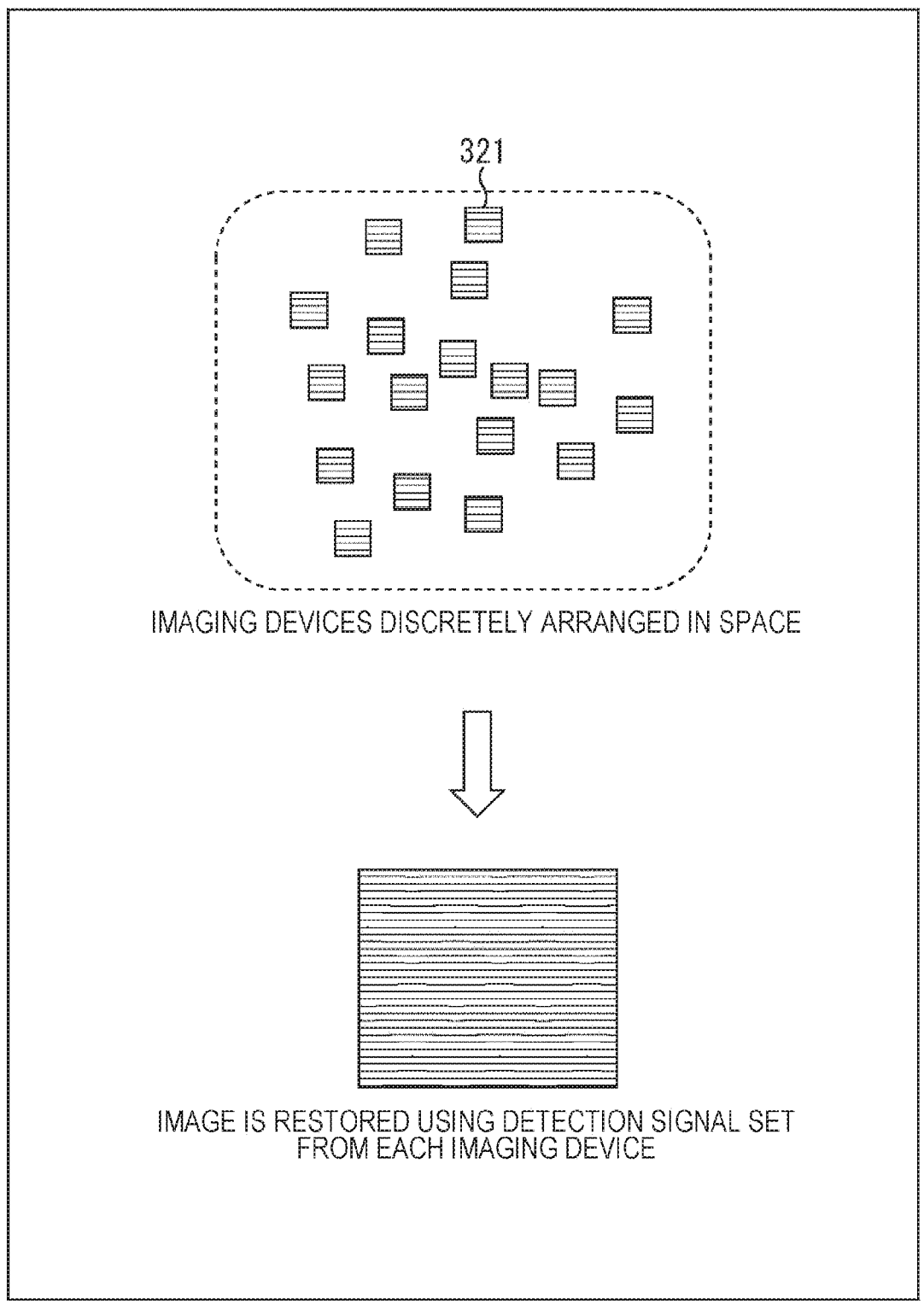
FIG. 27 is a view for illustrating an example of a method of using the imaging system in FIG. 26.

Each imaging device 321 includes one or more imaging elements 121 having the incident angle directivity described above. Each imaging device 321 may be discretely arranged in a space, for example, as illustrated in FIG. 27. That is, the respective imaging devices 321 do not necessarily aligned in the space, and may be arranged at random with a space therebetween.

Each imaging device 321 performs short-range wireless communication with a reader/writer 331 of the signal processing unit 312 using, for example, a technology such as radio frequency identifier (RFID), and transmits a detection signal set including one or more detection signals obtained by each imaging element 121 to the reader/writer 331.

Furthermore, each imaging device 321 converts an electromagnetic wave transmitted from the reader/writer 331 into electric power, and is driven by the converted electric power. In other words, each imaging device 321 is driven by an electromotive force by the electromagnetic wave transmitted from the reader/writer 331.

The signal processing unit 312 obtains the detection signal set from each imaging device 321 by controlling imaging by each imaging device 321, and performs restoration processing and the like of the restored image using the obtained detection signal set. The signal processing unit 312 includes the reader/writer 331 and a signal processing device 332.

As described above, the reader/writer 331 performs the short-range wireless communication with each imaging device 321 using the technology such as RFID, for example, and supplies electric power to each imaging device 321.

As illustrated in FIG. 27, the signal processing device 332 performs the restoration processing and the like of the restored image on the basis of the detection signal set received from each imaging device 321 via the reader/writer 331.

Note that, hereinafter, different alphabets are assigned to the end of reference signs as an imaging device 321A and an imaging device 321B depending on the embodiments of the imaging device 321; they are simply referred to as the imaging devices 321 in a case where it is not necessary to especially distinguish them from one another.

<Configuration Example of Imaging Device 321A>

Figure 28:
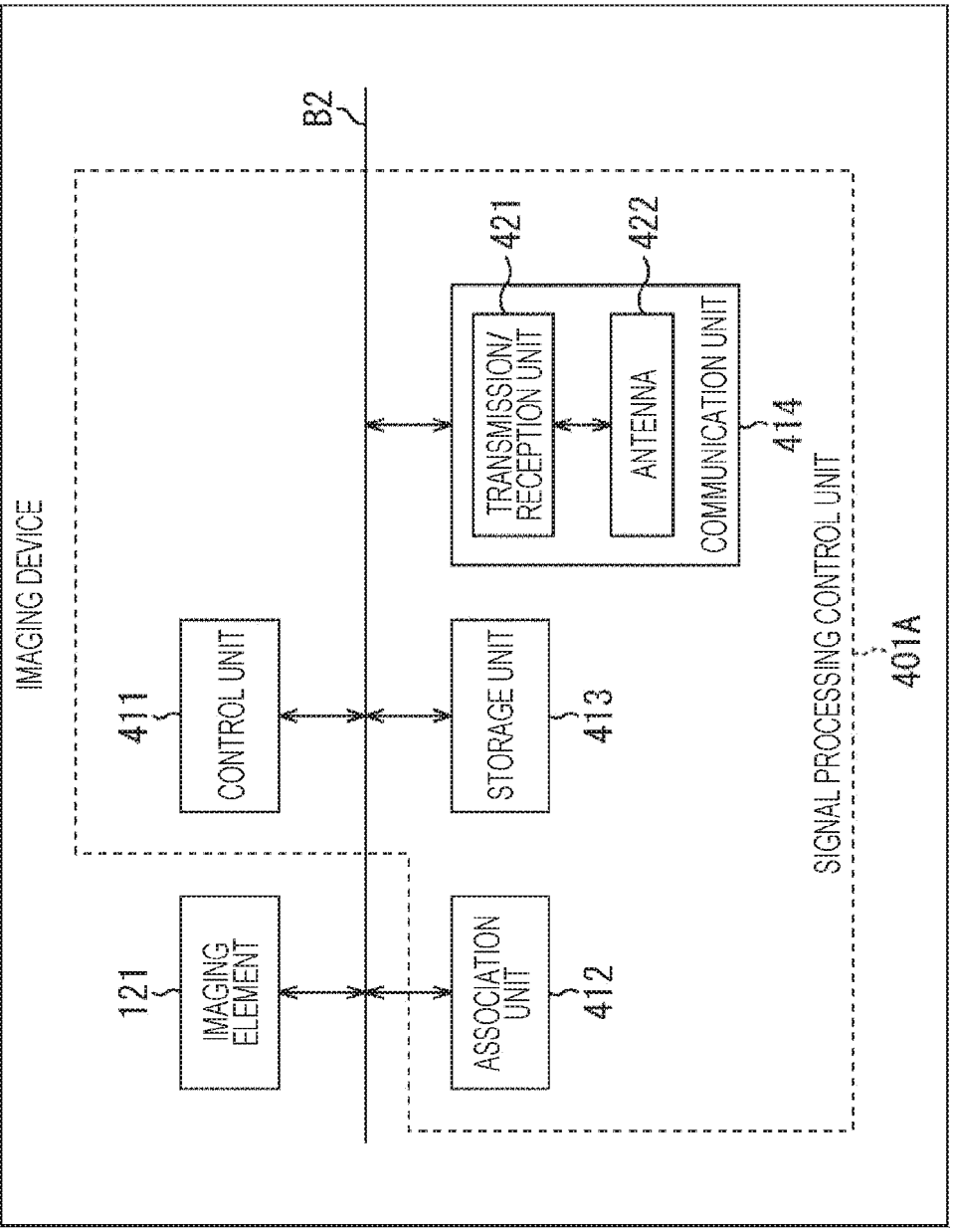
FIG. 28 is a block diagram illustrating a first embodiment of the imaging device in FIG. 26.

FIG. 28 is a block diagram illustrating a configuration example of the imaging device 321A as the first embodiment of the imaging device 321 in FIG. 26. Note that, in the drawing, a portion corresponding to that of the imaging device 101 in FIG. 2 is assigned with the same reference sign, and the description thereof is omitted as appropriate.

The imaging device 321A includes an imaging element 121, a control unit 411, an association unit 412, a storage unit 413, and a communication unit 414. Furthermore, the control unit 411, the association unit 412, the storage unit 413, and the communication unit 414 form a signal processing control unit 401A. Note that, the imaging device 321A does not include an imaging lens.

Furthermore, the imaging element 121, the control unit 411, the association unit 412, the storage unit 413, and the communication unit 414 are connected to one another via a bus B2, and perform transmission, reception and the like of data via the bus B2. Note that, hereinafter, in order to simplify the description, description of the bus B2 in a case where each unit of the imaging device 321A performs the transmission, reception and the like of the data via the bus B2 is omitted.

The imaging element 121 outputs the detection signal set including one or more detection signals output from each pixel 121a to the bus B2.

The control unit 411 includes, for example, various processors and controls each unit of the imaging device 321A.

The association unit 412 associates the detection signal set obtained by the imaging element 121 with metadata corresponding to the detection signal set in cooperation with an association unit 504 (FIG. 33) of the signal processing device 332 or alone.

The storage unit 413 includes one or more storage devices such as a read only memory (ROM), a random access memory (RAM), and a flash memory, and stores, for example, programs, data and the like used for processing of the imaging device 321A. The storage unit 413 stores, for example, an ID for uniquely identifying the imaging device 321A.

The communication unit 414 performs the short-range wireless communication with the reader/writer 331 and receives the electric power transmitted from the reader/writer 331 by electromagnetic wave. The communication unit 414 includes a transmission/reception unit 421 and an antenna 422.

The transmission/reception unit 421 transmits/receives data to/from the reader/writer 331 via the antenna 422 by a short-range wireless communication method supporting the reader/writer 331.

The antenna 422 transmits and receives the electromagnetic wave to and from an antenna (not illustrated) of the reader/writer 331. Furthermore, the electromagnetic wave received from the reader/writer 331 by the antenna 422 is converted into electric power, and the imaging device 321A is driven by the electric power.

Figure 29:
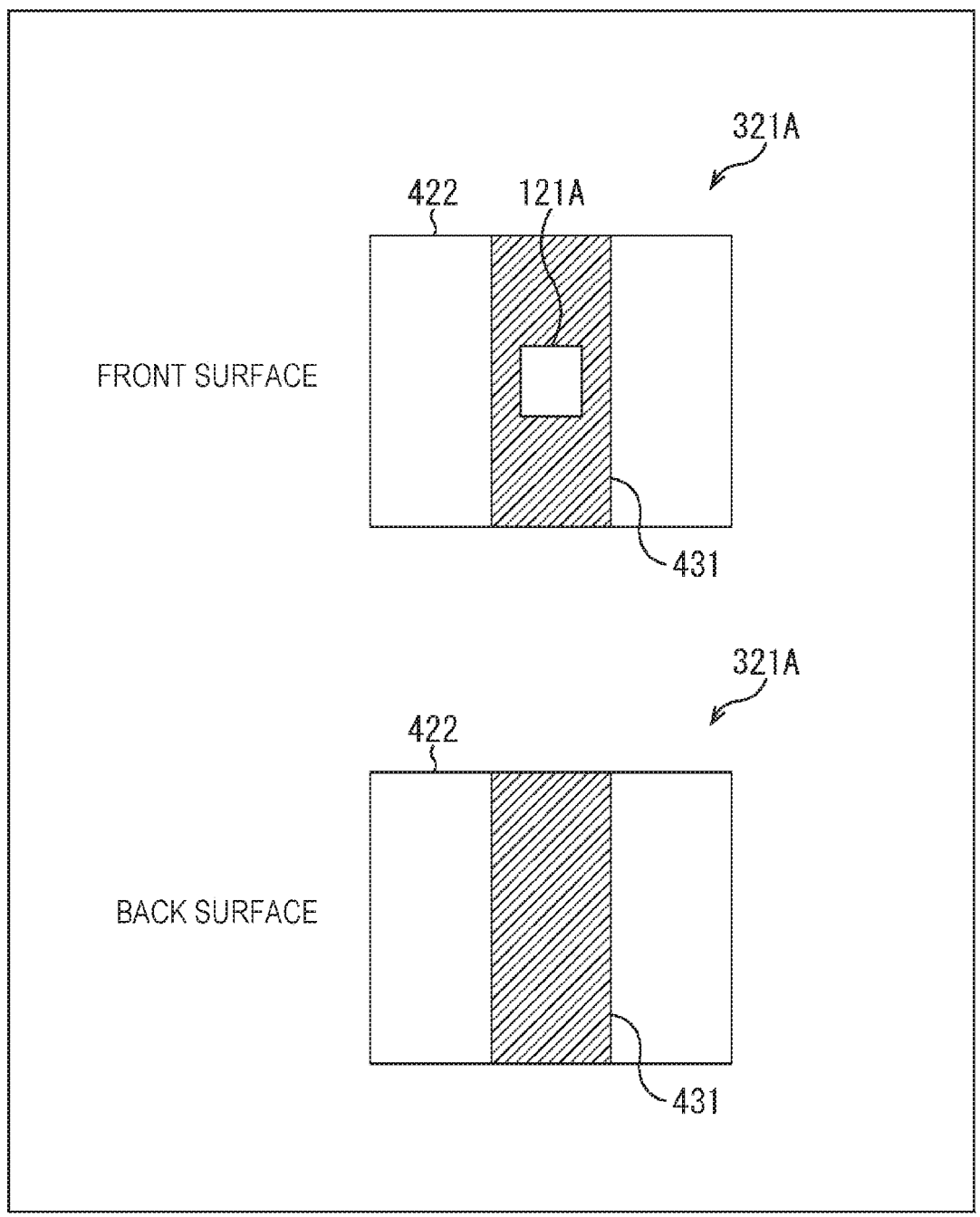
FIG. 29 is a schematic diagram illustrating a configuration example of an appearance of the first embodiment of the imaging device in FIG. 26.

FIG. 29 schematically illustrates a configuration example of an appearance of the imaging device 321A. In an upper stage of FIG. 29, a configuration example of a front surface of the imaging device 321A is schematically illustrated, and in a lower stage, a configuration example of a back surface of the imaging device 321A is schematically illustrated.

In the imaging device 321A, rectangular antennas 422 are provided on right and left sides of a vertically long rectangular main body 431 at the center. The main body 431 includes the imaging element 121, the control unit 411, the association unit 412, the storage unit 413, and the transmission/reception unit 421. Furthermore, a light-receiving surface 121A of the imaging element 121 is arranged at substantially the center of a surface of the main body 431.

Figure 30:
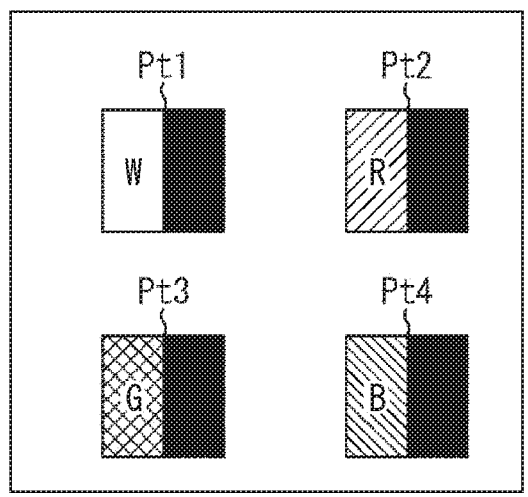
FIG. 30 is a view illustrating an example of a pattern of the pixel array unit of the imaging element in FIG. 28.
Figure 31:
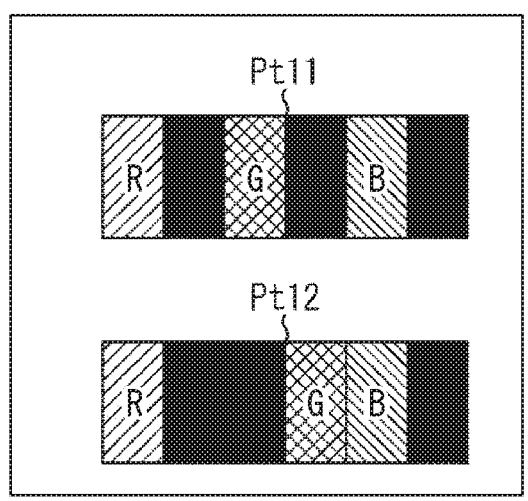
FIG. 31 is a view illustrating an example of the pattern of the pixel array unit of the imaging element in FIG. 28.
Figure 32:
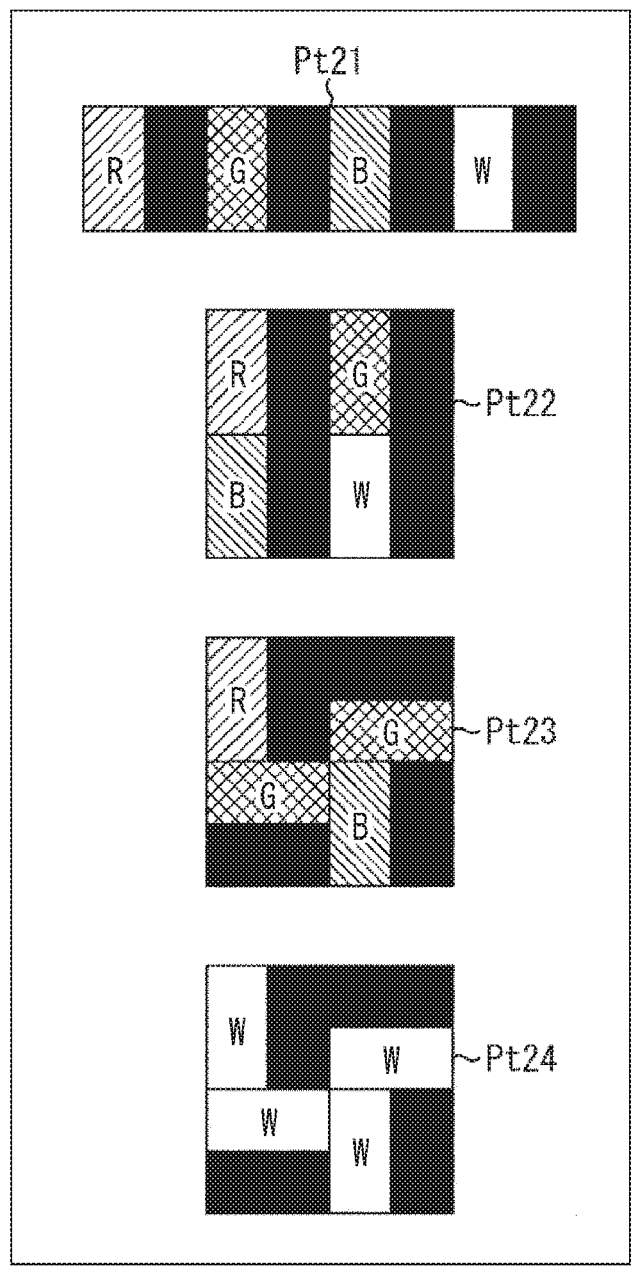
FIG. 32 is a view illustrating an example of the pattern of the pixel array unit of the imaging element in FIG. 28.

FIGS. 30 to 32 illustrate examples of a pattern of a pixel array unit of the imaging element 121 of each imaging device 321A. Note that, a black portion in FIGS. 30 to 32 indicates a light-shielding range by a light-shielding film 121b.

FIG. 30 illustrates an example of a case where the imaging element 121 of each imaging device 321A includes one pixel 121a.

In patterns Pt1 to Pt4, color filters 121d of different colors of white, red, green, or blue are provided, and a right half is light-shielded. Note that, in a case of white, the color filter 121d may be a transparent filter or the filter is not required. Therefore, by using four imaging devices 321A of the patterns Pt1 to Pt4, it is possible to obtain the detection signals having the same incident angle directivity and different colors (detection wavelengths). Then, for example, by using a plurality of imaging devices 321A having different light-shielding ranges of each color, a plurality of detection signals having different incident angle directivities is obtained for each color.

FIG. 31 illustrates an example of a case where the imaging element 121 of each imaging device 321A includes three pixels 121a.

In a pattern Pt11, the respective pixels 121a are arranged in the horizontal direction and the respective pixels 121a are provided with the color filters 121d of different colors of red, green, or blue. Furthermore, the right half of each pixel 121a is light-shielded. Therefore, by using the imaging device 321A of the pattern Pt11, it is possible to obtain the detection signals having the same incident angle directivity and different colors (detection wavelengths) at once. Then, for example, by using a plurality of imaging devices 321A having the same color array as the pattern Pt11 and having different light-shielding ranges, a plurality of detection signals having different incident angle directivities is obtained for each color.

In a pattern Pt12, as is the case with the pattern Pt11, the pixels 121a are arranged in the horizontal direction and the respective pixels 121a includes the color filters 121d of different colors of red, green, or blue. Furthermore, in the red pixel 121a and the blue pixel 121a, the right half is light-shielded, and in the green pixel 121a, the left half is light-shielded. Therefore, by using the imaging device 321A having the pattern Pt12, detection signals having different incident angle directivities and colors (detection wavelengths) may be obtained at a time. Then, for example, by using a plurality of imaging devices 321A having the same color array as the pattern Pt12 and having different light-shielding ranges, a plurality of detection signals having different incident angle directivities is obtained for each color.

FIG. 32 illustrates an example in which the imaging element 121 of each imaging device 321A includes four pixels 121a.

In a pattern Pt21, the respective pixels 121a are arranged in the horizontal direction and the respective pixels 121a are provided with the color filters 121d of different colors of red, green, blue, or white. Note that, in a case of white, the color filter 121d may be a transparent filter or the filter is not required. Furthermore, the right half of each pixel 121a is light-shielded. Therefore, by using the imaging device 321A of the pattern Pt21, it is possible to obtain the detection signals having the same incident angle directivity and different colors (detection wavelengths) at once. Then, for example, by using a plurality of imaging devices 321A having the same color array as the pattern Pt21 and having different light-shielding ranges, a plurality of detection signals having different incident angle directivities is obtained for each color.

In a pattern Pt22, the respective pixels 121a are arranged in two rows×two columns and the respective pixels 121a are provided with the color filters 121d of different colors of red, green, blue, or white. Note that, in a case of white, the color filter 121d may be a transparent filter or the filter is not required. Furthermore, the right half of each pixel 121a is light-shielded. Therefore, by using the imaging device 321A of the pattern Pt22, it is possible to obtain the detection signals having the same incident angle directivity and different colors (detection wavelengths) at once. Then, for example, by using a plurality of imaging devices 321A having the same color array as the pattern Pt22 and having different light-shielding ranges, a plurality of detection signals having different incident angle directivities is obtained for each color.

In a pattern Pt23, the respective pixels 121a are arranged in two rows×two columns, and the color array of the respective pixels 121a is according to the Bayer array. Furthermore, the light-shielding range of each pixel 121a is different. Therefore, by using the imaging device 321A having the pattern Pt23, detection signals having different incident angle directivities and colors (detection wavelengths) may be obtained at a time. Then, for example, by using a plurality of imaging devices 321A having the same color array as the pattern Pt23 and having different light-shielding ranges, a plurality of detection signals having different incident angle directivities is obtained for each color.

In a pattern Pt24, the respective pixels 121a are arranged in two rows×two columns, and the respective pixels 121a are provided with the color filters 121d of the same color (white in this example). Note that, in a case of white, the color filter 121d may be a transparent filter or the filter is not required. Furthermore, the light-shielding range of each pixel 121a is different. Therefore, by using the imaging device 321A of the pattern Pt23, it is possible to obtain the detection signals having different incident angle directivities and the same color (detection wavelength) at once.

<Configuration Example of Signal Processing Device 332>

Figure 33:
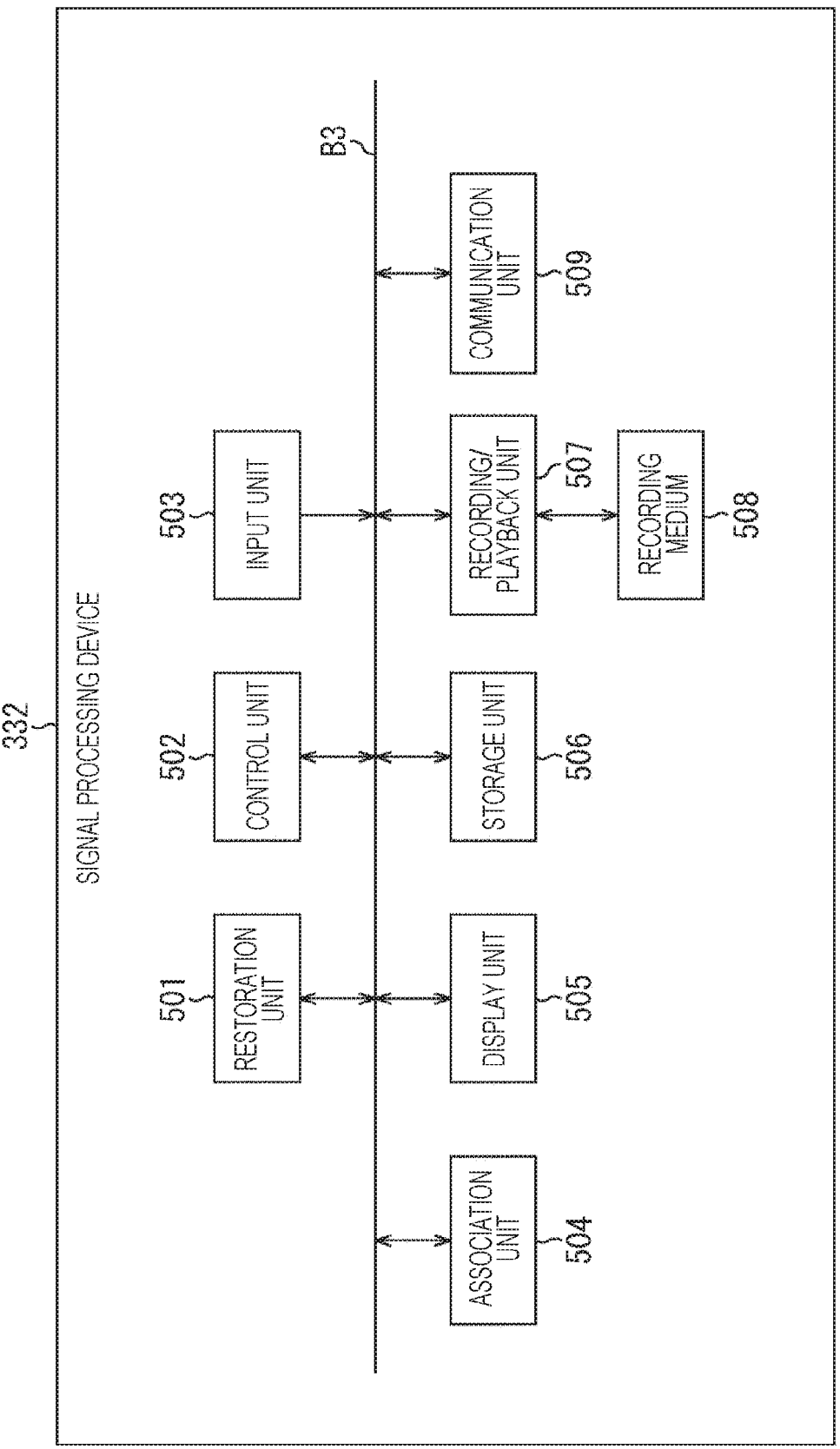
FIG. 33 is a block diagram illustrating a configuration example of a signal processing device in FIG. 26.

FIG. 33 is a block diagram illustrating a configuration example of the signal processing device 332 in FIG. 26. The signal processing device 332 includes a restoration unit 501, a control unit 502, an input unit 503, an association unit 504, a display unit 505, a storage unit 506, a recording/playback unit 507, a recording medium 508, and a communication unit 509.

The restoration unit 501, the control unit 502, the input unit 503, the display unit 505, the storage unit 506, the recording/playback unit 507, and the communication unit 509 are connected to one another via a bus B3, and perform transmission, reception and the like of data via the bus B3. Note that, hereinafter, in order to simplify the description, description of the bus B3 is omitted in a case where each unit of the signal processing device 332 performs transmission and reception of the data and the like via the bus B3.

The restoration unit 501 performs the restoration processing and the like of the restored image by processing similar to that of the restoration unit 122 of the imaging device 101 in FIG. 2 by using the detection signal set received from each imaging device 321 via the reader/writer 331. The restoration unit 501 outputs the restored image to the bus B3.

The control unit 502 includes, for example, various processors and controls each unit of the signal processing device 332.

The input unit 503 includes an input device (for example, a key, a switch, a button, a dial, a touch panel, a remote controller and the like) for operating the signal processing device 332, inputting data used for processing and the like. The input unit 503 outputs an operation signal, the input data and the like to the bus B3.

The association unit 504 associates the detection signal set obtained from each imaging device 321A with the metadata corresponding to each detection signal set in cooperation with the association unit 412 of the imaging device 321A or alone.

The display unit 505 includes a display, for example, and displays various types of information (for example, the restored image and the like). Note that, the display unit 505 may include an audio output unit such as a speaker to output audio.

The storage unit 506 includes one or more storage devices such as a ROM, a RAM, and a flash memory, and stores, for example, programs and data used for processing of the signal processing device 332. For example, the storage unit 506 stores installation information including a position (for example, latitude, longitude and the like), an attitude (for example, orientation, inclination and the like) and the like of each imaging device 321A. Furthermore, the storage unit 506 stores, for example, a coefficient set group corresponding to the imaging element 121 of each imaging device 321A in a current installation state of each imaging device 321A. This coefficient set group is prepared for each assumed subject distance and angle of view, for example.

The recording/playback unit 507 records the data on the recording medium 508 and plays back (reads out) the data recorded on the recording medium 508. For example, the recording/playback unit 507 records the restored image on the recording medium 508 or reads out the same from the recording medium 508. Furthermore, for example, the recording/playback unit 507 records the detection signal set and the corresponding metadata on the recording medium 508 or reads out the same from the recording medium 508.

The recording medium 508 includes, for example, any one of a HDD, an SSD, a magnetic disk, an optical disk, a magneto-optical disk, a semiconductor memory or the like, a combination thereof or the like.

The communication unit 509 communicates with other devices (for example, the reader/writer 331, another signal processing device and the like) by a predetermined communication method. Note that, the communication method of the communication unit 509 may be wired or wireless. Furthermore, the communication unit 509 may support a plurality of communication methods.

<Processing of Imaging System 301>

Next, processing of the imaging system 301 is described with reference to FIGS. 34 to 36.

<Processing of Signal Processing Unit 312>

First, processing of the signal processing unit 312 is described with reference to a flowchart in FIG. 34.

At step S101, the signal processing unit 312 transmits an imaging command.

Specifically, the control unit 502 of the signal processing device 332 generates the imaging command and codes the generated imaging command. The control unit 502 supplies the coded imaging command to the reader/writer 331 via the communication unit 509.

The reader/writer 331 starts transmitting a carrier wave including the electromagnetic wave and modulates the carrier wave with the coded imaging command to transmit the imaging command to each imaging device 321.

Each imaging device 321 receives the imaging command at step S151 in FIG. 36 to be described later and transmits imaging data at step S153.

At step S102, the signal processing unit 312 receives the imaging data from each imaging device 321A.

Specifically, the reader/writer 331 receives the imaging data transmitted from each imaging device 321 by modulating the carrier wave including a reflected wave of the transmitted electromagnetic wave.

Figure 35:
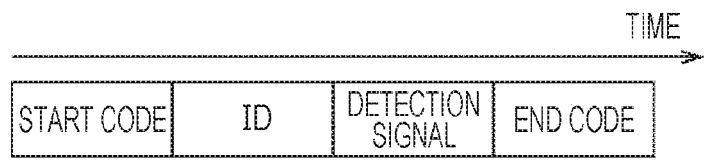
FIG. 35 is a view illustrating a first example of a data structure of a packet of imaging data.

The imaging data is transmitted using, for example, a packet illustrated in FIG. 35. Each packet includes a start code, an ID, a detection signal, and an end code.

A predetermined code indicating a head of the packet is set as the start code.

The ID is the ID for identifying the imaging device 321A and the pixel 121*a* which output the detection signal included in the packet, the ID obtained by combining the ID for identifying each imaging device 321A and the ID for identifying each pixel 121*a* in the imaging element 121, for example. Therefore, the imaging device 321A and the pixel 121*a* that output the detection signal included in the packet are specified.

In the detection signal, a value of the detection signal to be transmitted (that is, the detection signal level) is set.

A predetermined code indicating the end of the packet is set as the end code.

Note that, for example, the ID and the detection signal are coded as necessary.

For example, one packet is generated for one detection signal, and each detection signal is transmitted by a different packet. Accordingly, at least as many packets as the number of detection signals are transmitted from each imaging device 321A. Then, with one or more packets, the detection signal set including one or more detection signals output from the imaging element 121 of each imaging device 321A, and the metadata (for example, ID and the like) corresponding to the detection signal set are transmitted.

Note that, for example, a plurality of detection signals may be transmitted at once by including a plurality of combinations of ID and detection signal in one packet. In this case, for example, if all the detection signals are included in one packet to be transmitted, it is also possible to omit transmission of the ID of each pixel 121*a* by fixing the arranging order of the detection signals, and include only one ID of the imaging device 321A in one packet.

The reader/writer 331 demodulates each packet of the imaging data received from each imaging device 321A and supplies the same to the signal processing device 332. The restoration unit 501 of the signal processing device 332 obtains each demodulated packet via the communication unit 509, and decodes the ID and the detection signal included in each packet.

Furthermore, the reader/writer 331 stops transmitting the carrier wave including the electromagnetic wave after an elapse of a predetermined time.

At step S103, the restoration unit 501 obtains a coefficient used for image restoration. Specifically, the restoration unit 501 sets the subject distance by the processing similar to that by the restoration unit 122 of the imaging device 101 at step S2 in FIG. 20. Then, the restoration unit 122 reads out the coefficient set group associated with the set subject distance from the storage unit 506.

At step S104, the restoration unit 501 restores the image using the detection signal set and the coefficient. That is, the restoration unit 501 restores the restored image by using the detection signal set included in the imaging data received from each imaging device 321A and the coefficient set group obtained in the processing at step S103 by the processing similar to that by the restoration unit 122 of the imaging device 101 at step S3 in FIG. 20.

At step S105, the signal processing device 332 performs various types of processing on the restored image. For example, the restoration unit 501 performs demosaic processing, γ correction, white balance adjustment, conversion processing to a predetermined compression format and the like on the restored image as necessary. Furthermore, the restoration unit 501 supplies the restored image to the display unit 505 and allows the same to display the image, supplies the restored image to the recording/playback unit 507 and allows the same to record the image on the recording medium 508, or outputs the restored image to another device via the communication unit 509 as necessary, for example.

Thereafter, the processing of the signal processing unit 312 ends.

Figure 34:
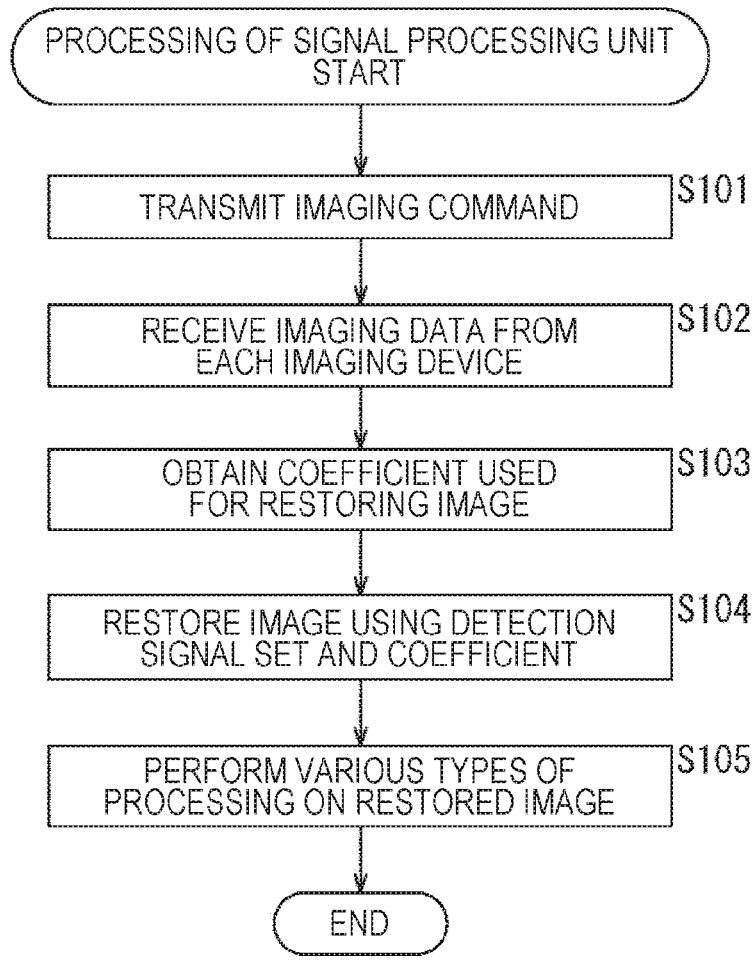
FIG. 34 is a flowchart for illustrating a first embodiment of processing of a signal processing unit in FIG. 26.
Figure 36:
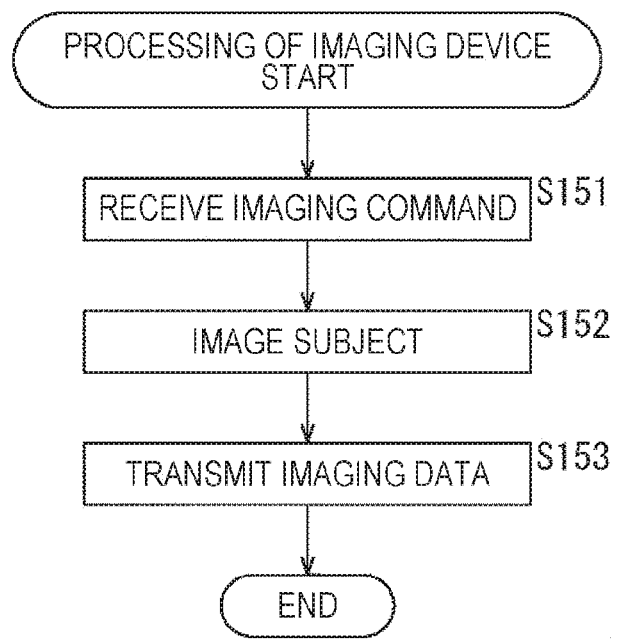
FIG. 36 is a flowchart for illustrating processing of the imaging device in FIG. 28.

Next, with reference to a flowchart in FIG. 36, processing executed by each imaging device 321A corresponding to the processing of the signal processing unit 312 in FIG. 34 is described.

At step S151, the imaging device 321A receives the imaging command. Specifically, the antenna 422 of the imaging device 321A receives the electromagnetic wave of which transmission from the reader/writer 331 is started at step S101 in FIG. 34 and converts the received electromagnetic wave into electric power to supply to each unit of the imaging device 321A. Therefore, each unit of the imaging device 321A is activated.

Next, the transmission/reception unit 421 demodulates the electromagnetic wave received from the reader/writer 331 via the antenna 422, and supplies the coded data obtained as a result to the control unit 411.

The control unit 411 obtains the imaging command by decoding the coded data.

At step S152, the imaging element 121 images the subject as in the processing at step S1 in FIG. 20. The imaging element 121 supplies the detection signal set including the detection signals of the respective pixels 121a to the association unit 412.

At step S153, the imaging device 321A transmits the imaging data.

Specifically, the association unit 412 generates the packet described above with reference to FIG. 35 for each detection signal included in the detection signal set. Therefore, the ID is assigned to each detection signal. The association unit 412 supplies the respective generated packets to the transmission/reception unit 421.

The transmission/reception unit 421 transmits the imaging data to the reader/writer 331 in a packet unit by modulating the carrier wave including the reflected wave of the electromagnetic wave received from the reader/writer 331 via the antenna 422 with data of each packet, for example.

Thereafter, the reader/writer 331 stops transmitting the electromagnetic wave, so that the supply of the electric power from the reader/writer 331 is finished, the imaging device 321A is turned off, and the processing ends.

As described above, a plurality of imaging devices 321A images in corporation, so that the imaging device 321A may be made more compact, power consumption may be reduced, and an amount of data communication related to the transmission of the imaging data may be reduced. Furthermore, the imaging device 321A is compact, does not require a power source such as a battery, and transmits the imaging data by wireless communication, so that this has a high degree of freedom in installation position. Therefore, an application range of the imaging device 321A may be expanded.

For example, by applying the imaging system 301 to an agricultural monitoring system, arranging the imaging devices 321A in a plurality of locations in a farmland, and performing the above-described processing, it is possible to grasp the weather and crop conditions from a remote location.

Furthermore, by arranging the compact imaging devices 321A in a distributed manner, it becomes possible to image without damaging the landscape. For example, by applying the imaging system 301 to a building monitoring system and arranging a plurality of imaging devices 321A in a distributed manner on a building wall and the like, it is possible to image the surroundings of the building without damaging the landscape and monitor from a remote place. Furthermore, in this case, there also is an effect that the presence of the imaging device 321A is hardly noticed.

Moreover, since the imaging device 321A may be installed on a compact device or in a curved portion of the device, a range of applicable devices is expanded. For example, the imaging device 321A is applicable to various wearable terminals, medical devices such as an endoscope camera and a fundus camera, a card-type device and the like.

4. Second Embodiment

Next, a second embodiment of the present disclosure is described with reference to FIG. 37.

<Configuration Example of Imaging Device 321B>

Figure 37:
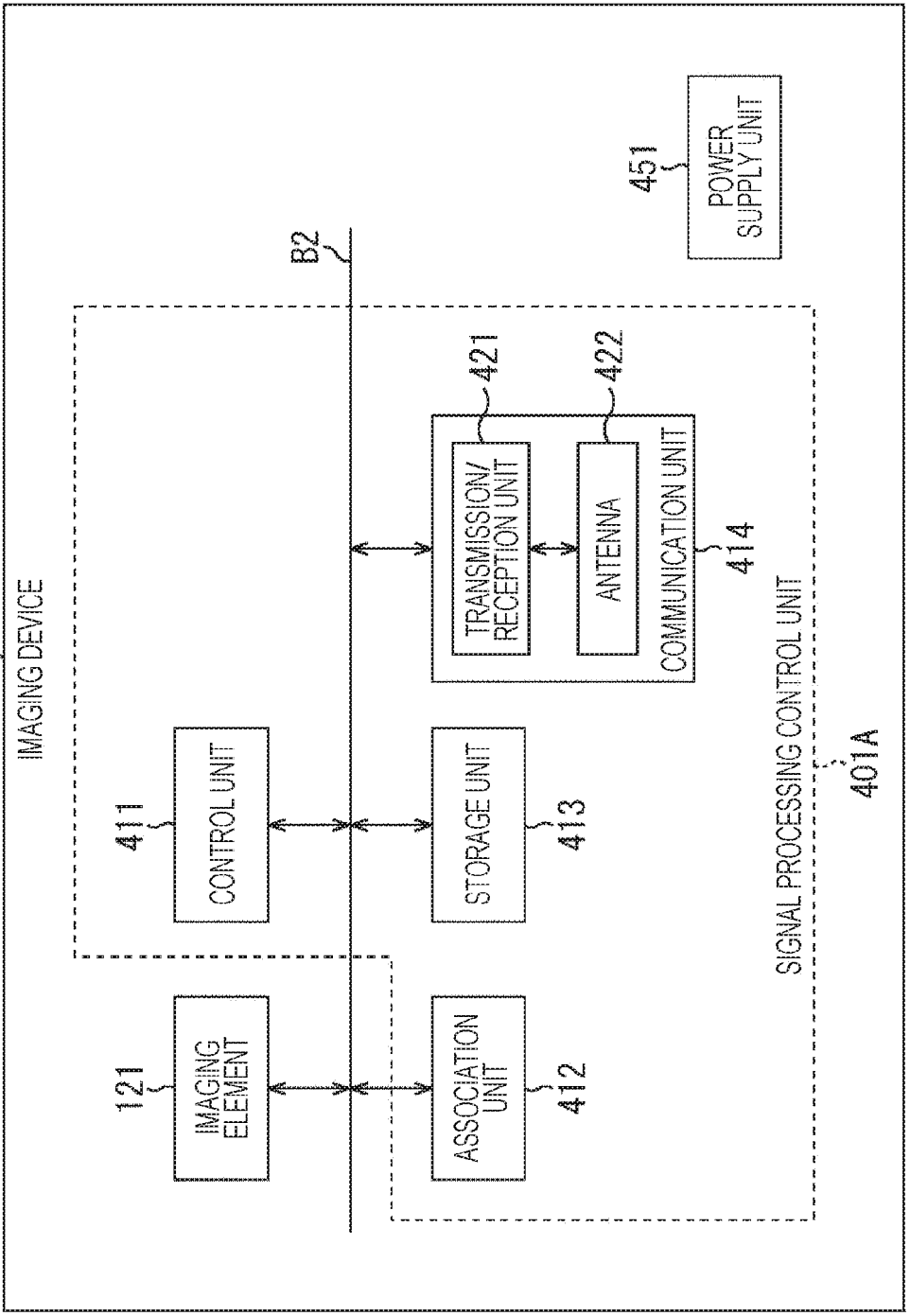
FIG. 37 is a block diagram illustrating a second embodiment of the imaging device in FIG. 26.

In the second embodiment of the present disclosure, an imaging device 321B in FIG. 37 that is a second embodiment of the imaging device 321 is used in the imaging system 301 in FIG. 26. Note that, in FIG. 37, the same reference sign is assigned to a portion corresponding to that of the imaging device 321A in FIG. 28 and the description thereof is appropriately omitted. Furthermore, in FIG. 37, power supply lines for supplying electric power from a power supply unit 451 to each unit of the imaging device 321B are not illustrated.

The imaging device 321B is different from the imaging device 321A in that the power supply unit 451 is provided.

The power supply unit 451 includes, for example, a battery or an AC/DC power supply, and supplies electric power for driving to each unit of the imaging device 321B. Note that, in a case where the power supply unit 451 is the AC/DC power supply, the power supply unit 451 converts the electric power supplied from an external AC power supply into a direct current, and then supplies the electric power to each unit of the imaging device 321B.

In this manner, by providing the power supply unit 451, the imaging device 321B may autonomously perform imaging processing and transmit imaging data even when the electric power is not supplied from a reader/writer 331.

In contrast, the signal processing device 332 may receive the imaging data transmitted from each imaging device 321 without transmitting an imaging command to each imaging device 321B and restore a restored image by using the received imaging data.

5. Third Embodiment

Next, a third embodiment of the present disclosure is described with reference to FIG. 38.

<Configuration Example of Imaging Device 321C>

Figure 38:
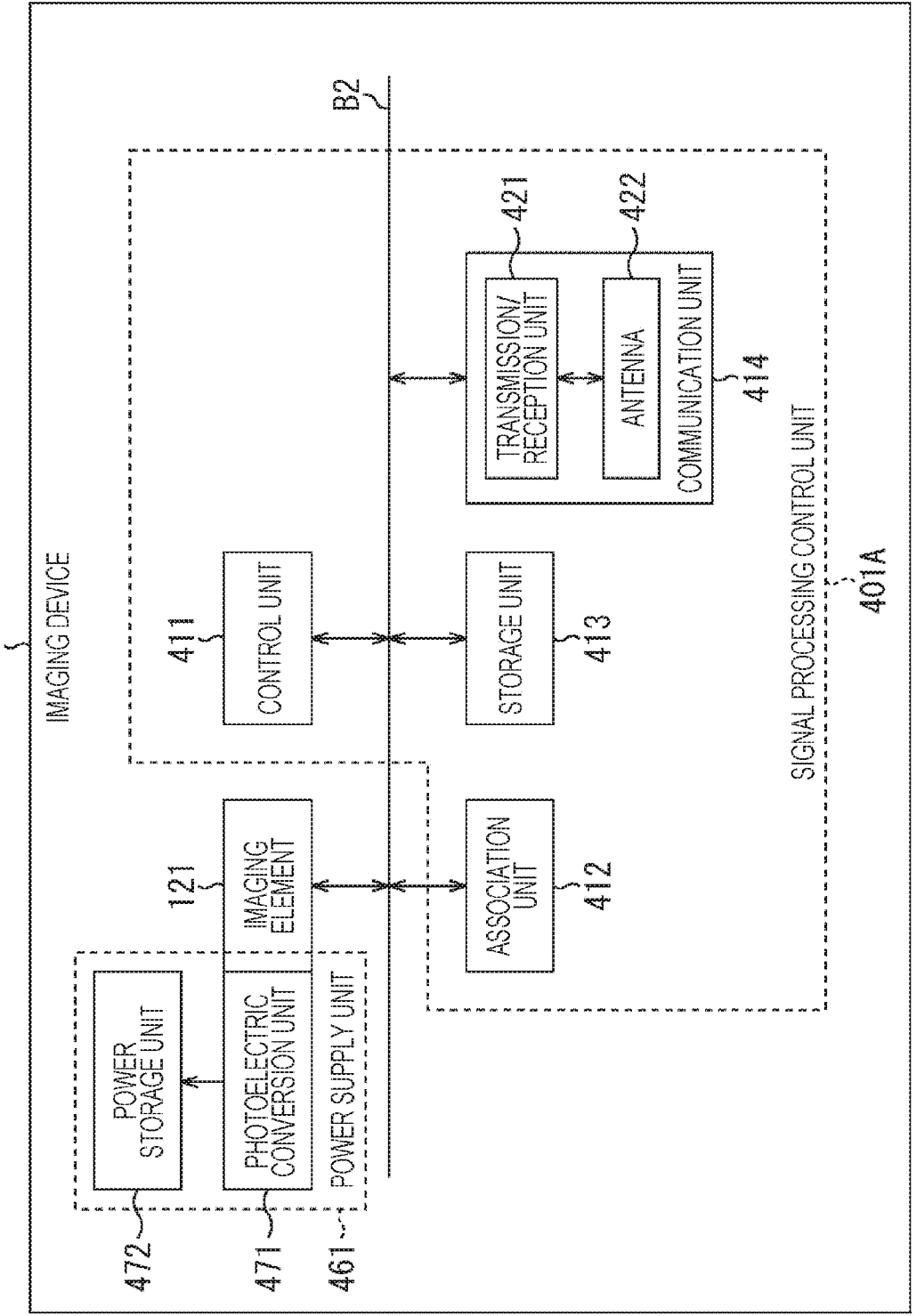
FIG. 38 is a block diagram illustrating a third embodiment of the imaging device in FIG. 26.

In the third embodiment of the present disclosure, an imaging device 321C in FIG. 38 that is a third embodiment of the imaging device 321 is used in the imaging system 301 in FIG. 26. Note that, in FIG. 38, the same reference sign is assigned to a portion corresponding to that of the imaging device 321A in FIG. 28 and the description thereof is appropriately omitted. Furthermore, in FIG. 38, power supply lines for supplying electric power from a power supply unit 461 to each unit of the imaging device 321C are not illustrated.

The imaging device 321C is different from the imaging device 321A in that the power supply unit 461 is provided.

The power supply unit 461 is a power supply that generates electric power by solar power generation. The power supply unit 461 includes a photoelectric conversion unit 471 and a power storage unit 472.

The photoelectric conversion unit 471 includes, for example, a photodiode, converts received light into charges, and supplies the obtained charges to the power storage unit 472.

The power storage unit 472 accumulates the charges converted by the photoelectric conversion unit 471 and supplies the electric power by the accumulated charges to each unit of the imaging device 321C.

Therefore, the imaging device 321C may generate the electric power by itself and operate with the electric power without externally receiving the electric power supply or replacing a battery.

Note that, for example, the photoelectric conversion unit 471 may be integrated with an imaging element 121 by forming a photodiode of the imaging element 121 and the photodiode of the photoelectric conversion unit 471 on the same semiconductor substrate. Therefore, the imaging device 321C may be made compact and a manufacturing process may be simplified.

6. Fourth Embodiment

Next, a fourth embodiment of the present disclosure is described with reference to FIGS. 39 to 45.

Since an imaging device 321 is compact and has a high degree of freedom in installation position as described above, this is assumed to be used in an arbitrary place other than a predetermined place. For example, it is assumed that a plurality of imaging devices 321 is disorderly distributed to be used.

Figure 39:
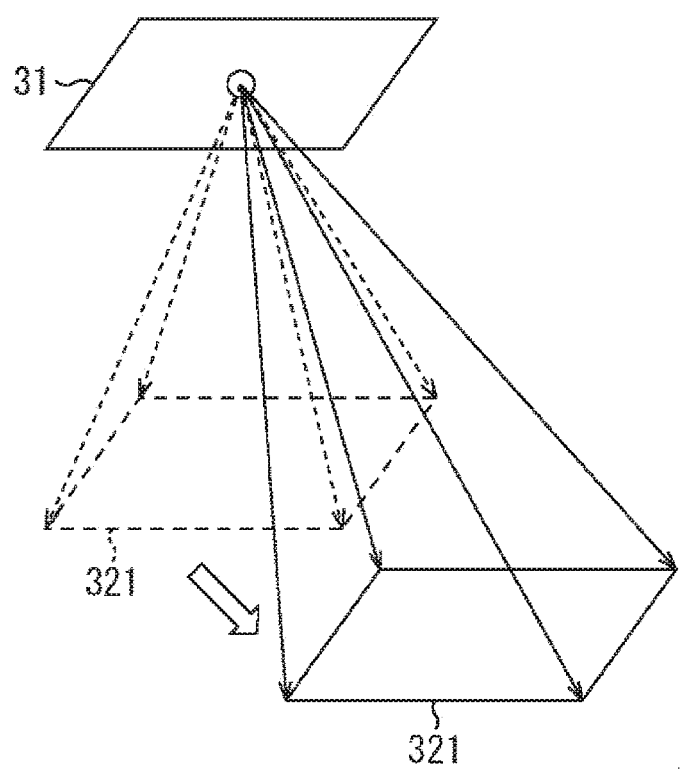
FIG. 39 is a view for illustrating a relationship between a position of the imaging device and an incident angle of a light beam from a point light source.

In contrast, when a position and an attitude of the imaging device 321 change, an inclination of a light-receiving surface of an imaging element 121 with respect to a subject surface to be restored changes, and an incident angle of a light beam from each point light source on the subject surface changes. For example, as illustrated in FIG. 39, when the imaging device 321 moves from a position indicated by a dotted line to a position indicated by a solid line, the incident angle of the light beam from a point light source P of a subject surface 31 on (the light-receiving surface of the imaging element 121 of) the imaging device 321 changes.

Figure 40:
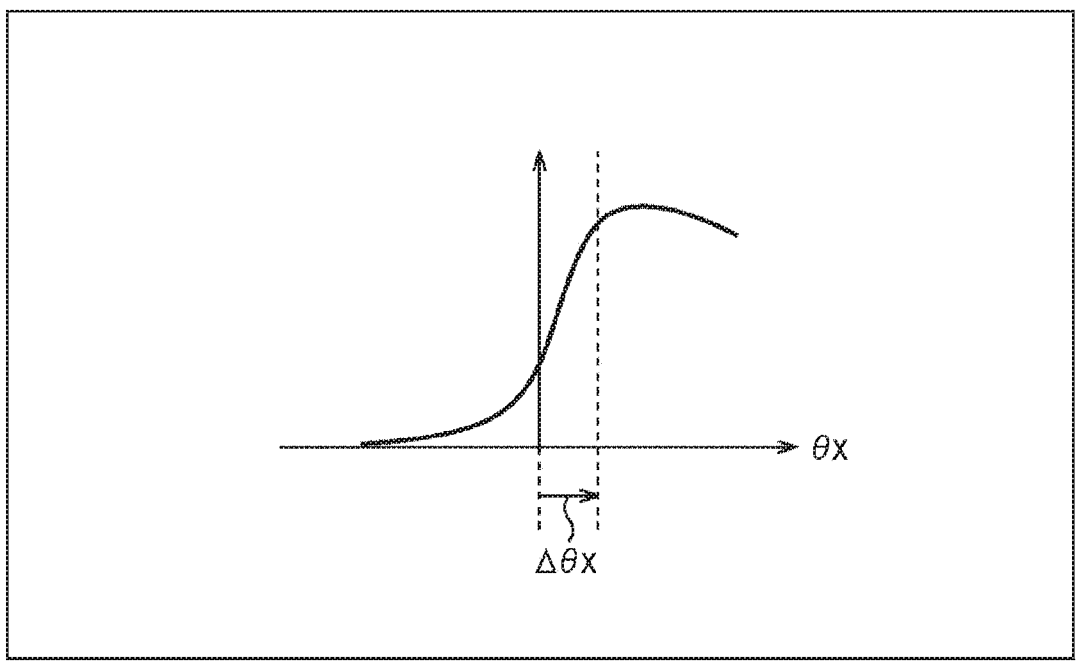
FIG. 40 is a graph illustrating an example of incident angle directivity.

In contrast, as described above, each pixel 121a of the imaging element 121 has incident angle directivity. For example, FIG. 40 illustrates an example of light-receiving sensitivity to an incident angle θx in the horizontal direction of a certain pixel 121a in the imaging element 121. In FIG. 40, the incident angle θx in the horizontal direction is plotted along the abscissa, and a detection signal level is plotted along the ordinate.

For example, in a case where the light beam is incident from the point light source P of the subject surface 31 at an incident angle of 0°, if an inclination in the horizontal direction of the imaging element 121 increases by Δθx, the detection signal level increases as illustrated in the drawing.

Therefore, in a case where the position and attitude of the imaging device 321 change, it is necessary to adjust a coefficient used for restoring a restored image.

Therefore, in the fourth embodiment, the position and inclination of each imaging device 321 are detected by each imaging device 321, and a signal processing device 332 obtains the coefficient used for restoring the restored image on the basis of a detection result, and the restored image is restored.

<Configuration Example of Imaging Device 321D>

Figure 41:
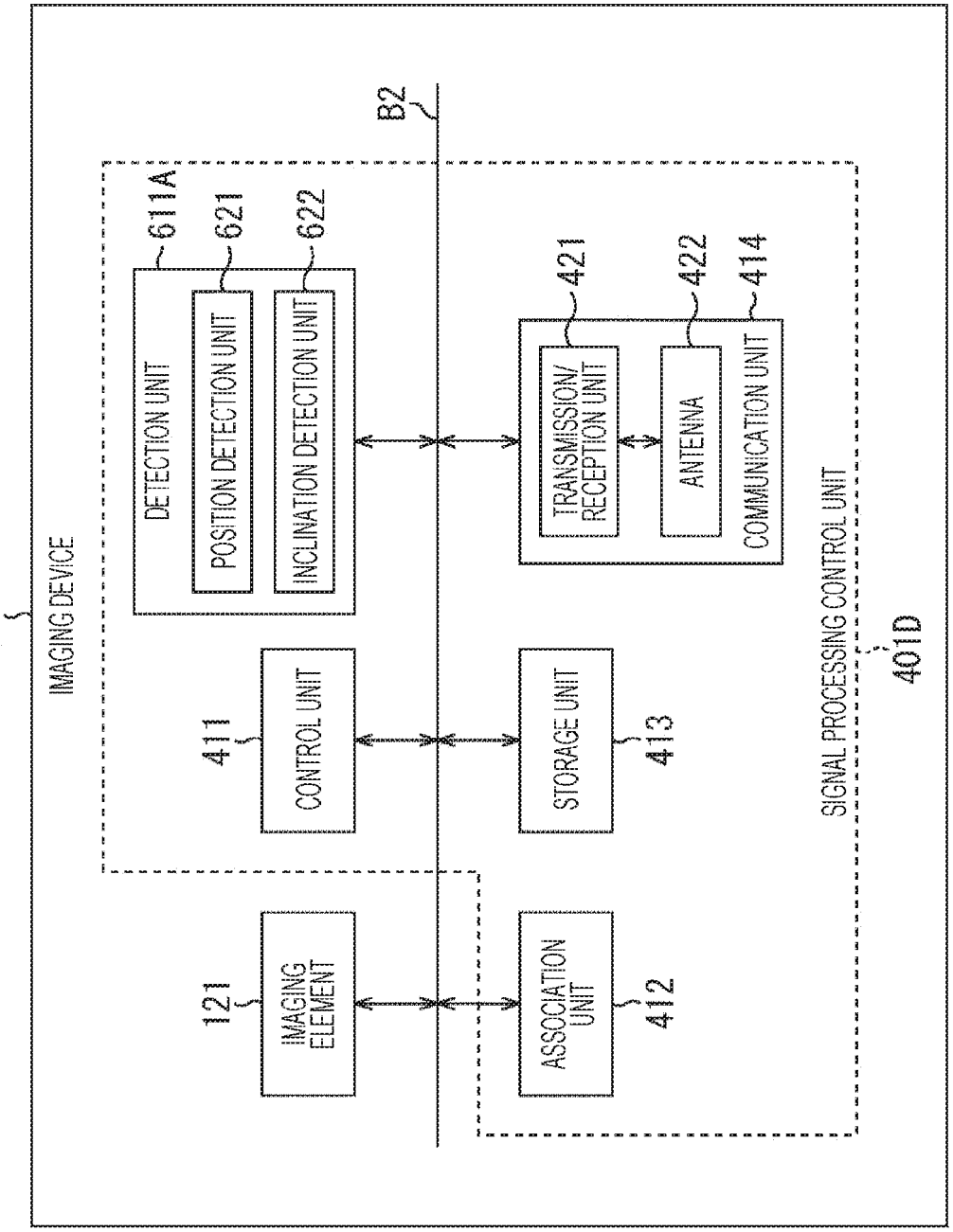
FIG. 41 is a block diagram illustrating a fourth embodiment of the imaging device in FIG. 26.

In the fourth embodiment, an imaging device 321D in FIG. 41 that is a fourth embodiment of the imaging device 321 is used in the imaging system 301 in FIG. 26. Note that, in FIG. 41, the same reference sign is assigned to a portion corresponding to that of the imaging device 321A in FIG. 28 and the description thereof is appropriately omitted.

The imaging device 321D is different from the imaging device 321A in that a signal processing control unit 401D is provided in place of the signal processing control unit 401A. The signal processing control unit 401D is different from the signal processing control unit 401A in that a detection unit 611A is added.

The detection unit 611A includes a position detection unit 621 and an inclination detection unit 622.

The position detection unit 621 includes, for example, a GNSS receiver and the like and detects a current position (for example, an absolute position represented by latitude and longitude) of the imaging device 321D. The position detection unit 621 outputs the detected position information to a bus B2.

Figure 42:
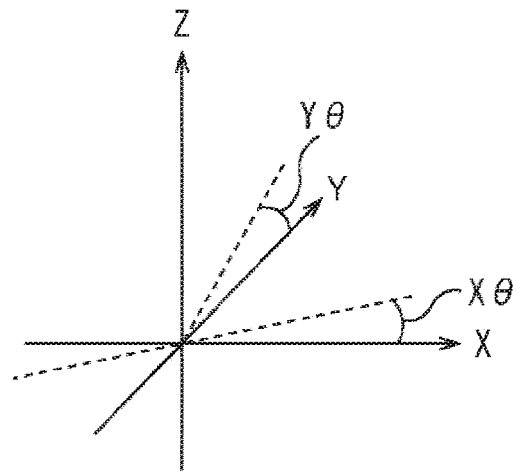
FIG. 42 is a view illustrating a direction in which inclination of the imaging device is detected.

The inclination detection unit 622 includes, for example, an acceleration sensor or an inclination sensor, and detects the inclination of the light-receiving surface of the imaging element 121 with respect to a plane perpendicular to a direction of gravity. For example, as illustrated in FIG. 42, in a case where the direction of gravity is a Z-axis, a direction perpendicular to the Z-axis and extending in an east-west direction is an X-axis, and a direction perpendicular to the Z-axis and extending in a north-south direction is a Y-axis, the inclination detection unit 622 detects inclinations Xθ and Yθ. The inclination Xθ is the inclination around the Y-axis in an X-Z plane. The inclination Yθ is the inclination around the X-axis in a Y-Z plane. The inclination detection unit 622 outputs detected inclination information to the bus B2.

<Processing of Imaging System 301>

Next, processing of an imaging system 301 is described with reference to FIGS. 43 to 45.

<Processing of Signal Processing Unit 312>

First, processing of a signal processing unit 312 is described with reference to a flowchart in FIG. 43.

At step S201, an imaging command is transmitted as in the processing at step S101 in FIG. 34.

At step S202, imaging data is received from each imaging device 321D as in the processing at step S102 in FIG. 34. However, a data configuration of a packet of the imaging data is different from that in the processing at step S102 in FIG. 34.

Figure 44:
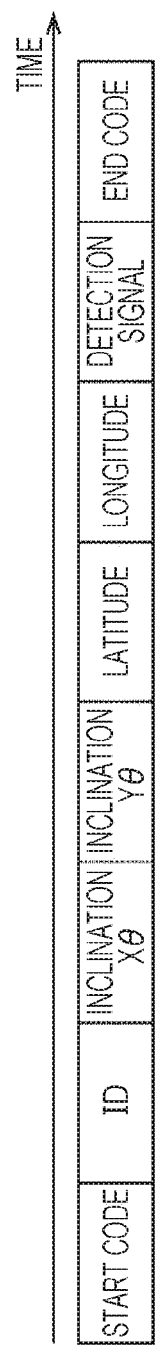
FIG. 44 is a view illustrating a second example of a data structure of a packet of imaging data.

FIG. 44 illustrates an example of the data configuration of the packet of the imaging data used in the fourth embodiment.

The data configuration of the packet in FIG. 44 is different from the data configuration of the packet in FIG. 35 in that the inclination Xθ, the inclination Yθ, the latitude, and the longitude are added.

As the inclinations Xθ and Yθ, the inclinations Xθ and the inclination Yθ of the light-receiving surface of the imaging element 121 detected by the inclination detection unit 622 of the imaging device 321D are set, respectively.

As the latitude and longitude, the latitude and longitude of the current position of the imaging device 321D detected by the position detection unit 621 of the imaging device 321D are set, respectively.

At step S203, the restoration unit 501 obtains the coefficient used for image restoration. Specifically, the restoration unit 501 sets a subject distance as in the processing at step S103 in FIG. 34.

Next, the restoration unit 501 calculates, for each imaging device 321D, an amount of change in inclination of the light-receiving surface of the imaging element 121 with respect to the subject surface at the set subject distance (the subject surface to be restored). That is, the restoration unit 501 calculates the amount of change in the inclination of the light-receiving surface of the imaging element 121 with respect to the subject surface in association with the movement of each imaging device 321D from a predetermined reference position to the current position.

Hereinafter, it is assumed that the light-receiving surface of the imaging element 121 and the subject surface face each other in a case where the imaging device 321D is installed in the reference position, and are surfaces perpendicular to the direction of gravity. Furthermore, hereinafter, the latitude and longitude of the reference position are referred to as reference latitude and reference longitude, respectively. Note that, the reference position is set in advance for each imaging device 321D, for example.

In this case, in a case where the latitude and longitude and the inclination Xθ and the inclination Yθ of the imaging device 321D change from the reference position, a change amount Δθx of the incident angle θx in the X-axis direction and a change amount Δθy of the incident angle θy in the Y-axis direction of the light beam on the light-receiving surface of the imaging element 121 from each point light source of the subject surface are expressed by following equations (9) and (10), respectively.

$$\Delta\theta x = \operatorname{atan}((\text{longitude after movement} - \text{reference longitude})/\text{subject distance}) + X\theta \quad (9)$$

$$\Delta\theta y = \operatorname{atan}((\text{latitude after movement} - \text{reference latitude})/\text{subject distance}) + Y\theta \quad (10)$$

That is, the incident angle θx in the X-axis direction and the incident angle θy in the Y-axis direction of the light beam on the light-receiving surface of the imaging element 121 from each point light source of the subject surface increase by Δθx and Δθy, respectively.

Note that, hereinafter, the change amount Δθx of the incident angle θx is referred to as an incident angle change amount Δθx, and the change amount Δθy of the incident angle θy is referred to as an incident angle change amount Δθy.

Therefore, the restoration unit 501 calculates the incident angle change amount Δθx and the incident angle change amount Δθy of each imaging device 321D with respect to the subject surface 31 at the set subject distance on the basis of the latitude, longitude, inclination Xθ, and inclination Yθ of each imaging device 321D. The incident angle change amount Δθx and the incident angle change amount Δθy are the change amounts in the incident angle θx and the incident angle θy with reference to a case where each imaging device 321D is installed in a predetermined reference position.

At that time, for example, the storage unit 506 stores not only a coefficient set group for the subject surface at each subject distance in a case where each imaging device 321D is installed in the reference position but also the coefficient set group for each of the incident angle change amount Δθx and the incident angle change amount Δθy for each subject surface. Then, the restoration unit 501 reads out the coefficient set group corresponding to the set subject distance and the calculated incident angle change amount Δθx and incident angle change amount Δθy from the storage unit 506 as the coefficient set group corresponding to each imaging device 321D.

Alternatively, for example, in a case of obtaining the coefficient by using the characteristics of the weight Wx and the weight Wy described above with reference to FIG. 9, the restoration unit 501 may obtain the coefficient on the basis of the weight Wx and the weight Wy for the incident angle obtained by adding the calculated incident angle change amount Δθx and the incident angle change amount Δθy to the incident angle ex and the incident angle θy of the incident light from each point light source of the subject surface in a case where the imaging device 321D is installed in the reference position.

At step S204, as in the processing at step S104 in FIG. 34, image restoration is performed using a detection signal set and the coefficient.

At step S205, as in the processing at step S105 in FIG. 34, various types of processing are performed on the restored image.

Thereafter, the processing of the signal processing unit 312 ends.

<Processing of Imaging Device 321D>

Figure 43:
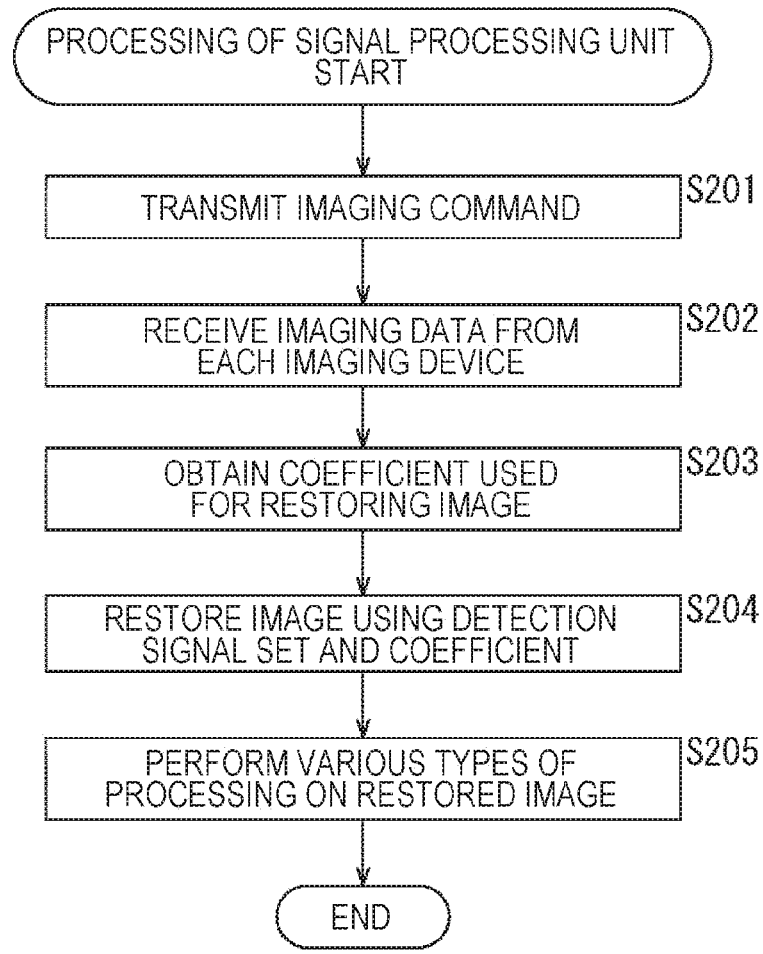
FIG. 43 is a flowchart for illustrating a second embodiment of processing of a signal processing unit in FIG. 26.
Figure 45:
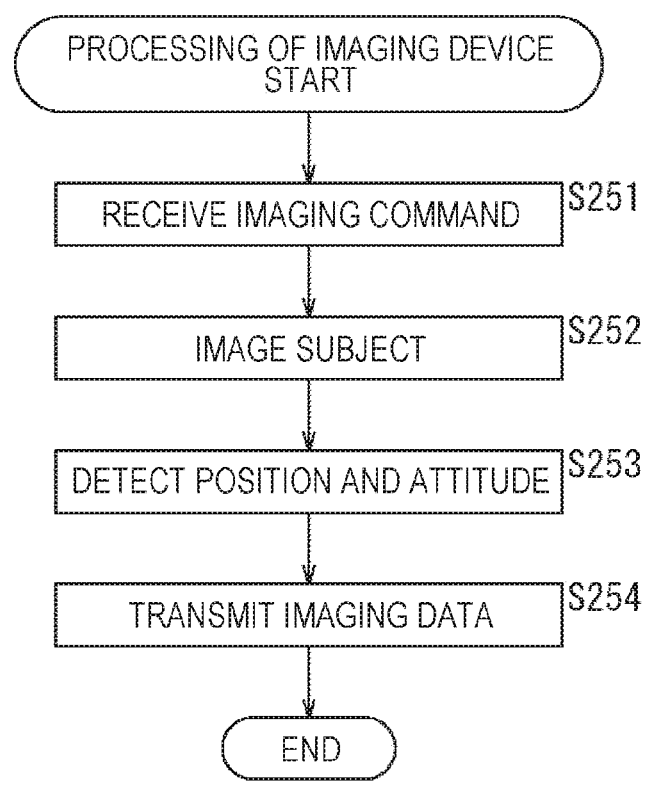
FIG. 45 is a flowchart for illustrating processing of the imaging device in FIG. 41.

Next, with reference to a flowchart in FIG. 45, processing executed by each imaging device 321D corresponding to the processing of the signal processing unit 312 in FIG. 43 is described.

At step S251, the imaging command is received as in the processing at step S151 in FIG. 36.

At step S252, the subject is imaged as in the processing at step S152 in FIG. 36.

At step S253, the detection unit 611A detects the position and attitude. Specifically, the position detection unit 621 detects the latitude and longitude of the current position of the imaging device 321D and outputs the detected position information to the bus B2. The inclination detection unit 622 detects the inclination Xθ and the inclination Yθ of the light-receiving surface of the imaging element 121 of the imaging device 321D and outputs the detected inclination information to the bus B2.

At step S254, the imaging data is transmitted as in the processing at step S153 in FIG. 36. However, unlike the processing at step S153, the imaging data is transmitted using the packet in FIG. 44.

Thereafter, the processing of the imaging device 321D ends.

In this manner, each imaging device 321D detects its own position and attitude and notifies the signal processing device 332 of the same, so that each imaging device 321D may be freely installed and moved to perform imaging processing without prior setting processing and the like.

7. Fifth Embodiment

Next, a fifth embodiment of the present disclosure is described with reference to FIGS. 46 to 48.

Figure 46:
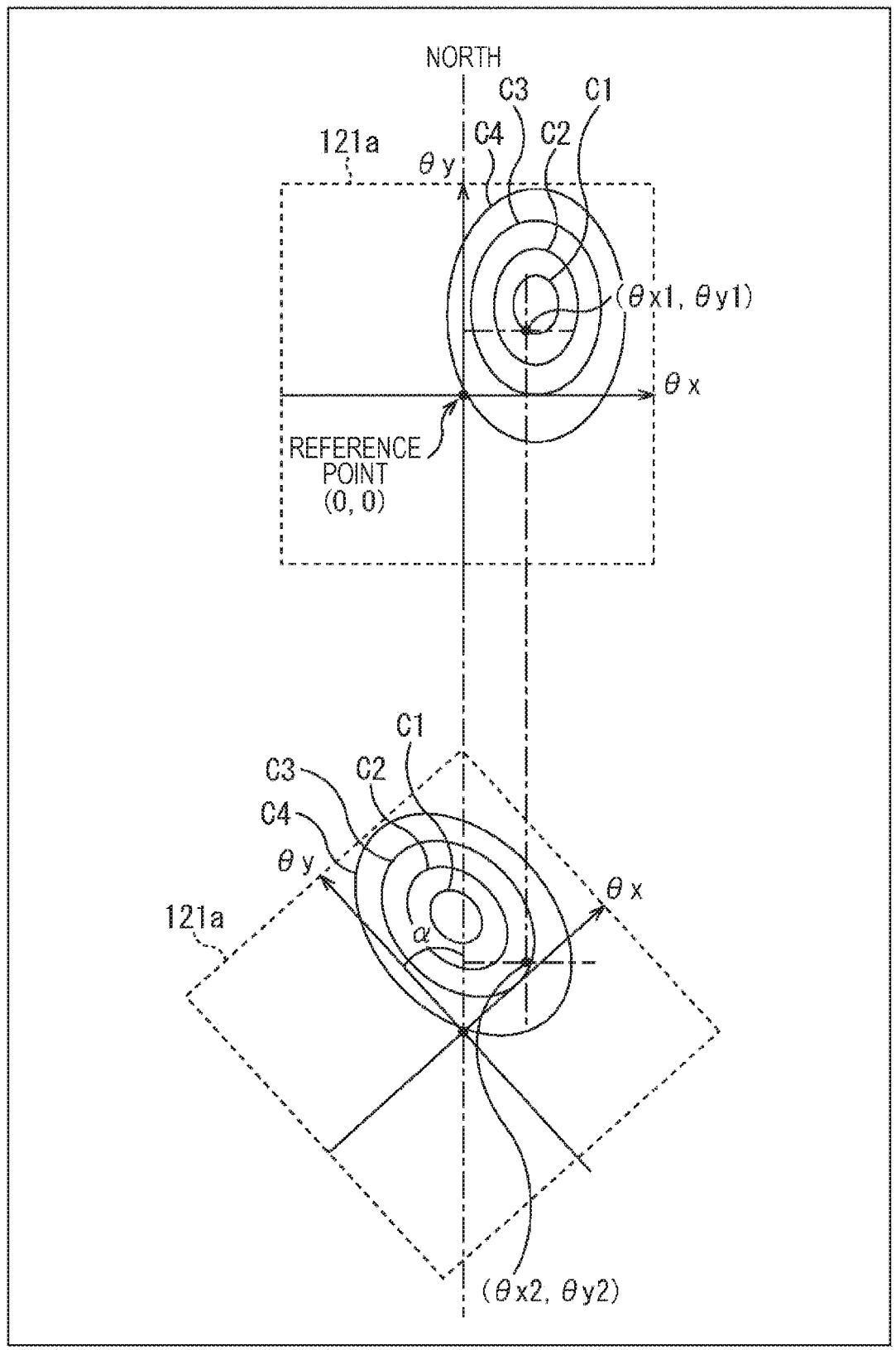
FIG. 46 is a view for illustrating a relationship between pixel orientation and a light-receiving sensitivity characteristic.

Upper and lower stages of FIG. 46 illustrate light-receiving sensitivity characteristics to an incident angle of incident light of a certain pixel 121a of an imaging element 121 as in the right part of FIG. 8. The upper stage of FIG. 46 illustrates the light-receiving sensitivity characteristic of the pixel 121a before rotation, and the lower stage illustrates the light-receiving sensitivity characteristic of the pixel 121a after the pixel 121a is rotated by an angle α around a reference point (0,0).

For example, the incident light incident on the pixel 121a before the rotation from a point light source P on a subject surface 31 at an incident angle (θx1, θy1) is incident on the pixel 121a after the rotation at an incident angle (θx2, θy2). Therefore, light-receiving sensitivity of the pixel 121a to the incident light changes before and after the rotation, and a detection signal level changes.

Therefore, it is necessary to adjust a coefficient also in a case where orientation of the imaging device 321 (imaging element 121) changes.

Therefore, in the fifth embodiment, the orientation of each imaging device 321 is further detected by each imaging device 321, and a signal processing device 332 obtains the coefficient used for restoring a restored image on the basis of a detection result to restore the restored image.

<Configuration Example of Imaging Device 321E>

Figure 47:
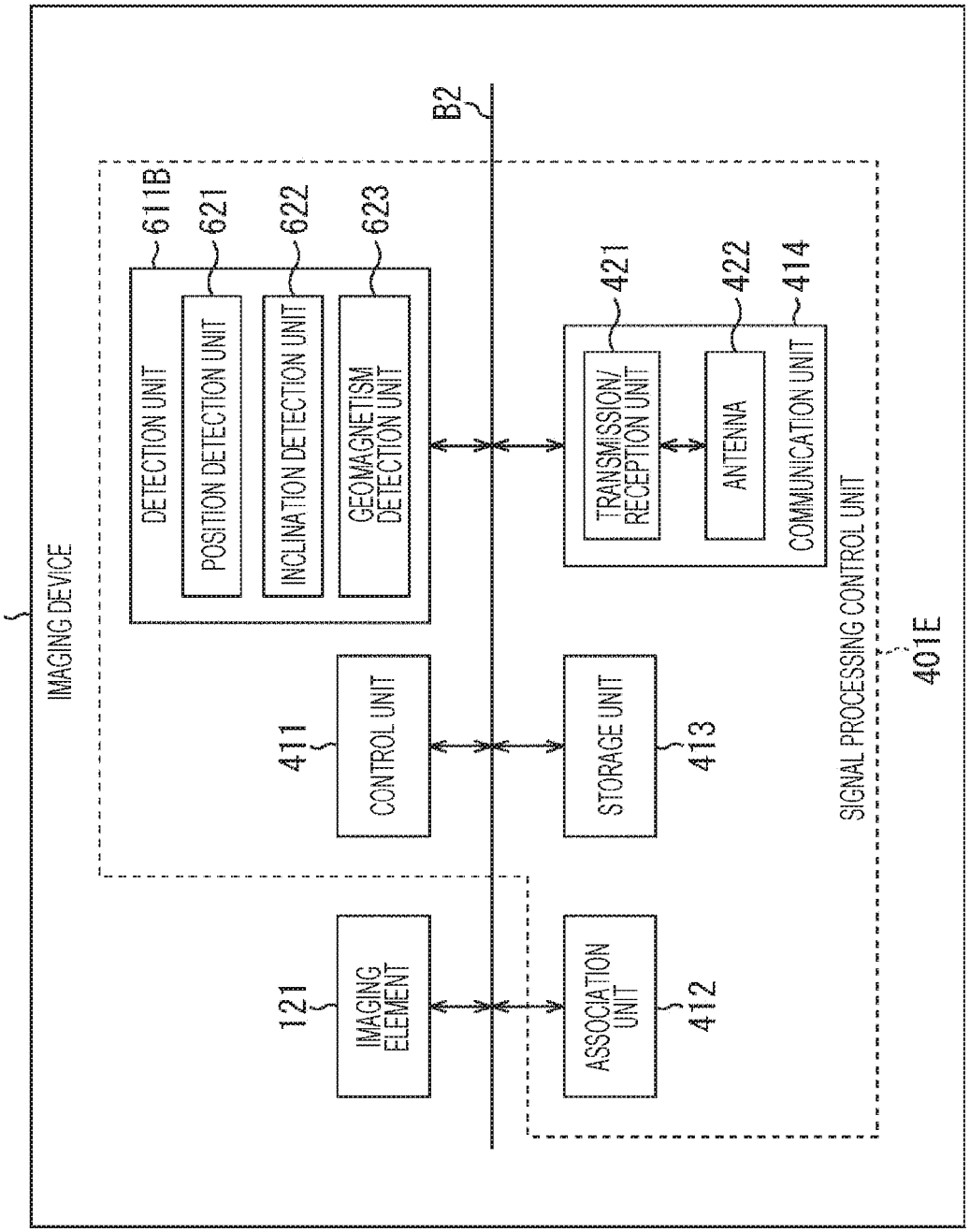
FIG. 47 is a block diagram illustrating a fifth embodiment of the imaging device in FIG. 26.

In the fifth embodiment, an imaging device 321E in FIG. 47 that is a fifth embodiment of the imaging device 321 is used in the imaging system 301 in FIG. 26. Note that, in FIG. 47, the same reference sign is assigned to a portion corresponding to that of the imaging device 321D in FIG. 41 and the description thereof is appropriately omitted.

The imaging device 321E is different from the imaging device 321D in that a signal processing control unit 401E is provided in place of the signal processing control unit 401D. The signal processing control unit 401E is different from the signal processing control unit 401D in that a detection unit 611B is provided in place of the detection unit 611A.

The detection unit 611B is different from the detection unit 611A in that a geomagnetism detection unit 623 is added.

The geomagnetism detection unit 623 detects orientation of the imaging device 321E such as east, west, south, and north. For example, orientation of a predetermined axis parallel to a light-receiving surface of the imaging element 121 of the imaging device 321E is detected as the orientation of the imaging device 321E. The geomagnetism detection unit 623 outputs direction information indicating the detected orientation to the bus B2.

Figure 48:
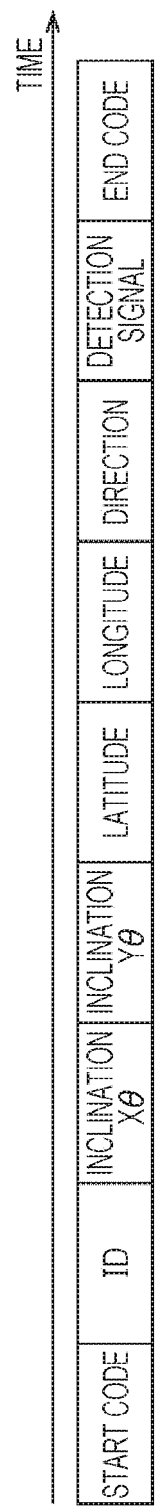
FIG. 48 is a view illustrating a third example of a data structure of a packet of imaging data.

FIG. 48 illustrates an example of a data configuration of a packet of imaging data transmitted from each imaging device 321E.

The data configuration of the packet in FIG. 48 is different from the data configuration of the packet in FIG. 44 in that a direction is added.

As the direction, the orientation of the imaging device 321E detected by the geomagnetism detection unit 623 of the imaging device 321E is set.

For example, in a case where the orientation of the imaging device 321E changes by an angle α with respect to a case where this is installed in the reference position, a change amount Δθx' of an incident angle θx in an X-axis direction and a change amount Δθy' of an incident angle θy in a Y-axis direction of a light beam on a light-receiving surface of an imaging element 121 from each point light source of a subject surface to be restored are expressed by following equations (11) and (12) by using the incident angle change amount Δθx of equation (9) and the incident angle change amount Δθy of equation (10) described above.

$$\Delta\theta x' = \Delta\theta x \times \cos\alpha - \Delta\theta y \times \sin\alpha \quad (11)$$

$$\Delta\theta y' = \Delta\theta x \times \sin\alpha + \Delta\theta y \times \cos\alpha \quad (12)$$

Then, a restoration unit 501 of the signal processing device 332 obtains a coefficient set group by using the incident angle change amount Δθx' in equation (11) and the incident angle change amount Δθy' in equation (12) in place of the incident angle change amount Δθx in equation (9) and the incident angle change amount Δθy in equation (10) and restores the restored image by using the obtained coefficient set group. Therefore, the restored image is restored using a more appropriate coefficient, and restoration accuracy and an image quality of the restored image are improved.

8. Sixth Embodiment

Next, a sixth embodiment of the present disclosure is described with reference to FIGS. 49 to 52.

<Configuration Example of Imaging Device 321F>

Figure 49:
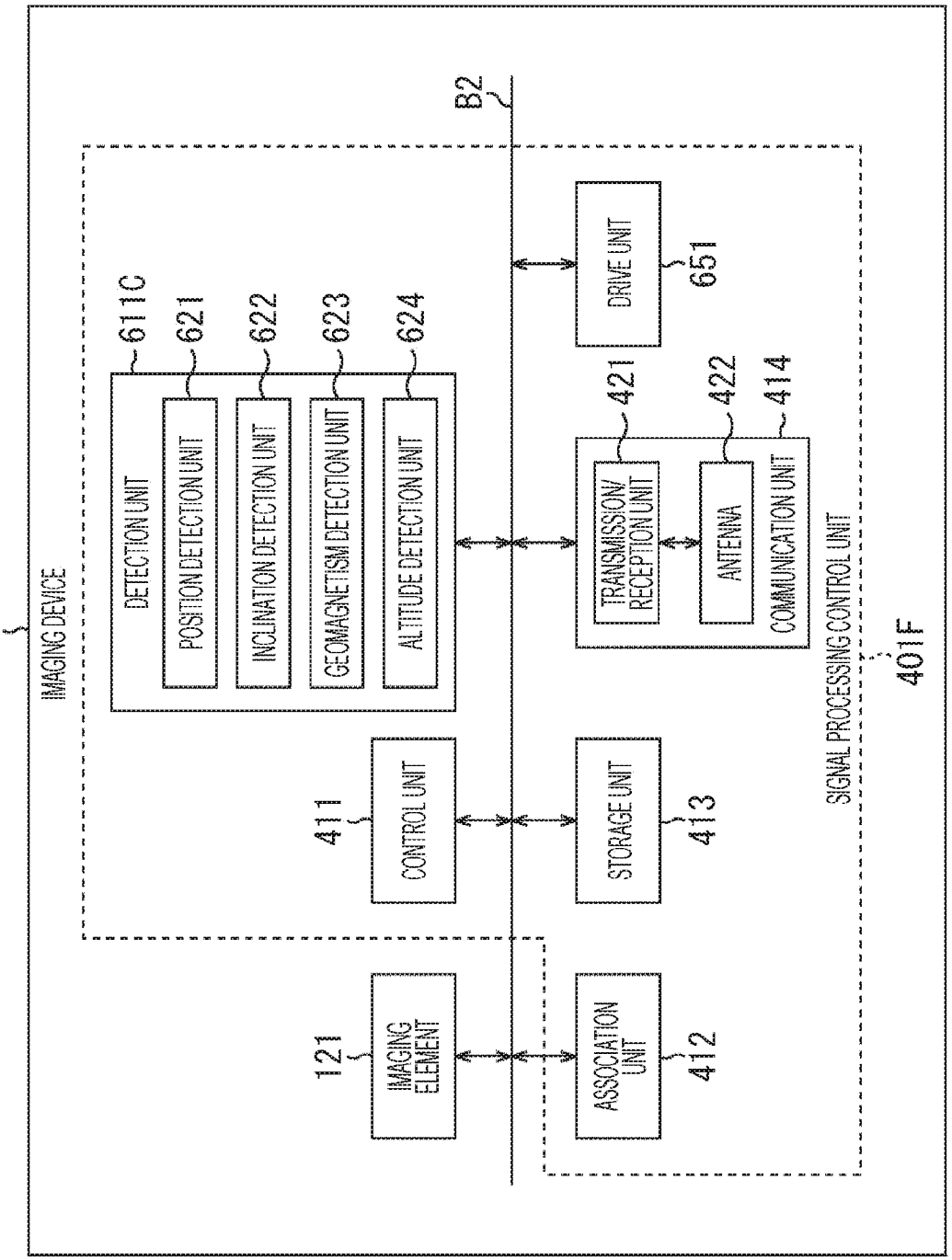
FIG. 49 is a block diagram illustrating a sixth embodiment of the imaging device in FIG. 26.

In the sixth embodiment of the present disclosure, an imaging device 321F in FIG. 49 that is a sixth embodiment of the imaging device 321 is used in the imaging system 301 in FIG. 26. Note that, in FIG. 49, the same reference sign is assigned to a portion corresponding to that of the imaging device 321E in FIG. 47 and the description thereof is appropriately omitted.

The imaging device 321F is different from the imaging device 321E in that a signal processing control unit 401F is provided in place of the signal processing control unit 401E. The signal processing control unit 401F is different from the signal processing control unit 401E in that a detection unit 611C is provided in place of the detection unit 611B, and a drive unit 651 is added.

The detection unit 611C is different from the detection unit 611B in that an altitude detection unit 624 is added.

The altitude detection unit 624 includes an altitude sensor, for example. The altitude detection unit 624 detects an altitude of a position in which the imaging device 321F is installed, and outputs altitude information indicating the detected altitude to a bus B2.

The drive unit 651 includes, for example, a drive mechanism that moves (changes) the position and attitude of the imaging device 321F. For example, the drive unit 651 includes a wheel that moves the imaging device 321F on land, a propeller that moves the same in the air and the like. Alternatively, for example, the drive unit 651 includes an actuator and the like that moves orientation and inclination of the imaging device 321F. With this drive unit 651, the imaging device 321F may change the position and attitude by itself.

<Processing of Imaging System 301>

Next, processing of the imaging system 301 is described with reference to FIGS. 50 to 52.

<Processing of Signal Processing Unit 312>

First, processing of a signal processing unit 312 is described with reference to FIG. 50.

At step S301, the signal processing unit 312 transmits a driving command.

Specifically, a control unit 502 of the signal processing device 332 generates the driving command and codes the generated driving command. The driving command includes, for example, a movement instruction regarding movement of at least one of the position or attitude of the imaging device 321F to be driven, and an ID of the imaging device 321F to be driven.

Note that, the movement instruction may be indicated by absolute position and attitude, or may be indicated by relative position and attitude. In the former case, for example, the position or attitude with which the imaging device 321F is moved is indicated by an absolute numerical value (for example, latitude, longitude, direction, angle with respect to a gravity direction and the like). In the latter case, for example, a moving direction and a moving amount with respect to current position or attitude of the imaging device 321F are illustrated.

The control unit 502 supplies the coded driving command to a reader/writer 331 via a communication unit 509.

The reader/writer 331 starts transmitting a carrier wave including an electromagnetic wave, and transmits the driving command to each imaging device 321F by modulating the carrier wave with the coded driving command.

Note that, one driving command may include the movement instructions for a plurality of imaging devices 321F, or the driving command may be individually transmitted to each imaging device 321F to be driven. In the latter case, for example, when the positions or attitudes of the plurality of imaging devices 321F are changed, a plurality of driving commands is transmitted at step S301.

The imaging device 321F to be driven changes the position or attitude in accordance with the instruction by the driving command at step S353 in FIG. 52 to be described later.

Note that, in a case where it is not necessary to change the position and attitude of each imaging device 321F, the processing at step S301 may be omitted.

At step S302, an imaging command is transmitted as in the processing at step S101 in FIG. 34.

At step S303, imaging data is received from each imaging device 321F as in the processing at step S102 in FIG. 34.

However, a data configuration of a packet of the imaging data is different from that in the processing at step S102 in FIG. 34.

Figure 51:
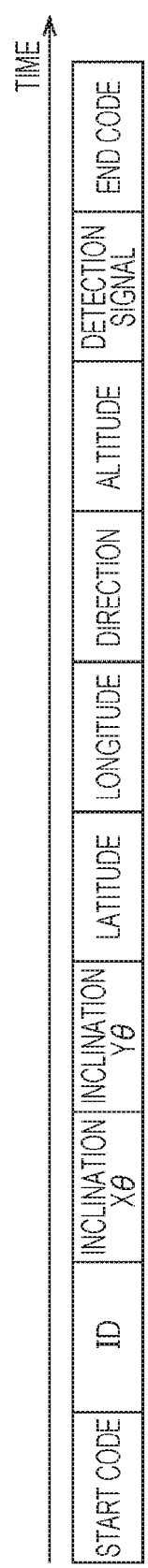
FIG. 51 is a view illustrating a fourth example of a data structure of a packet of imaging data.

FIG. 51 illustrates an example of the data configuration of the packet of the imaging data used in the sixth embodiment.

The data configuration of the packet in FIG. 51 is different from the data configuration of the packet in FIG. 48 in that the altitude is added.

As the altitude, the altitude of the imaging device 321F detected by the altitude detection unit 624 of the imaging device 321F is set.

At step S304, as in the processing at step S203 in FIG. 43, a coefficient used for image restoration is obtained. However, a restoration unit 501 calculates an incident angle change amount Δθx and an incident angle change amount Δθy in further consideration of the altitude of the imaging device 321F by using, for example, following equations (13) and (14) in place of equations (9) and (10) described above.

$$\Delta\theta x = \mathrm{atan}((\text{longitude after movement} - \text{reference longitude})/(\text{subject distance} - \text{altitude})) + X\theta \quad (13)$$

$$\Delta\theta y = \mathrm{atan}((\text{latitude after movement} - \text{reference latitude})/(\text{subject distance} - \text{altitude})) + Y\theta \quad (14)$$

Moreover, the restoration unit 501 calculates an incident angle change amount Δθx' and an incident angle change amount Δθy' using equations (11) and (12) described above. Then, the restoration unit 501 reads out a coefficient set group corresponding to the set subject distance and the incident angle change amounts Δθx' and Δθy' from a storage unit 506.

At step S305, as in the processing at step S104 in FIG. 34, image restoration is performed using a detection signal set and the coefficient.

At step S306, as in the processing at step S105 in FIG. 34, various types of processing are performed on the restored image.

Thereafter, the processing of the signal processing unit 312 ends.

<Processing of Imaging Device 321F>

Figure 50:
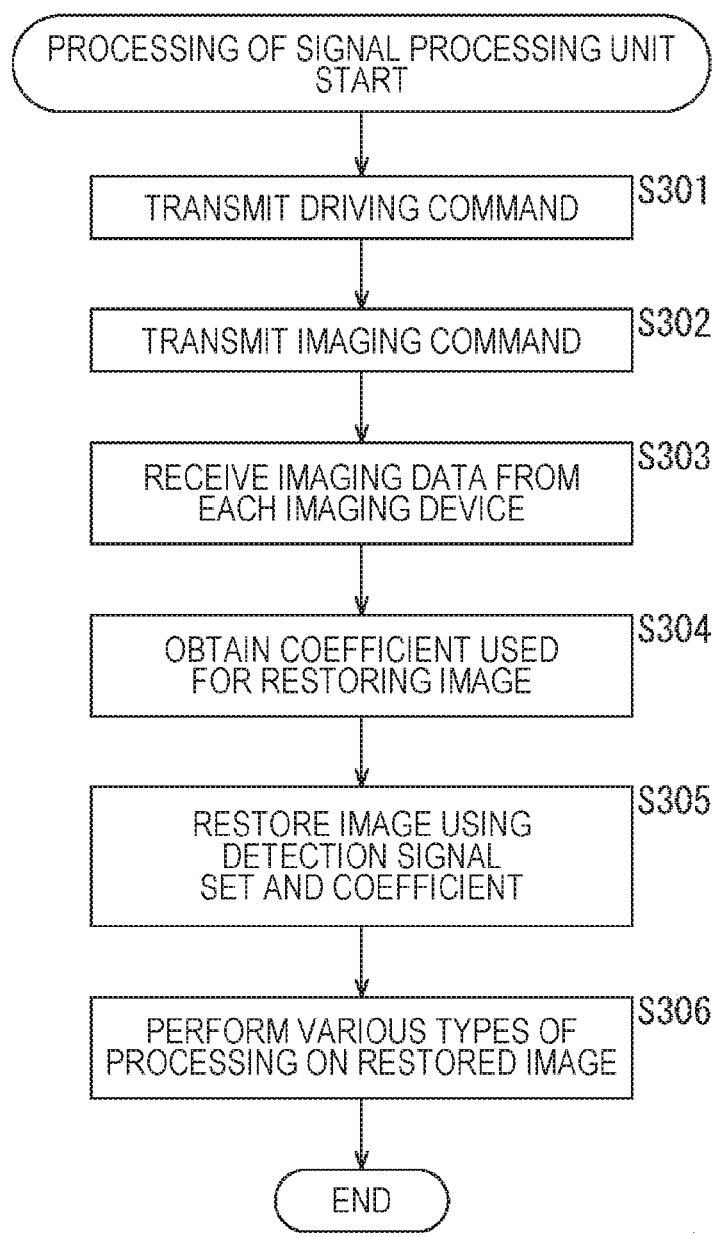
FIG. 50 is a flowchart for illustrating a third embodiment of processing of a signal processing unit in FIG. 26.
Figure 52:
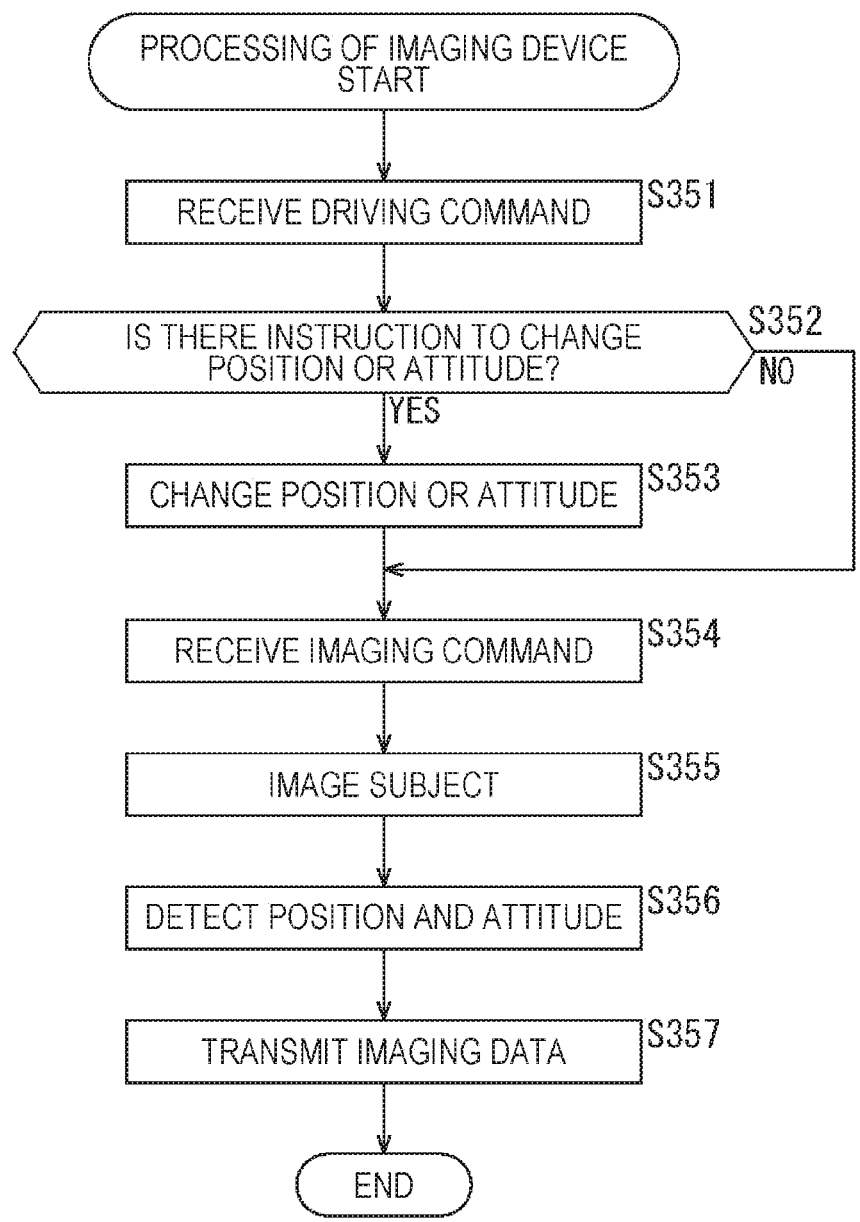
FIG. 52 is a flowchart for illustrating processing of the imaging device in FIG. 49.

Next, with reference to a flowchart in FIG. 52, processing executed by each imaging device 321F corresponding to the processing of the signal processing unit 312 in FIG. 50 is described.

At step S351, the imaging device 321F receives the driving command. Specifically, an antenna 422 of the imaging device 321F receives the electromagnetic wave of which transmission from the reader/writer 331 is started at step S301 in FIG. 50 and converts the received electromagnetic wave into electric power to supply to each unit of the imaging device 321F. Therefore, each unit of the imaging device 321F is activated.

Next, the transmission/reception unit 421 demodulates the electromagnetic wave received from the reader/writer 331 via the antenna 422, and supplies the coded data obtained as a result to the control unit 411.

The control unit 411 obtains the driving command by decoding the coded data.

At step S352, the control unit 411 determines whether or not there is an instruction to change the position or attitude. For example, in a case where the ID of the imaging device to be driven included in the driving command coincides with its own ID, the control unit 411 determines that there is the instruction to change the position or attitude, and the procedure shifts to step S353.

At step S353, the imaging device 321F changes the position or attitude. Specifically, the control unit 411 controls the drive unit 651 to move the position or attitude of the imaging device 321F in accordance with the movement instruction included in the driving command.

Thereafter, the procedure shifts to step S354.

In contrast, at step S352, for example, in a case where the ID of the imaging device to be driven included in the driving command does not coincide with its own ID, the control unit 411 determines that there is not the instruction to change the position or attitude, the processing at step S353 is skipped, and the procedure shifts to step S354.

At step S354, the imaging command is received as in the processing at step S151 in FIG. 36.

At step S355, a subject is imaged as in the processing at step S152 in FIG. 36.

At step S356, the detection unit 611C detects the position and attitude. Specifically, a position detection unit 621 detects the latitude and longitude of the current position of the imaging device 321F, and outputs the detected position information to the bus B2. An inclination detection unit 622 detects inclinations Xθ and Yθ of a light-receiving surface of an imaging element 121 of the imaging device 321F, and outputs the detected inclination information to the bus B2. A geomagnetism detection unit 623 detects the orientation of the imaging device 321F and outputs the detected direction information to the bus B2. The altitude detection unit 624 detects the altitude of the imaging device 321F and outputs the detected altitude information to the bus B2.

At step S357, the imaging data is transmitted as in the processing at step S153 in FIG. 36. However, unlike the processing at step S153, the imaging data is transmitted using the packet in FIG. 51.

Thereafter, the processing of the imaging device 321F ends.

As described above, it is possible to image a desired subject while moving the position and attitude of each imaging device 321F by remote operation.

Furthermore, since the coefficient is obtained in further consideration of the altitude of the imaging device 321F, the restored image is restored using a more appropriate coefficient, and restoration accuracy and an image quality of the restored image are improved.

Note that, although the example in which the driving command and the imaging command are continuously transmitted is described above, the driving command and the imaging command may be transmitted at different timings. That is, the movement of the position or attitude of each imaging device 321F and imaging processing may be performed at different timings.

Furthermore, for example, each imaging device 321F may autonomously change the position or attitude without being instructed by the signal processing unit 312. In this case, each imaging device 321F needs to be able to operate without receiving the electric power from the reader/writer 331.

Therefore, for example, the power supply unit 451 in FIG. 37 or the power supply unit 461 in FIG. 38 may be provided in each imaging device 321F. Alternatively, for example, an external DC power supply may be mounted on each imaging device 321F, or the electric power may be externally supplied via a power supply line.

9. Seventh Embodiment

Figure 53:
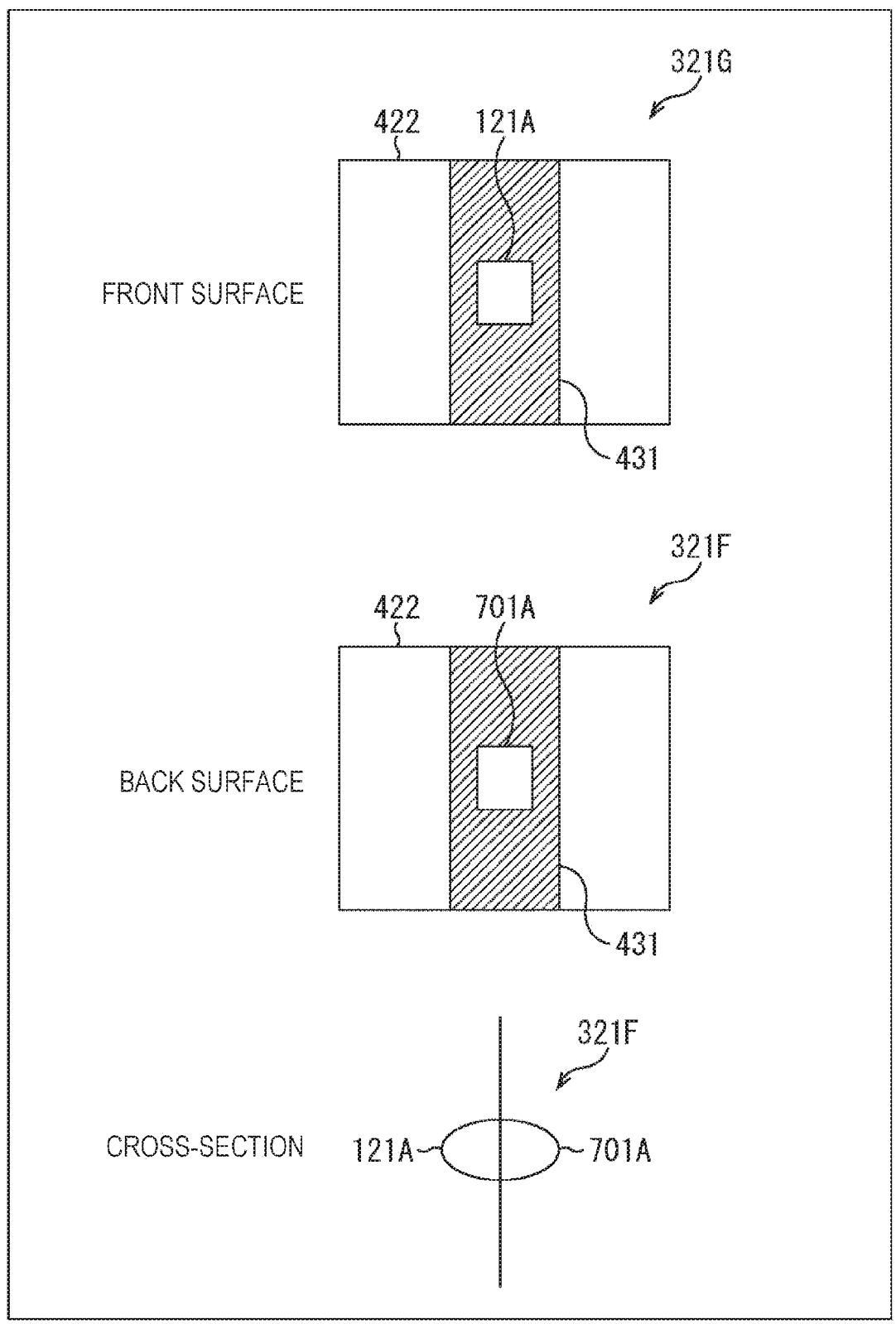
FIG. 53 is a schematic diagram illustrating a configuration example of an appearance of a seventh embodiment of the imaging device in FIG. 26.

Next, with reference to FIG. 53, a seventh embodiment of the present disclosure is described.

<Configuration Example of Imaging Device 321G>

In the seventh embodiment, an imaging device 321G in FIG. 53 that is a seventh embodiment of the imaging device 321 is used as the imaging device 321 in the imaging system 301 in FIG. 26.

As described above, it is assumed that the imaging devices 321 are disorderly distributed to be used. However, in a case where the imaging devices 321 are distributed, a light-receiving surface 121A of an imaging element 121 does not necessarily face up. For example, if the light-receiving surface 121A of the imaging element 121 faces the ground, an effective detection signal set cannot be obtained from the imaging device 321.

Therefore, for example, a countermeasure such as attaching a weight to a back surface of the imaging device 321 and the like is conceivable such that the light-receiving surface 121A of the imaging element 121 always faces up. However, even if the weight is attached to the imaging device 321, the light-receiving surface 121A of the imaging element 121 does not always face up, and size and weight of the imaging device 321 increase.

In contrast, in the imaging device 321G, in addition to the light-receiving surface 121A of the imaging element 121 on a front surface, a light-receiving surface 701A of an imaging element 701 (not illustrated) having a configuration similar to that of the imaging element 121 is provided on a back surface (surface opposite to the front surface). Therefore, the imaging device 321F may image a subject and obtain the effective detection signal set regardless of the surface out of the front surface and the back surface that faces the front.

Note that, the imaging device 321G may determine which of the imaging element 121 and the imaging element 701 is effective, and may transmit imaging data including only the detection signal set of the imaging element determined to be effective. For example, the imaging device 321G may determine that the imaging element having a larger detection signal level average value out of the detection signal sets of the two imaging elements is effective, and transmit the imaging data including only the detection signal set of the imaging element determined to be effective.

Alternatively, the imaging device 321G may always transmit the imaging data including the detection signal sets of both the imaging elements, and the signal processing device 332 may determine which detection signal set is effective.

Furthermore, the imaging element 121 and the imaging element 701 may be formed using one imaging element. In this case, for example, the imaging element has a configuration bent at 180°, and a pixel array unit on one surface and the pixel array unit on the other surface may operate independently.

Moreover, the imaging device 321F may be formed by using a polyhedron having three or more surfaces with different directions such as a regular tetrahedron or a regular hexahedron, and the light-receiving surface of the imaging element may be provided on each surface.

10. Variation

Hereinafter, a variation of the embodiments of the present disclosure described above is described.

<Variation regarding Imaging Device and Imaging Element>

Characteristics of the imaging devices 321A to 321F described above may be combined in a possible range.

For example, the altitude detection unit 624 of the imaging device 321F in FIG. 49 may be added to the imaging device 321E in FIG. 47. Alternatively, for example, the imaging device 321D in FIG. 41, the imaging device 321E in FIG. 47, or the imaging device 321F in FIG. 49 may be provided with the power supply unit 451 of the imaging device 321B in FIG. 37 or the power supply unit 461 of the imaging device 321C in FIG. 38.

Furthermore, for example, in a case where the imaging device 321 is driven by electric power supplied from a reader/writer 331 or electric power generated by solar power generation, a case where sufficient electric power cannot be obtained is assumed. For this, in a case where the sufficient electric power cannot be obtained, some of pixels 121a may be made ineffective.

Figure 54:
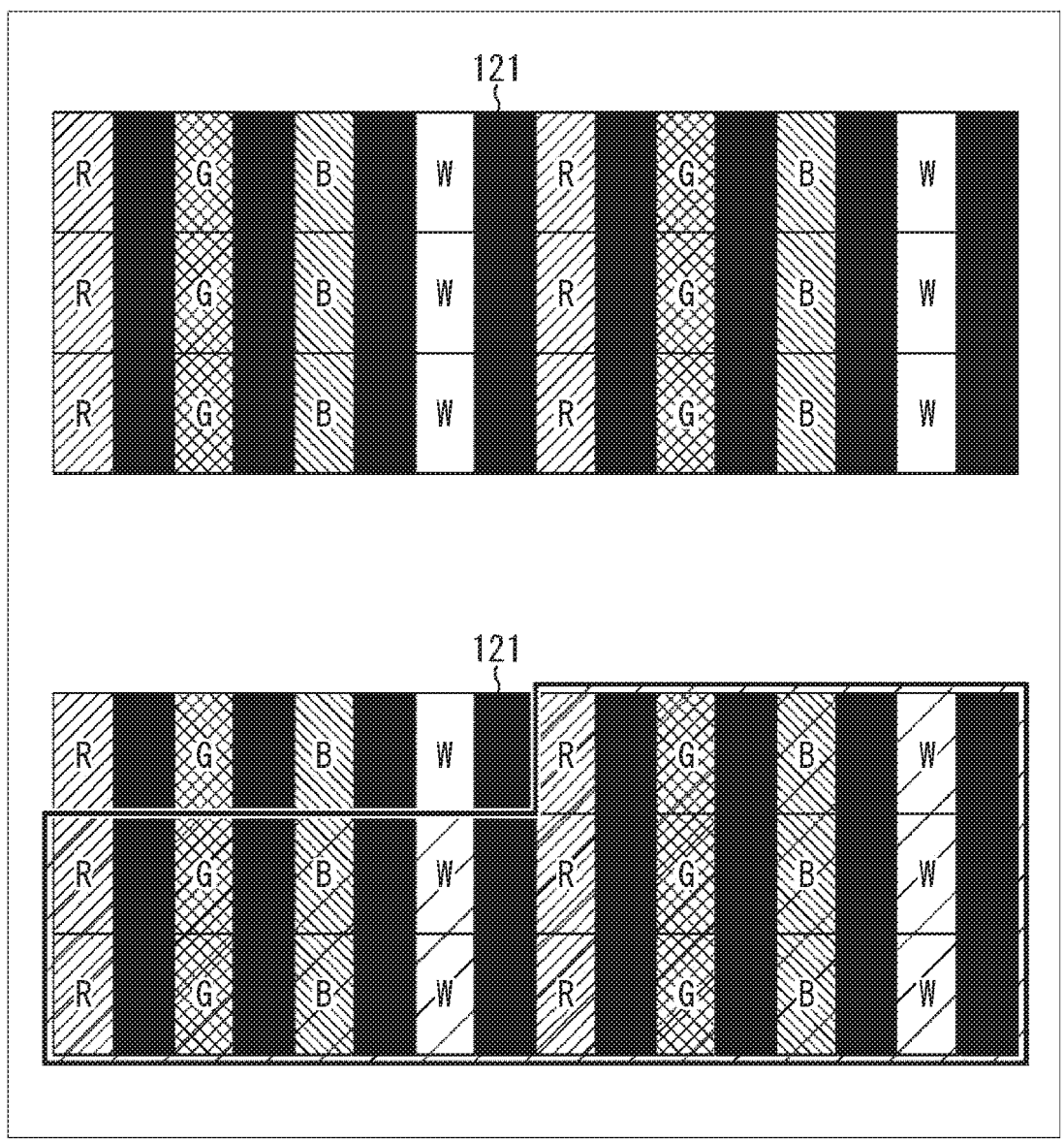
FIG. 54 is a view for illustrating an example of a countermeasure in a case where electric power is insufficient.

For example, upper and lower stages of FIG. 54 illustrate examples of a pattern of a pixel array unit of an imaging element 121. In this example, a pixel block of one row×four columns of an R pixel provided with a red color filter, a G pixel provided with a green color filter, a B pixel provided with a blue color filter, and a W pixel provided with a white color filter is made one unit, and the pixel blocks are arranged in three rows×two columns. Furthermore, a black portion of each pixel 121a indicates a light-shielding film 121b. Note that, in this example, a light-shielding range of the light-shielding film 121b of all the pixels 121a is set to the same range, but this is not necessarily set to the same range.

For example, in a case where the electric power supply is sufficient, all the pixels 121a are made effective as illustrated in the upper stage. That is, detection signals of all the pixels 121a are read out to be externally transmitted.

On the other hand, in a case where the electric power supply is insufficient, some pixels 121a are made ineffective as illustrated in the upper stage. In this example, the pixels 121a in five pixel blocks enclosed by a bold frame are made ineffective.

Here, to make the pixel 121a ineffective is, for example, to stop reading out the detection signal of the pixel 121a. For example, by stopping AD conversion of the detection signal of the ineffective pixel 121a, readout of the detection signal is stopped.

Note that, the detection signal of the ineffective pixel 121a may be externally transmitted or not. In a case where this is externally transmitted, for example, a signal having a predetermined dummy value is transmitted as the detection signal of the ineffective pixel 121a.

Therefore, even in a case where the electric power supply is insufficient, a part of the detection signals may be supplied to a signal processing device 332, and restoration of the image may be continued.

Note that, the number of pixels 121a made ineffective may be changed according to an amount of power shortage.

Furthermore, for example, a shape other than the above-described lateral band-type, longitudinal band-type, L-shaped type, and type provided with a rectangular opening may be adopted as the shape of the light-shielding film 121b of each pixel 121a.

Moreover, for example, in the imaging element 121 described above with reference to FIG. 5, the example in which four photodiodes 121f of two rows×two columns are provided in one pixel 121a is illustrated, but the number and arrangement of the photodiodes 121f are not limited to this example.

Figure 55:
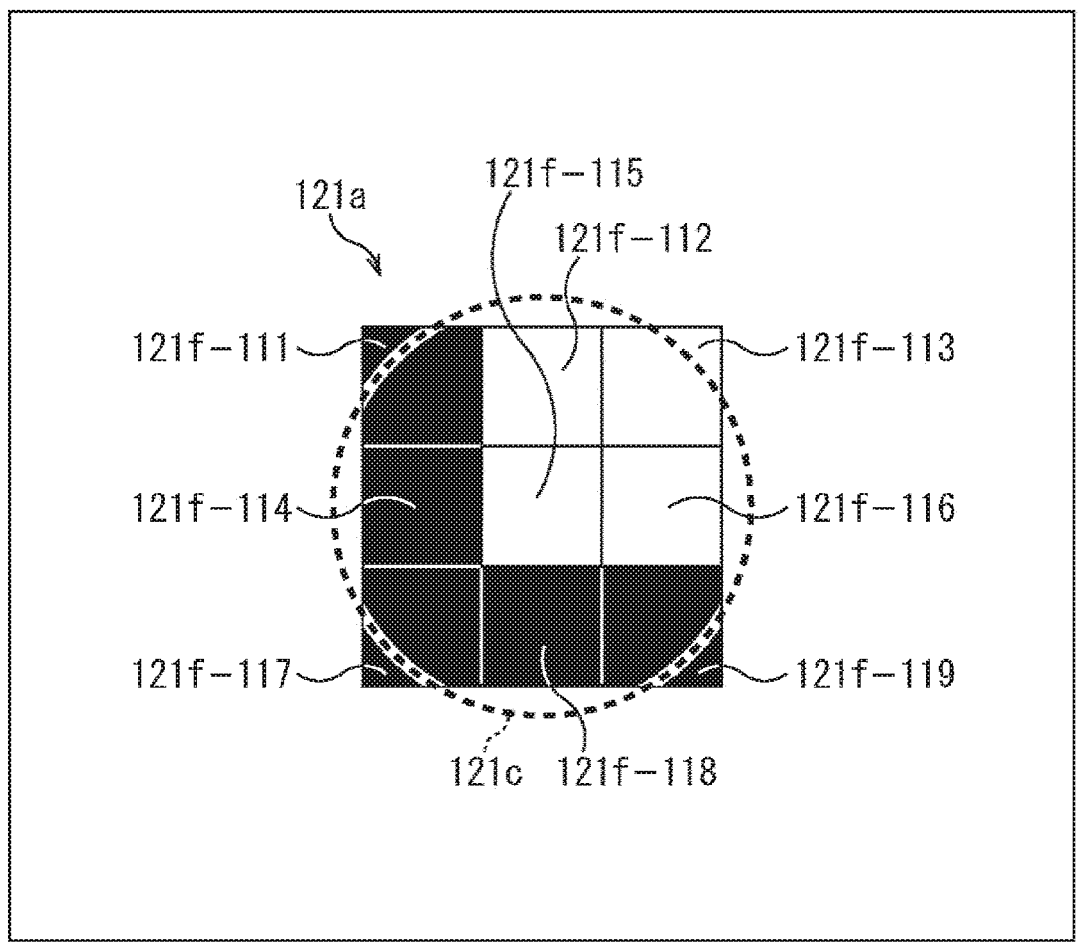
FIG. 55 is a view illustrating a variation of the imaging element in FIG. 5.

For example, as illustrated in FIG. 55, in one pixel 121a, nine photodiodes 121f-111 to 121f-119 arranged in three rows×three columns may be provided, for example, for one on-chip lens 121c. That is, one pixel output unit may include the nine photodiodes 121f.

Then, for example, by not reading out the signals of the five pixels of the photodiodes 121f-111, 121f-114, and 121f-117 to 121f-119, an incident angle characteristic similar to that of the pixel 121a including the L-shaped light-shielding film 121b in which the light-shielding film 121b is set in a range of the photodiodes 121*f*-111, 121*f*-114, and 121*f*-117 to 121*f*-119 may be substantially obtained.

In this manner, it is possible to obtain the incident angle characteristic similar to that in a case where the light-shielding film 121*b* is provided without providing the light-shielding film 121*b*. Furthermore, by switching a pattern of the photodiodes 121*f* from which no signal is read out, incident angle directivity may be changed as in a case where the position and range light-shielded by the light-shielding film 121*b* are changed.

Furthermore, in the above description, the example in which one pixel 121*a* forms one pixel output unit is illustrated; however, it is also possible that a plurality of pixels 121*a* forms one pixel output unit.

Figure 56:
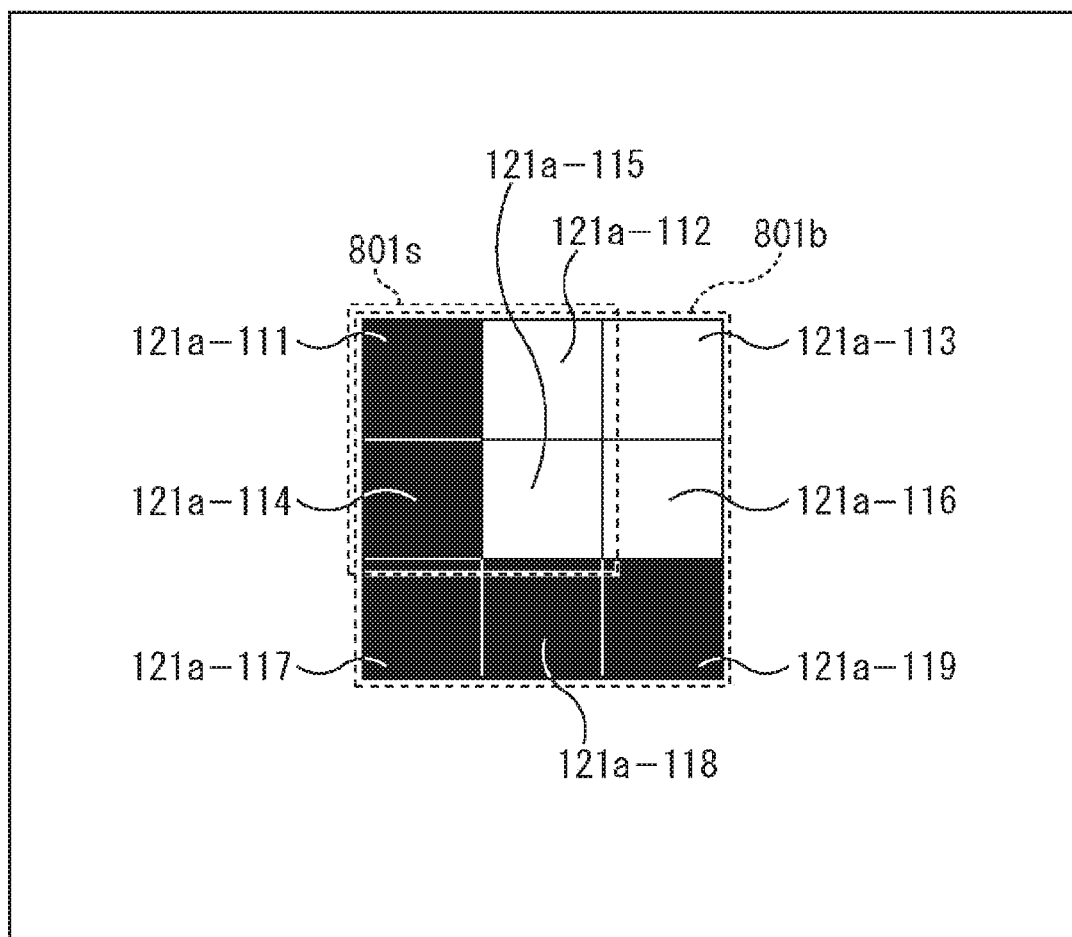
FIG. 56 is a view for illustrating a variation of a pixel output unit.

For example, as illustrated in FIG. 56, the pixels 121*a*-111 to 121*a*-119 arranged in three rows×three columns may form one pixel output unit 801*b*. Note that, each of the pixels 121*a*-111 to 121*a*-119 includes, for example, one photodiode and does not include the on-chip lens.

For example, by adding a pixel signal from each pixel 121*a*, the detection signal of one pixel of a detection image may be generated, and by stopping or not adding an output of pixel signals from some pixels 121*a*, the incident angle directivity of a pixel output unit 801*b* may be realized. For example, by adding the pixel signals of the pixels 121*a*-112, 121*a*-113, 121*a*-115, and 121*a*-116 to generate the detection signal, the incident angle directivity similar to that in a case of providing the L-shaped light-shielding film 121*b* in a range of the pixels 121*a*-111, 121*a*-114, and 121*a*-117 to 121*a*-119 may be obtained.

Furthermore, by switching the pattern of the pixel 121*a* the pixel signal of which is added to the detection signal, the incident angle directivity may be set to a different value as in a case where the position and range light-shielding by the light-shielding film 121*b* are changed.

Furthermore, in this case, for example, it is possible to change the range of the pixel output unit by changing a combination of the pixels 121*a*. For example, the pixels 121*a* of two rows×two columns including the pixels 121*a*-111, 121*a*-112, 121*a*-114, and 121*a*-115 may form a pixel output unit 801*s*.

Moreover, for example, by recording the pixel signals of all the pixels 121*a* and later setting the combination of the pixels 121*a*, it is possible to set the range of the pixel output unit later. Moreover, by selecting the pixel 121*a* the pixel signal of which is added to the detection signal out of the pixels 121*a* in the set pixel output unit, the incident angle directivity of the pixel output unit may be set later.

Figure 57:
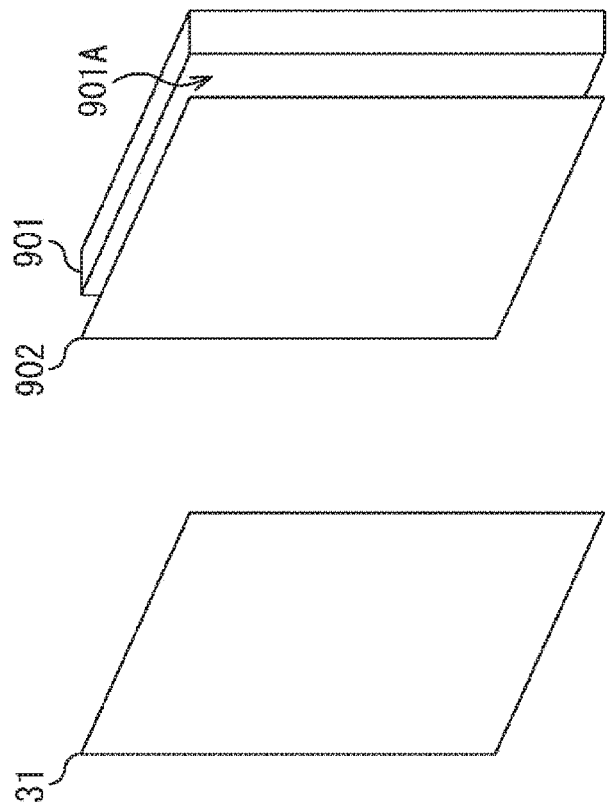
FIG. 57 is a view illustrating a variation of the imaging element.

Furthermore, although the example of providing the different incident angle directivities to the respective pixels by using the light-shielding film 121*b* as the modulation element and changing the combination of the photodiodes contributing to the output is illustrated in FIG. 4, in the present disclosure, it is also possible to provide the incident angle directivity to each pixel by using an optical filter 902 covering a light-receiving surface of an imaging element 901 as the modulation element as illustrated in FIG. 57, for example.

Specifically, the optical filter 902 is arranged so as to cover an entire surface of a light-receiving surface 901A at a predetermined interval from the light-receiving surface 901A of the imaging element 901. Light from a subject surface 31 is modulated by the optical filter 902 to be incident on the light-receiving surface 901A of the imaging element 901.

Figure 58:
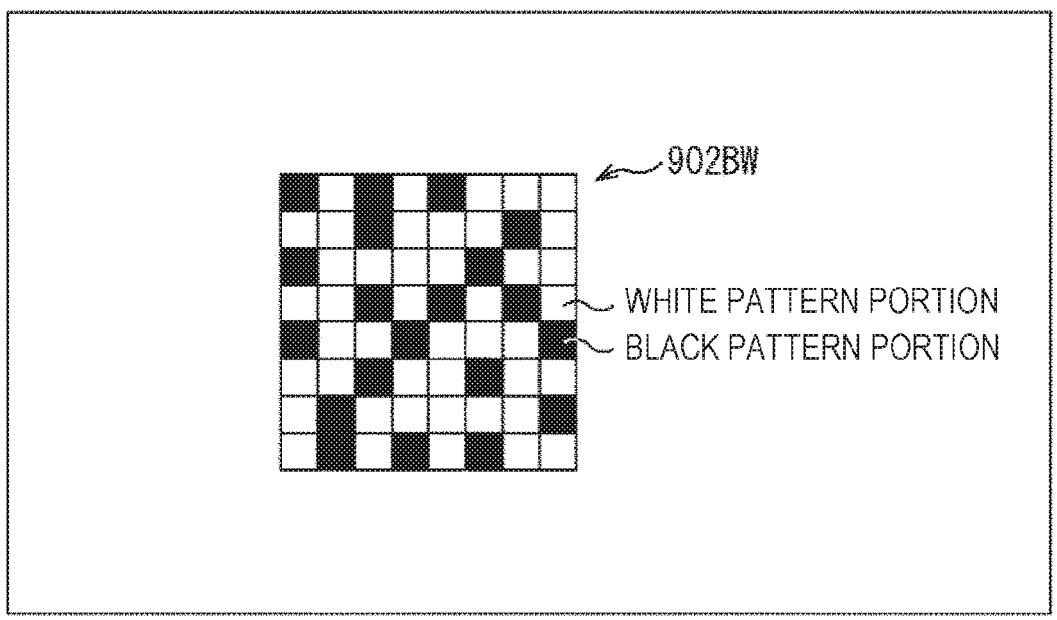
FIG. 58 is a view illustrating a variation of the imaging element.

For example, as the optical filter 902, an optical filter 902BW having a black and white lattice pattern illustrated in FIG. 58 may be used. In the optical filter 902BW, a white pattern portion that transmits light and a black pattern portion that blocks light are randomly arranged. A size of each pattern is set independently of a pixel size of the imaging element 901.

Figure 59:
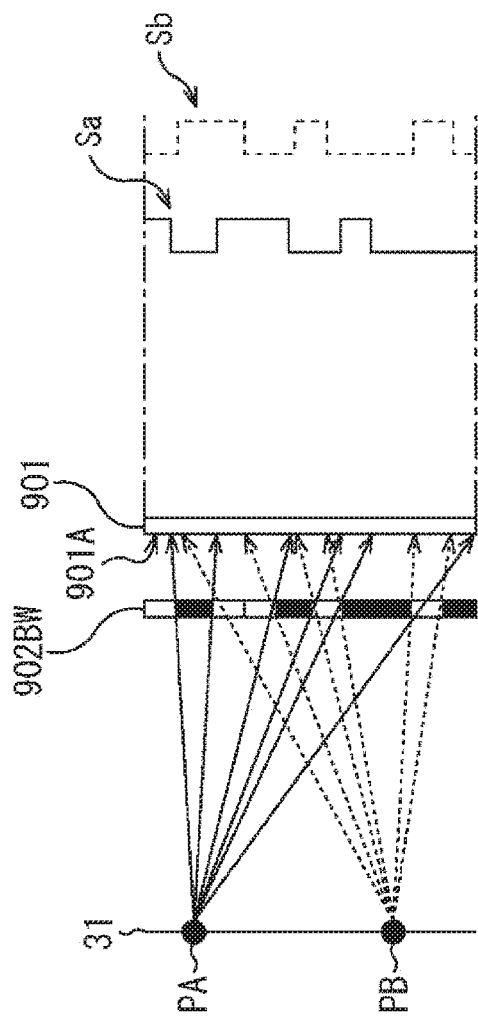
FIG. 59 is a view illustrating a variation of the imaging element.

FIG. 59 illustrates a light-receiving sensitivity characteristic of the imaging element 901 to light from a point light source PA and light from a point light source PB on the subject surface 31 in a case where the optical filter 902BW is used. The light from the point light source PA and the light from the point light source PB are modulated by the optical filter 902BW to be incident on the light-receiving surface 901A of the imaging element 901.

For example, the light-receiving sensitivity characteristic of the imaging element 901 to the light from the point light source PA is as a waveform Sa. That is, since a shadow is generated by the black pattern portion of the optical filter 902BW, a shaded pattern is generated in an image on the light-receiving surface 901A for the light from the point light source PA. Similarly, the light-receiving sensitivity characteristic of the imaging element 901 to the light from the point light source PB is as a waveform Sb. That is, since a shadow is generated by the black pattern portion of the optical filter 902BW, a shaded pattern is generated in an image on the light-receiving surface 901A for the light from the point light source PB.

Note that, the light from the point light source PA and the light from the point light source PB have different incident angles with respect to each white pattern portion of the optical filter 902BW, so that there is a shift in appearance of the shaded pattern on the light-receiving surface. Therefore, each pixel of the imaging element 901 has the incident angle directivity to each point light source on the subject surface 31.

This method is disclosed in detail, for example, in Non-Patent Document 1 described above.

Figure 60:
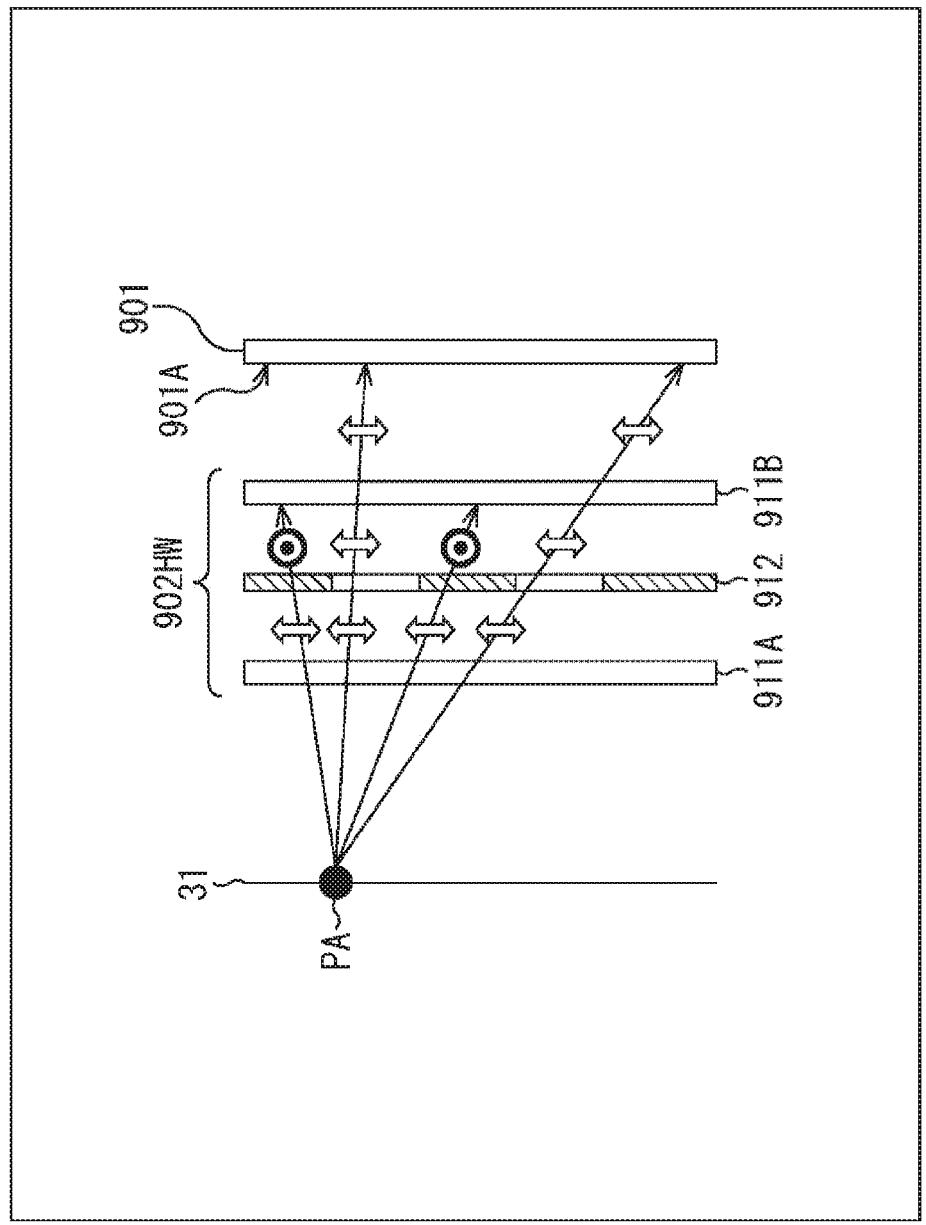
FIG. 60 is a view illustrating a variation of the imaging element.

Note that, an optical filter 902HW in FIG. 60 may be used in place of the black pattern portion of the optical filter 902BW. The optical filter 902HW includes linear polarizing elements 911A and 911B having the same polarizing direction, and a half-wavelength plate 912, and the half-wavelength plate 912 is interposed between the linear polarizing elements 911A and 911B. The half-wavelength plate 912 includes a polarizing portion indicated by oblique lines in place of the black pattern portion of the optical filter 902BW, and the white pattern portion and the polarizing portion are randomly arranged.

The linear polarizing element 911A transmits only light in a predetermined polarizing direction out of substantially non-polarized light emitted from the point light source PA. Hereinafter, it is assumed that the linear polarizing element 911A transmits only light the polarizing direction of which is parallel to the drawing. Out of polarized light transmitted through the linear polarizing element 911A, the polarized light transmitted through the polarizing portion of the half-wavelength plate 912 is such that a polarizing surface is rotated and the polarizing direction changes in a direction perpendicular to the drawing. On the other hand, out of the polarized light transmitted through the linear polarizing element 911A, the polarized light transmitted through the white pattern portion of the half-wavelength plate 912 is such that the polarizing direction remains unchanged from the direction parallel to the drawing. Then, the linear polarizing element 911B transmits the polarized light transmitted through the white pattern portion and hardly transmits the polarized light transmitted through the polarizing portion. Accordingly, an amount of polarized light transmitted through the polarizing portion is reduced as compared to the polarized light transmitted through the white pattern portion. Therefore, a shaded pattern substantially similar to that in a case of using the optical filter BW is generated on the light-receiving surface 901A of the imaging element 901.

Figure 61:
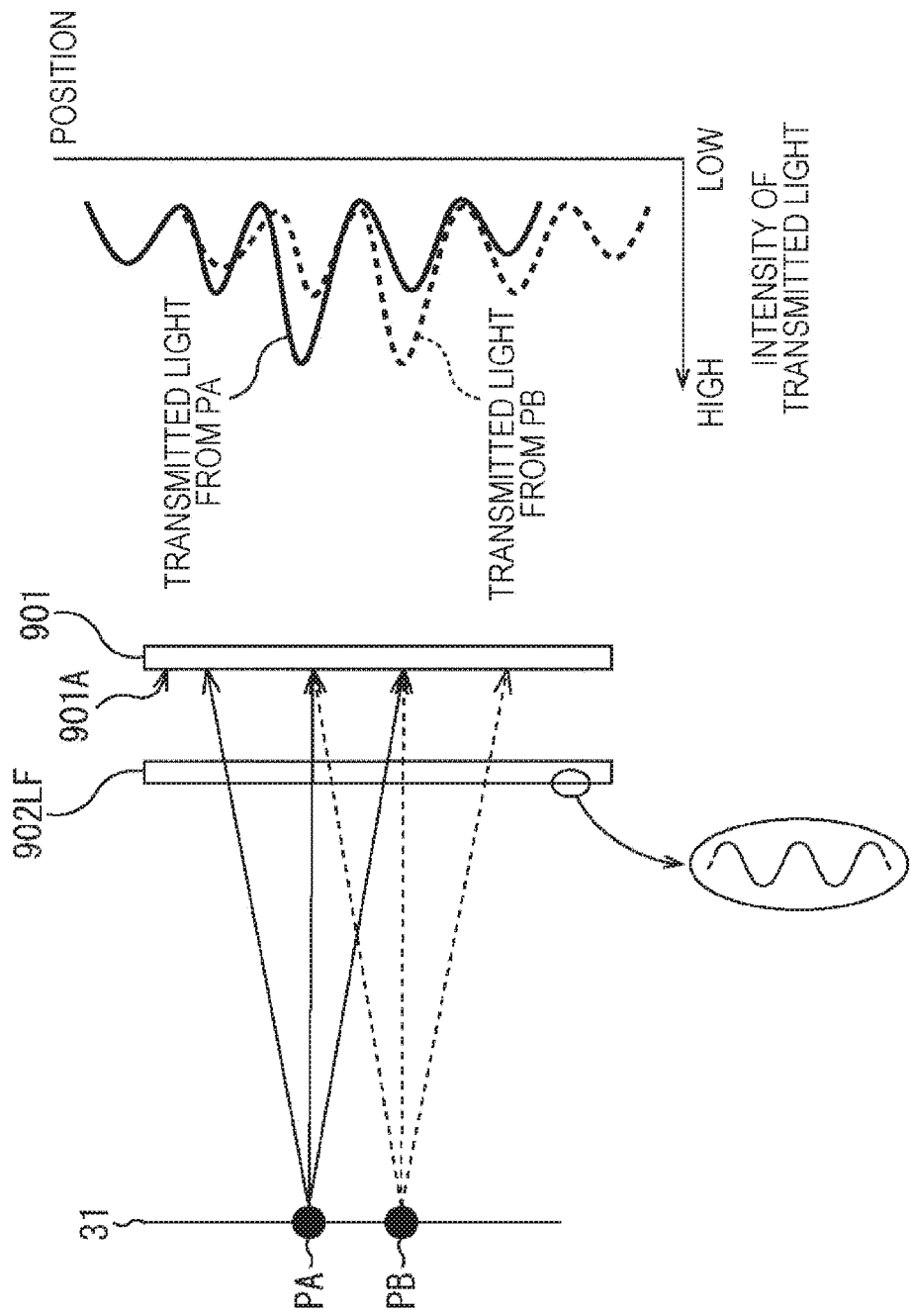
FIGS. 61A and 61B are views illustrating a variation of the imaging element.

Furthermore, as illustrated in FIG. 61A, an optical interference mask may be used as an optical filter 902LF. The light emitted from the point light source PA and the light emitted from the point light source PB of the subject surface 31 are emitted to the light-receiving surface 901A of the imaging element 901 via the optical filter 902LF. As illustrated in an enlarged view in a lower portion in A of FIG. 61A, for example, a light incident surface of the optical filter 902LF includes irregularities of about a wavelength. Furthermore, in the optical filter 902LF, transmission of light having a specific wavelength emitted in the vertical direction is the maximum. When a change in incident angle (inclination with respect to the vertical direction) of the light beams having the specific wavelength emitted from the point light sources PA and PB of the subject surface 31 on the optical filter 902LF increases, an optical path length changes. Here, when the optical path length is an odd multiple of the half wavelength, the light beams weaken each other, and when this is an even multiple of the half wavelength, the light beams strengthen each other. That is, intensities of the transmitted light beams having the specific wavelength emitted from the point light sources PA and PB and transmitted through the optical filter 902LF are modulated according to the incident angle with respect to the optical filter 902LF to be incident on the light-receiving surface 901A of the imaging element 901 as illustrated in FIG. 61B. Therefore, the detection signal output from each pixel output unit of the imaging element 901 is a signal obtained by combining the modulated light intensities of the point light sources for each pixel output unit.

This method is disclosed in detail, for example, in Patent Document 1 described above.

Note that, in the methods of Patent Document 1 and Non-Patent Document 1, it is not possible to independently set the incident angle directivity in a pixel 121a unit without affecting adjacent pixels as the imaging element 121 using the pixel 121a in FIG. 4 or the pixel 121a in FIG. 5 described above. Therefore, for example, when the pattern of the optical filter 902BW or the pattern of a diffraction grating of the optical filter 902LF is different, the incident angle directivities of at least a plurality of adjacent pixels of the imaging element 901 are different from each other. Furthermore, the pixels 121a located at close positions have incident angle directivities close to each other.

Furthermore, the present disclosure is also applicable to the imaging device and imaging element that image light of a wavelength other than visible light such as infrared light. In this case, the restored image is not the image in which the user may visually recognize the subject but the image in which the user cannot visually recognize the subject. Note that, since it is difficult for a normal imaging lens to transmit far-infrared light, the present technology is effective in a case of imaging the far-infrared light, for example. Therefore, the restored image may be a far-infrared light image, and may be a visible light image or a non-visible light image in addition to the far-infrared light image.

<Variation regarding Signal Processing Unit>

For example, an association unit 504 of the signal processing device 332 may associate a detection signal set obtained from each imaging device 321 with metadata corresponding to each detection signal set. In this case, for example, the association unit 412 in FIGS. 28, 37, 38, 41, 47, and 49 may be omitted.

Furthermore, the metadata may include a coefficient set group at the time of restoration or not, for example. In the latter case, for example, data indicating a subject distance and an angle of view at the time of restoration and a position and attitude at the time of imaging of each imaging device 321 (for example, latitude, longitude, inclination Xθ, inclination Yθ, orientation, altitude and the like) is included in the metadata.

Note that, a method of associating the detection signal set with the metadata is not especially limited as long as a correspondence relationship between the detection signal set and the metadata may be specified. For example, by assigning the metadata to data including the detection signal set, assigning the same ID to the detection signal set and the metadata, or recording the detection signal set and the metadata on the same recording medium 508, the detection signal set and the metadata are associated with each other. Furthermore, the metadata may be associated with each detection signal set individually, or the metadata may be associated with data in which the detection signal sets are combined into one.

Moreover, it is not always necessary to use the detection signal sets of all the imaging devices 321 for restoring the restored image; for example, a restoration unit 501 may restore the restored image using the detection signal sets of some imaging devices 321.

For example, the imaging element 121 suitable for imaging a subject surface with a different subject distance or angle of view may be provided for each imaging device 321. Then, for example, in a case where the subject distance and the angle of view may be specified, the restoration unit 501 may restore the restored image by using only the detection signal set of the imaging device 321 suitable for the imaging of the specified subject distance and angle of view without using the detection signal sets of all of the imaging devices 321. In this case, it is not always necessary to make the appropriate subject distance and angle of view different in all the imaging devices 321, and they may be the same in some imaging devices 321.

Furthermore, for example, the restoration unit 501 may select the detection signal set used for restoring the restored image on the basis of the restored image that is simply restored (hereinafter referred to as a simple restored image).

Specifically, first, the restoration unit 501 simply restores the restored image using the detection signal sets of all the imaging devices 321. For example, the restoration unit 501 thins out the detection signal of a predetermined pixel 121a among the detection signal of each pixel 121a included in each detection signal set, and simply performs the restoration processing with a small number of pixels. Alternatively, the restoration unit 501 performs the restoration processing simply, for example, by limiting an arithmetic amount (for example, the number of times of iterative operations and the like).

Next, the restoration unit 501 sets a main subject on the basis of, for example, the simply restored image. A method of setting the main subject is arbitrary. For example, the restoration unit 501 sets the largest subject in the simply restored image or a predetermined type of subject (for example, a person and the like) in the simply restored image as the main subject. Alternatively, for example, the user may visually recognize the simply restored image and set a desired subject in the simply restored image as the main subject.

Next, the restoration unit 501 selects a detection signal set used for restoration of the restored image.

Specifically, an imaging range in the real world of each pixel 121a of each imaging device 321 may be estimated on the basis of, for example, the position and attitude of each imaging device 321 and the light-shielding range of each pixel 121a. Furthermore, the position of the main subject in the real world may be estimated on the basis of the position and the like of the main subject in the simply restored image, for example. Therefore, the restoration unit 501 extracts the detection signal set including the main subject (the main subject is imaged) out of the detection signal sets of all the imaging devices 321 on the basis of the imaging range in the rear world of each pixel 121a and the position in the real world of the main subject and selects the same as the detection signal set to be used for restoring the restored image.

Alternatively, for example, the restoration unit 501 selects the imaging element 121 that serves as a master (hereinafter referred to as a master sensor). For example, the restoration unit 501 estimates the size and position of the main subject within the imaging range of the imaging element 121 of each imaging device 321 on the basis of the imaging range of each pixel 121a in the real world and the position of the main subject in the real world. Then, the restoration unit 501 selects the imaging element 121 with the most appropriate size and position of the main subject as the master sensor.

Note that, the appropriate size and position of the main subject vary depending on the type of the main subject, the scene to be captured and the like.

Next, the restoration unit 501 extracts, for example, the imaging element 121 in which a ratio of a region where the imaging range overlaps the imaging range of the master sensor is equal to or larger than a predetermined threshold from the imaging elements 121 except the master sensor. The restoration unit 501 selects the detection signal set of the master sensor and the detection signal set of the extracted imaging element 121 as the detection signal set used for restoration of the restored image.

Then, the restoration unit 501 performs the restoration processing of the restored image using the selected detection signal set. For example, the restoration unit 501 restores the restored image by creating and solving the simultaneous equations described above using the coefficient set corresponding to each pixel 121a of each imaging device 321 from which the selected detection signal set is obtained.

Therefore, it is possible to reduce the load of the restoration processing while maintaining an excellent image quality (for example, resolution and the like) of the main subject in the restored image.

Note that, the pixel 121a used for restoration of the restored image may be further selected from the pixels 121a of the selected imaging device 321. For example, the restoration unit 501 may select the detection signal of the pixel 121a whose imaging range overlaps the main subject from the selected detection signal set, and restore the restored image using the selected detection signal.

Furthermore, in the above description, the example in which a coordinate system (hereinafter referred to as a reference coordinate system) used for the calculation of equations (9) to (14) is set on the basis of a predetermined reference position (reference latitude, reference longitude) is described; however, the reference position may be variable.

For example, the reference position may be set on the basis of the position of the main subject. For example, the position in the real world of a predetermined position (for example, the center of gravity) of the main subject may be set as the reference position.

Alternatively, for example, the reference position may be set on the basis of the position of the master sensor. For example, the pixel at a predetermined position (for example, center, upper left corner and the like) of the master sensor may be set as the reference position.

In this case, for example, the reference coordinate system may be set on the basis of the master sensor. For example, on the basis of the coordinate system of a pixel region of the master sensor, X and Y-axes of the reference coordinate system may be set, and an axis perpendicular to a light-receiving surface of the master sensor may be set as a Z-axis of the reference coordinate system.

Moreover, for example, the subject distance and the angle of view of the restored image may be set on the basis of the main subject. For example, the subject distance of the restored image may be set so that the image quality of the main subject is the best. Furthermore, for example, the angle of view of the restored image may be set so that the main subject has an appropriate size in the restored image.

Note that, for example, in a case where the imaging system 301 is designed on the assumption of infinity, the subject distance is always set to infinity.

<Variation regarding System Configuration>

The configuration of the imaging system 301 in FIG. 26 may be changed.

For example, the reader/writer 331 and the signal processing device 332 may be integrated, or a part of the functions of the signal processing device 332 may be provided in the reader/writer 331.

Furthermore, the function of the reader/writer 331 and the function of the signal processing device 332 may be provided in some imaging devices.

Figure 62:
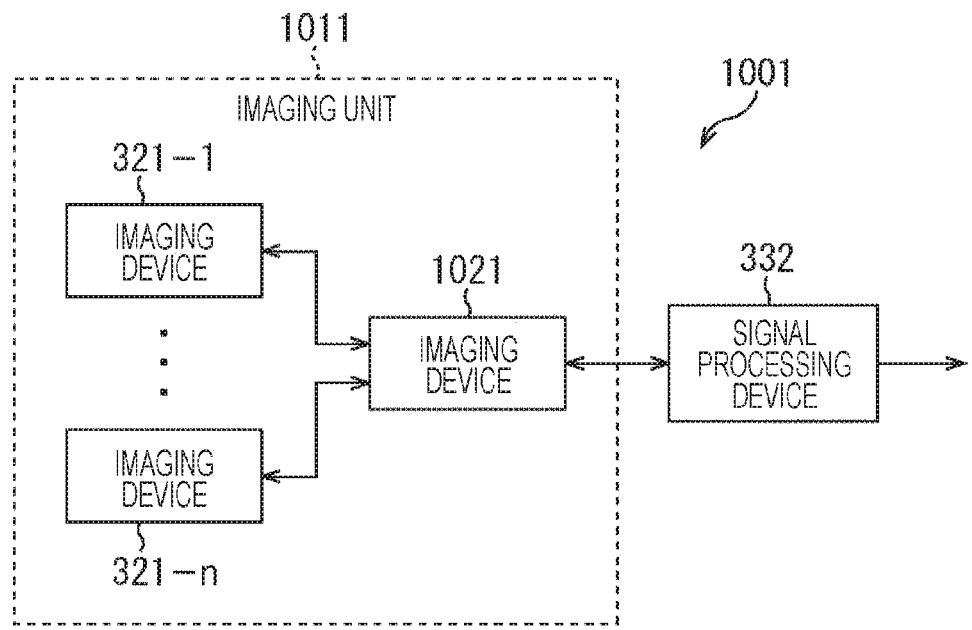
FIG. 62 is a block diagram illustrating a first variation of an imaging system to which the technology of the present disclosure is applied.

FIG. 62 illustrates a configuration example of an imaging system 1001 that is a first variation of the imaging system. Note that, in the drawing, a portion corresponding to that of the imaging system 301 in FIG. 26 is assigned with the same reference sign, and the description thereof is omitted as appropriate.

The imaging system 1001 is different from the imaging system 301 in that an imaging unit 1011 is provided in place of the imaging unit 311 and the reader/writer 331 is deleted. The imaging unit 1011 is different from the imaging unit 311 in that an imaging device 1021 is added.

The imaging device 1021 has the function of the reader/writer 331. That is, the imaging device 1021 performs short-range wireless communication with each imaging device 321 and supplies electric power to each imaging device 321. Then, the imaging device 1021 transmits an imaging command to each imaging device 321, controls imaging of a subject by each imaging device 321, and also images the subject by itself. Then, the imaging device 1021 receives imaging data from each imaging device 321, and transmits the imaging data received from each imaging device 321 and imaging data obtained by imaging by itself to the signal processing device 332. That is, the imaging device 1021 plays a role of relaying the imaging data from each imaging device 321 to the signal processing device 332.

Note that, the imaging device 1021 includes, for example, a power supply unit similar to the power supply unit 451 of the imaging device 321B in FIG. 37 or the power supply unit 461 of the imaging device 321C in FIG. 38, and may operate without electric power supplied from the reader/writer 331.

Furthermore, in the imaging system 1001, the number of imaging devices 321 may be one.

Figure 63:
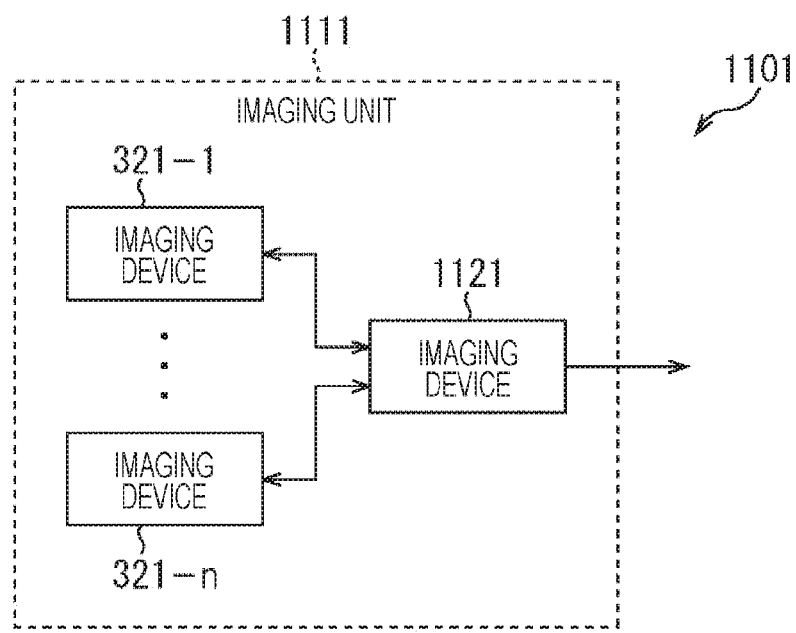
FIG. 63 is a block diagram illustrating a second variation of an imaging system to which the technology of the present disclosure is applied.

FIG. 63 illustrates a configuration example of an imaging system 1101 that is a second variation of the imaging system. Note that, in the drawing, a portion corresponding to that of the imaging system 301 in FIG. 26 is assigned with the same reference sign, and the description thereof is omitted as appropriate.

The imaging system 1101 is different from the imaging system 301 in that an imaging unit 1111 is provided in place of the imaging unit 311 and the reader/writer 331 and the signal processing device 332 are deleted. The imaging unit 1111 is different from the imaging unit 311 in that an imaging device 1121 is added.

The imaging device 1121 has a function similar to that of the imaging device 1021 in FIG. 62 and a function similar to that of the signal processing device 332 in FIG. 26. Then, the imaging device 1121 performs restoration processing and the like of a restored image on the basis of the imaging data received from each imaging device 321 and the imaging data obtained by imaging by itself.

Note that, in the imaging system 1101, the number of imaging devices 321 may be one.

<Other Variations>

Furthermore, in the above description, the example in which each imaging device 321 detects its own position and attitude and notifies the signal processing unit 312 of the detection result; however, for example, the position and attitude of each imaging device 321 may be externally detected. For example, a region where each imaging device 321 is installed may be externally imaged, and the position and attitude of each imaging device 321 may be detected on the basis of the captured image. Furthermore, for example, the reader/writer 331 or the signal processing device 332 may have such a detecting function.

Moreover, in the above-described example, the example of detecting the position (absolute position), inclination, orientation, and altitude as the position and attitude of the imaging device 321 is described, but the combination may be freely changed. Furthermore, another data indicating the position or attitude of the imaging device 321 may be detected. Moreover, for example, only one of the position or attitude of the imaging device 321 may be detected.

Furthermore, for example, by applying machine learning such as deep learning, it is also possible to perform image recognition and the like using the detection image before restoration and the detection signal set without using the restored image after the restoration. In this case also, accuracy of image recognition using the detection image before the restoration is improved by using the present technology. In other words, the image quality of the detection image before the restoration is improved.

11. Other

The above-described series of processes may be executed by hardware or may be executed by software. In a case where a series of processes is executed by the software, a program which forms the software is installed on a computer. Here, the computer includes a computer (for example, the control unit 123 and the like) incorporated in dedicated hardware, for example.

The program executed by the computer may be recorded in a recording medium (for example, the recording medium 130 and the like) as a package medium and the like to be provided, for example. Furthermore, the program may be provided by means of a wired or wireless transmission medium such as a local area network, the Internet, and digital broadcasting.

Note that, the program executed by the computer may be the program of which processes are performed in chronological order in the order described in this specification or may be the program of which processes are performed in parallel or at required timing such as when a call is issued.

Furthermore, in this specification, a system is intended to mean assembly of a plurality of components (devices, modules (parts) and the like) and it does not matter whether or not all the components are in the same casing. Therefore, a plurality of devices stored in different casings and connected through a network and one device obtained by storing a plurality of modules in one casing are the systems.

Moreover, the embodiments of the present technology are not limited to the above-described embodiments and various modifications may be made without departing from the gist of the present technology.

For example, the present technology may be configured as cloud computing in which a function is shared by a plurality of devices through the network to process together.

Furthermore, each step described in the above-described flowchart may be executed by one device or executed by a plurality of devices in a shared manner.

Moreover, in a case where a plurality of processes is included in one step, a plurality of processes included in one step may be executed by one device or by a plurality of devices in a shared manner.

Note that, the present disclosure may also have the following configuration.

(1)

An imaging device including:

an imaging element that includes one or more pixel output units that receive incident light from a subject incident without an intervention of an imaging lens or a pinhole and output one detection signal indicating an output pixel value modulated by an incident angle of the incident light, and outputs a detection signal set including one or more detection signals; and a communication unit that transmits imaging data including the detection signal set and position attitude data indicating at least one of a position or an attitude to a communication device by wireless communication.

(2)

The imaging device according to (1) described above, in which at least one of the pixel output units has a configuration capable of independently setting incident angle directivity indicating directivity to the incident angle of the incident light.

(3)

The imaging device according to (2) described above, in which the imaging element includes a plurality of the pixel output units having different detection wavelengths.

(4)

The imaging device according to (3) described above, in which incident angle directivities of the respective pixel output units are same.

(5)

The imaging device according to (2) described above, in which the imaging element includes a plurality of the pixel output units having a same detection wavelength, and incident angle directivities of the respective pixel output units are different from each other.

(6)

The imaging device according to any one of (1) to (5) described above, further including:

a detection unit that detects at least one of the position or the attitude of the imaging device.

(7)

The imaging device according to (6) described above, in which the position attitude data includes at least one of an absolute position, inclination, orientation, or altitude of the imaging device.

(8)

The imaging device according to (6) or (7) described above, further including:

a drive unit that changes at least one of the position or the attitude of the imaging device by an instruction transmitted from the communication device.

(9)

The imaging device according to any one of (1) to (8) described above, in which the imaging data includes identification information for identifying the imaging device.

(10)

The imaging device according to any one of (1) to (9) described above, further including:

a plurality of light-receiving surfaces with different directions.

(11)

The imaging device according to (10) described above, further including:

a plurality of imaging elements that includes the light-receiving surfaces, respectively.

(12)

The imaging device according to (11) described above, in which the communication unit transmits imaging data including the detection signal of an effective imaging element out of the plurality of imaging elements.

(13)

The imaging device according to any one of (10) to (12) described above, further including:

a first light-receiving surface provided on a first surface of the imaging device; and a second light-receiving surface provided on a second surface opposite to the first surface of the imaging device.

(14)

The imaging device according to any one of (1) to (13) described above, in which the communication unit receives electric power supplied by an electromagnetic wave from the communication device.

(15)

The imaging device according to (14) described above, in which the imaging element includes two or more of the pixel output units, and makes a part of the pixel output units ineffective according to the electric power supplied from the communication device.

(16)

The imaging device according to any one of (1) to (13) described above, further including:

a power supply unit that supplies electric power for driving the imaging element and the communication unit.

(17)

The imaging device according to (16) described above, in which the power supply unit has a power generating function.

(18)

The imaging device according to (17) described above, in which the power supply unit generates power by sunlight, and a photoelectric conversion unit of the power supply unit and a photoelectric conversion unit of the imaging element are formed on a same semiconductor substrate.

(19)

A signal processing device including:

a restoration unit that restores a restored image by using a plurality of detection signal sets included in a plurality of imaging data from a plurality of imaging devices each including: an imaging element that includes one or more pixel output units that receive incident light from a subject incident without an intervention of an imaging lens or a pinhole and output one detection signal indicating an output pixel value modulated by an incident angle of the incident light, and outputs a detection signal set including one or more of the detection signals.

(20)

The signal processing device according to (19) described above, in which each of the imaging data includes position attitude data indicating at least one of a position or an attitude of each of the imaging devices, and the restoration unit restores the restored image by further using the position attitude data of each of the imaging devices.

(21)

The signal processing device according to (19) or (20) described above, in which the restoration unit restores the restored image by using the detection signal of each of the pixel output units and a plurality of coefficients indicating directivity of each of the pixel output units to an incident angle of incident light from the subject.

(22)

The signal processing device according to any one of (19) to (21), further including:

a communication unit that receives the plurality of imaging data from the plurality of imaging devices by wireless communication and supplies electric power to one or more of the plurality of imaging devices by an electromagnetic wave.

Note that, the effects described in this specification are illustrative only and are not limitative; there may also be another effect.

REFERENCE SIGNS LIST

101 Imaging device
111 Signal processing control unit
121 Imaging element
121a, 121a' Pixel
121A Light-receiving surface
121b Light-shielding film
121c On-chip lens
121e, 121f Photodiode
122 Restoration unit
123 Control unit
125 Detection unit
126 Association unit
301 Imaging system
311 Imaging unit
312 Signal processing unit
321, 321A to 321G Imaging device
331 Reader/writer 332 Signal processing device
401A to 401F Signal processing control unit
411 Control unit
412 Association unit
414 Communication unit
421 Transmission/reception unit
422 Antenna
451, 461 Power supply unit
471 Photoelectric conversion unit
472 Power storage unit
501 Restoration unit
502 Control unit
504 Association unit
611A to 611C Detection unit
621 Position detection unit
622 Inclination detection unit
623 Geomagnetism detection unit
624 Altitude detection unit
651 Drive unit
701 Imaging element
701A Light-receiving surface
801b, 801s Pixel output unit
901 Imaging element
901A Light-receiving surface
902, 902BW, 902F Optical filter
1001 Imaging system
1011 Imaging unit
1021 Imaging device
1101 Imaging system
1111 Imaging unit
1121 Imaging device

The invention claimed is:

1. A signal processing device, comprising:
circuitry configured to restore a restored image, which is a visible image upon display, based on a detection signal set, which is not visible image that does not represent a captured scene, including a plurality of detection signals and an incident angle coefficient set determined based on an incident angle change amount and a reference coefficient set of a reference position,
wherein the detection signal set is output from an imaging element that includes a plurality of pixel output units, each of the plurality of pixel output units receiving incident light from a subject incident without an intervention of both of an imaging lens and a pinhole and outputting one detection signal indicating an output pixel value modulated based on an incident angle of the incident light and thereby the detection signal set including the plurality of detection signals is output from the imaging element.

2. The signal processing device according to claim 1, wherein
each imaging data includes position attitude data indicating at least one of a position or an attitude of each of imaging devices, and
the circuitry is further configured to restore the restored image by using the position attitude data of each of the imaging devices.

3. The signal processing device according to claim 1, wherein the circuitry is further configured to:
execute wireless communication with imaging devices, wherein each of the imaging devices includes the imaging element; and
supply electric power to each at least one of the plurality of imaging devices by an electromagnetic wave.

4. The signal processing device according to claim 1, wherein the circuitry is further configured to calculate the incident angle coefficient set according to the incident angle change amount and the reference coefficient set of the reference position.

5. The signal processing device according to claim 4, wherein the circuitry is further configured to set the reference position based on a position of a main subject.

6. The signal processing device according to claim 4, wherein the circuitry is further configured to set the reference position based on a position of a master sensor selected from a plurality of imaging elements.

7. The signal processing device according to claim 1, wherein the circuitry is further configured to restore the restored image based on the detection signal set output from the imaging element of each of imaging devices.

8. The signal processing device according to claim 1, wherein the circuitry is further configured to set a main subject based on a simply restored image.

9. The signal processing device according to claim 1, further comprising the imaging element.

10. A method executed by a signal processing device, comprising:
restoring a restored image, which is a visible image upon display, based on a detection signal set, which is not visible image that does not represent a captured scene, including a plurality of detection signals and an incident angle coefficient set determined based on an incident angle change amount and a reference coefficient set of a reference position,
wherein the detection signal set is output from an imaging element that includes a plurality of pixel output units, each of the plurality of pixel output units receiving incident light from a subject incident without an intervention of both of an imaging lens and a pinhole and outputting one detection signal indicating an output pixel value modulated based on an incident angle of the incident light and thereby the detection signal set including the plurality of detection signals is output from the imaging element.

11. A non-transitory computer-readable medium having stored thereon, computer-executable instructions which, when executed by a computer, cause the computer to execute operations, the operations comprising:
restoring a restored image, which is a visible image upon display, based on a detection signal set, which is not visible image that does not represent a captured scene, including a plurality of detection signals and an incident angle coefficient set determined based on an incident angle change amount and a reference coefficient set of a reference position,
wherein the detection signal set is output from an imaging element that includes a plurality of pixel output units, each of the plurality of pixel output units receiving incident light from a subject incident without an intervention of both of an imaging lens and a pinhole and outputting one detection signal indicating an output pixel value modulated based on an incident angle of the incident light and thereby the detection signal set including the plurality of detection signals is output from the imaging element.

* * * * *